US006958808B2

(12) United States Patent
Tanaka et al.

(10) Patent No.: US 6,958,808 B2
(45) Date of Patent: Oct. 25, 2005

(54) SYSTEM AND METHOD FOR RESETTING A REACTION MASS ASSEMBLY OF A STAGE ASSEMBLY

(75) Inventors: Keiichi Tanaka, Ageo (JP); Mike Binnard, Belmont, CA (US); Andrew J. Hazelton, San Carlos, CA (US)

(73) Assignee: Nikon Corporation, Tokyo (JP)

( * ) Notice: Subject to any disclaimer, the term of this patent is extended or adjusted under 35 U.S.C. 154(b) by 12 days.

(21) Appl. No.: 10/458,384

(22) Filed: Jun. 11, 2003

(65) Prior Publication Data

US 2004/0051854 A1 Mar. 18, 2004

Related U.S. Application Data

(63) Continuation-in-part of application No. 09/739,772, filed on Dec. 20, 2000, now abandoned, and a continuation-in-part of application No. 09/714,598, filed on Nov. 16, 2000, now abandoned.

(51) Int. Cl.[7] .......................... G03B 27/42; G03B 27/58
(52) U.S. Cl. .......................................... 355/72; 355/53
(58) Field of Search .............................. 355/53, 72, 76, 355/77

(56) References Cited

U.S. PATENT DOCUMENTS

| | | | |
|---|---|---|---|
| 4,780,617 A | 10/1988 | Umatate et al. | |
| 5,172,160 A | 12/1992 | Van Eijk et al. | |
| 5,208,497 A | 5/1993 | Ishii et al. | |
| 5,448,332 A | 9/1995 | Sakakibara et al. | |
| 5,467,720 A | * 11/1995 | Korenaga et al. | 108/20 |
| 5,473,410 A | 12/1995 | Nishi | |
| 5,528,118 A | 6/1996 | Lee | |
| 5,693,439 A | 12/1997 | Tanaka et al. | |
| 5,815,246 A | 9/1998 | Sperling et al. | |
| 5,864,389 A | 1/1999 | Osanai et al. | |

(Continued)

FOREIGN PATENT DOCUMENTS

| | | |
|---|---|---|
| JP | A-61-44429 | 3/1986 |
| JP | A-4-196513 | 7/1992 |

(Continued)

OTHER PUBLICATIONS

U.S. Appl. No. 09/713,910, filed Nov. 16, 2000
U.S. Appl. No. 09/713,911, filed Nov. 16, 2000.

(Continued)

Primary Examiner—Rodney Fuller
(74) Attorney, Agent, or Firm—Oliff & Berridge PLC

(57) ABSTRACT

A stage assembly for moving and positioning a device is provided herein. The stage assembly includes a stage base, a stage, a stage mover assembly, a reaction mass assembly, a reaction mover assembly, and a control system. The stage mover assembly moves the stage relative to the stage base. The reaction mass assembly reduces the reaction forces created by the stage mover assembly that are transferred to the stage base. The reaction mover assembly adjusts the position of the reaction mass assembly relative to the stage base. Uniquely, the control system controls and directs current to the reaction mover assembly in a way that minimizes the influence of disturbances created by the reaction mover assembly on the stage assembly. More specifically, the timing and/or the amount of current from the control system directed to the reaction mover assembly is varied to minimize the influence of the disturbances created by the reaction mover assembly on the stage assembly. With this design, the reaction mover assembly has less influence upon the position of the stage base. This allows for more accurate positioning of the device by the stage assembly and better performance of the stage assembly.

58 Claims, 34 Drawing Sheets

U.S. PATENT DOCUMENTS

| | | | |
|---|---|---|---|
| 5,874,820 | A | 2/1999 | Lee |
| 5,933,215 | A | 8/1999 | Inoue et al. |
| 5,939,852 | A * | 8/1999 | Akutsu et al. ............... 318/640 |
| 5,959,427 | A | 9/1999 | Watson |
| 5,969,441 | A | 10/1999 | Loopstra et al. |
| 6,028,376 | A | 2/2000 | Osanai et al. |
| 6,255,796 | B1 | 7/2001 | Ebihara et al. |
| 6,262,794 | B1 | 7/2001 | Miyajima |
| 6,291,654 | B1 | 9/2001 | Hostetter et al. |
| 6,322,060 | B1 | 11/2001 | Mayama et al. |
| 6,323,483 | B1 | 11/2001 | Cleveland et al. |
| 6,323,935 | B1 | 11/2001 | Ebihara et al. |
| 6,355,994 | B1 | 3/2002 | Andeen et al. |
| 6,359,679 | B1 | 3/2002 | Ito et al. |
| 6,391,503 | B2 | 5/2002 | Ebihara |
| 6,396,566 | B2 | 5/2002 | Ebinuma et al. |
| 6,449,030 | B1 | 9/2002 | Kwan |
| 6,493,062 | B2 * | 12/2002 | Tokuda et al. ................ 355/53 |
| 6,512,571 | B2 * | 1/2003 | Hara ........................... 355/53 |

FOREIGN PATENT DOCUMENTS

| | | |
|---|---|---|
| JP | A-6-283403 | 10/1994 |
| JP | A-9-320956 | 12/1997 |
| WO | WO 98/28665 | 7/1998 |
| WO | WO 98/40791 | 9/1998 |

OTHER PUBLICATIONS

U.S. Appl. No. 09/714,747, filed Nov. 16, 2000.

U.S. Appl. No. 09/759,524, filed Jan. 16, 2001.

* cited by examiner

SYSTEM AND METHOD FOR RESETTING A REACTION MASS ASSEMBLY OF A STAGE ASSEMBLY

This application is a continuation-in-part of U.S. patent application Ser. No. 09/714,598, now abandoned filed Nov. 16, 2000, and of U.S. patent application Ser. No. 09/739,772, filed Dec. 20, 2000, now abandoned, the entire disclosures of which are incorporated herein by reference.

CROSS REFERENCE TO RELATED APPLICATIONS

As far as permitted, the disclosures of (i) U.S. patent application Ser. No. 09/714,747, entitled, "STAGE ASSEMBLY INCLUDING A REACTION MASS ASSEMBLY," filed on the same day as the present Application, (ii) U.S. patent application Ser. No. 09/713,911, entitled "STAGE ASSEMBLY INCLUDING A REACTION ASSEMBLY," filed on the same day as the present Application, and (iii) U.S. patent application Ser. No. 09/713,910, entitled "STAGE ASSEMBLY INCLUDING A REACTION ASSEMBLY THAT IS CONNECTED BY ACTUATORS," filed on the same day as the present Application, are incorporated herein by reference.

BACKGROUND OF THE INVENTION

1. Field of Invention

The present invention is directed to a stage assembly for moving a device. More specifically, the present invention is directed to a stage assembly including a reaction mass assembly and a system and method for resetting the reaction mass assembly. The present invention also relates to an exposure apparatus and method, and more particularly to an exposure apparatus and method for transferring a pattern onto a substrate by irradiation of an exposure beam.

2. Description of Related Art

Various types of exposure apparatus are conventionally used in photolithographic processes for manufacturing semiconductor devices, liquid crystal display devices, and the like. In recent years, a step-and-repeat reduction projection exposure apparatus (a so-called "stepper"), a step-and-scan scan-exposure apparatus (a so-called "scanning stepper"), and the like have been widely used.

Exposure apparatuses are commonly used to transfer images from a reticle onto a semiconductor wafer during semiconductor processing. A typical exposure apparatus includes an illumination source, a reticle stage assembly that retains a reticle, a lens assembly and a wafer stage assembly that retains a semiconductor wafer. The reticle stage assembly and the wafer stage assembly are supported above a ground with an apparatus frame.

Typically, the wafer stage assembly includes a wafer stage base, a wafer stage that retains the wafer, and a wafer stage mover assembly that precisely positions the wafer stage and the wafer. Somewhat similarly, the reticle stage assembly includes a reticle stage base, a reticle stage that retains the reticle, and a reticle stage mover assembly that precisely positions the reticle stage and the reticle. The size of the images transferred onto the wafer from the reticle is extremely small. Accordingly, the precise relative positioning of the wafer and the reticle is critical to the manufacturing of high density, semiconductor wafers.

Unfortunately, the wafer stage mover assembly generates reaction forces that can vibrate the wafer stage base and the apparatus frame. The vibration influences the position of the wafer stage base, the wafer stage, and the wafer. As a result thereof, the vibration can cause an alignment error between the reticle and the wafer. This reduces the accuracy of positioning of the wafer relative to the reticle and degrades the accuracy of the exposure apparatus. Reaction forces produced due to driving of the wafer stage is mechanically caused to escape to the floor (the ground) by a frame member placed on a base (e.g., a floor surface or a base plate of the apparatus) which is vibration-isolated from the stage, as disclosed in, for example, U.S. Pat. No. 5,528,118.

In the case of the scanning stepper, a reticle stage as well as a wafer stage needs to be driven in a predetermined scanning direction by a linear motor or the like. In order to absorb reaction forces produced due to driving of the reticle stage, a countermass mechanism for one scanning direction, which functions based on the law of conservation of momentum, is typically adopted (see, for example, U.S. patent application Ser. No. 09/260,544). The reaction force produced due to driving of the reticle stage can also be mechanically transferred to the base, that is, the floor (the ground) by using a frame member (see, for example, U.S. Pat. No. 5,874,820).

In conventional projection exposure apparatus, the reaction force of the stage to be transferred to the base is damped by a vibration-isolating device, such as an anti-vibration table, so as to reduce vibration of a projection optical system (projection lens) and vibration of the stage transmitted via the base due to the reaction force. Although the reaction force is damped by being transferred to the base, a nontrivial amount of vibration, from the viewpoint of the level required under current micro-fabrication requirements, is given to the projection optical system and to the stage. Such vibration resulting from the reaction force deteriorates exposure accuracy of a scanning stepper that performs an exposure operation while scanning a stage (and a wafer or a reticle).

While transmission of reaction force can be substantially completely prevented by absorbing the reaction force by the countermass mechanism, the conventional countermass mechanism employs a countermass that moves in a direction opposite from the driving direction of a stage by a distance proportional to the driving distance of the stage. For this reason, the stroke of the countermass must be set in accordance with (in proportion to) the total stroke of the stage, which increases the size of the exposure apparatus.

In light of the above, one object of the present invention is to provide a stage assembly that precisely positions a device. Another object is to provide a stage assembly that minimizes the influence of the reaction forces of the stage mover assembly upon the position of the stage, the stage base, and the apparatus frame. Still another object is to provide a stage assembly having an improved reaction mass assembly. Another object is to provide an improved system and method for resetting the position of a reaction mass assembly. Yet another object is to provide an exposure apparatus capable of manufacturing precision devices such as high density, semiconductor wafers.

SUMMARY OF THE INVENTION

The invention has been made in view of the above circumstances, and it is one object of the invention to provide an exposure apparatus and method that allows precise exposure without increasing the size of the exposure apparatus.

The present invention is directed to a method and apparatus for resetting a reaction mass assembly of a stage assembly. The stage assembly is useful with an apparatus to sequentially position a device for one or more manufacturing operations performed by the apparatus. The stage assembly includes a stage, a stage mover assembly, a reaction mass assembly, a reaction mover assembly and a control system. The stage retains the device. The stage mover assembly moves the stage relative to a stage base. The reaction mass assembly reduces and minimizes the amount of reaction forces from the stage mover assembly that are transferred to the stage base.

The reaction mover assembly moves the reaction mass assembly relative to the stage base to reset the position of the reaction mass assembly. More specifically, the control system directs and controls current to the reaction mover assembly (i) to control the position of the reaction mass assembly, (ii) to prevent the reaction mass assembly from achieving a constant velocity, (iii) to correct external disturbances that can influence the position of the reaction mass assembly, and (iv) to prevent the center of gravity of the stage assembly from shifting.

Preferably, the control system controls current to the reaction mover assembly based upon the status of the one or more operations performed by the apparatus. This allows the control system to control and direct current to the reaction mover assembly in a way that minimizes the disturbances created by the reaction mover assembly on the stage assembly and the apparatus. More specifically, the timing and/or the amount of current from the control system directed to the reaction mover assembly is varied to minimize the influence of the disturbances created by the reaction mover assembly on the stage assembly. The timing and/or amount of current can also be varied according the type of operations performed by the apparatus.

In one embodiment of the present invention, the control system does not direct current to the reaction mover assembly during at least one of the operations performed by the apparatus and the control system directs current to the reaction mover assembly between the operations performed by the apparatus. In this embodiment, the control system controls and directs current to the reaction mover assembly so that the reaction mover assembly only moves and corrects the position of the reaction mass assembly at selected times or intervals.

For example, if the stage assembly is utilized for an exposure apparatus, the reaction mover assembly can be activated between exposures and deactivated during an exposure. Stated another way, for the exposure apparatus, the control system can be designed to direct current to the reaction mover assembly when an illumination system is in an off position and not direct current when the illumination system is in an on position. In the on position, the illumination source directs a beam of light energy towards the stage assembly. In contrast, in the off position, the illumination source does not direct a beam of light energy towards the stage assembly. Thus, the control system controls current to the reaction mover assembly based upon the position of the illumination source.

In this embodiment, the control system can direct current to the reaction mover assembly (i) between the forming of each image on the device, e.g. each chip on a semiconductor wafer, (ii) between the forming of each row of images on the device, e.g. each row of chips on the wafer, (iii) between every scan of the device, or (iv) between each device or wafer processed by the exposure apparatus. Because the reaction mover assembly is not activated during an exposure, the disturbances created by the reaction mover assembly do not significantly influence the position of the stage assembly.

In another embodiment of the present invention, the control system can direct current to the reaction mover assembly so that the rate of movement by the reaction mover assembly is greater between each operation performed by the apparatus than during each operation. In this embodiment, the control system controls and directs current to the reaction mover assembly so that the reaction mover assembly makes only relatively small corrections to the position of the reaction mass assembly at selected times or intervals and the reaction mover assembly makes relatively large corrections to the position of the reaction mass assembly between these selected times or intervals.

For an exposure apparatus, the control system can control and direct current to the reaction mover assembly at a different rate during an exposure than between exposures. For example, during an exposure, the control system directs current to the reaction mover assembly so that the forces generated by the reaction mover assembly are relatively small and the gain is low. Alternately, between exposures, the control system directs current to the reaction mover assembly so that the forces generated by the reaction mover assembly are relatively large and the gain is high.

As provided herein, the control system can direct a relatively large current to the reaction mover assembly (i) between the forming of each image on the device, e.g. each chip on a semiconductor wafer, (ii) between the forming of each row of images on the device, e.g. each row of chips on the wafer, (iii) between every scan of the device, or (iv) between each device or wafer processed by the exposure apparatus. With this design, the reaction mover assembly makes relatively large adjustments to the position of the reaction mass assembly when the illumination source is in the off position and makes relatively small adjustments to the position of the reaction mass assembly when the illumination source is in the on position. Thus, the control system directs more current to the reaction mover assembly when the illumination source is in the off position than when the illumination source is in the on position.

Because the reaction mover assembly makes only sight movements during an exposure, the disturbances created by the reaction mover assembly do not significantly influence the position of the stage assembly.

The present invention is also directed to a method for making a stage assembly, a method for making an exposure apparatus, a method for making a device and a method for manufacturing a wafer.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DETAILED DESCRIPTION OF PREFERRED EMBODIMENTS

Figure 1:
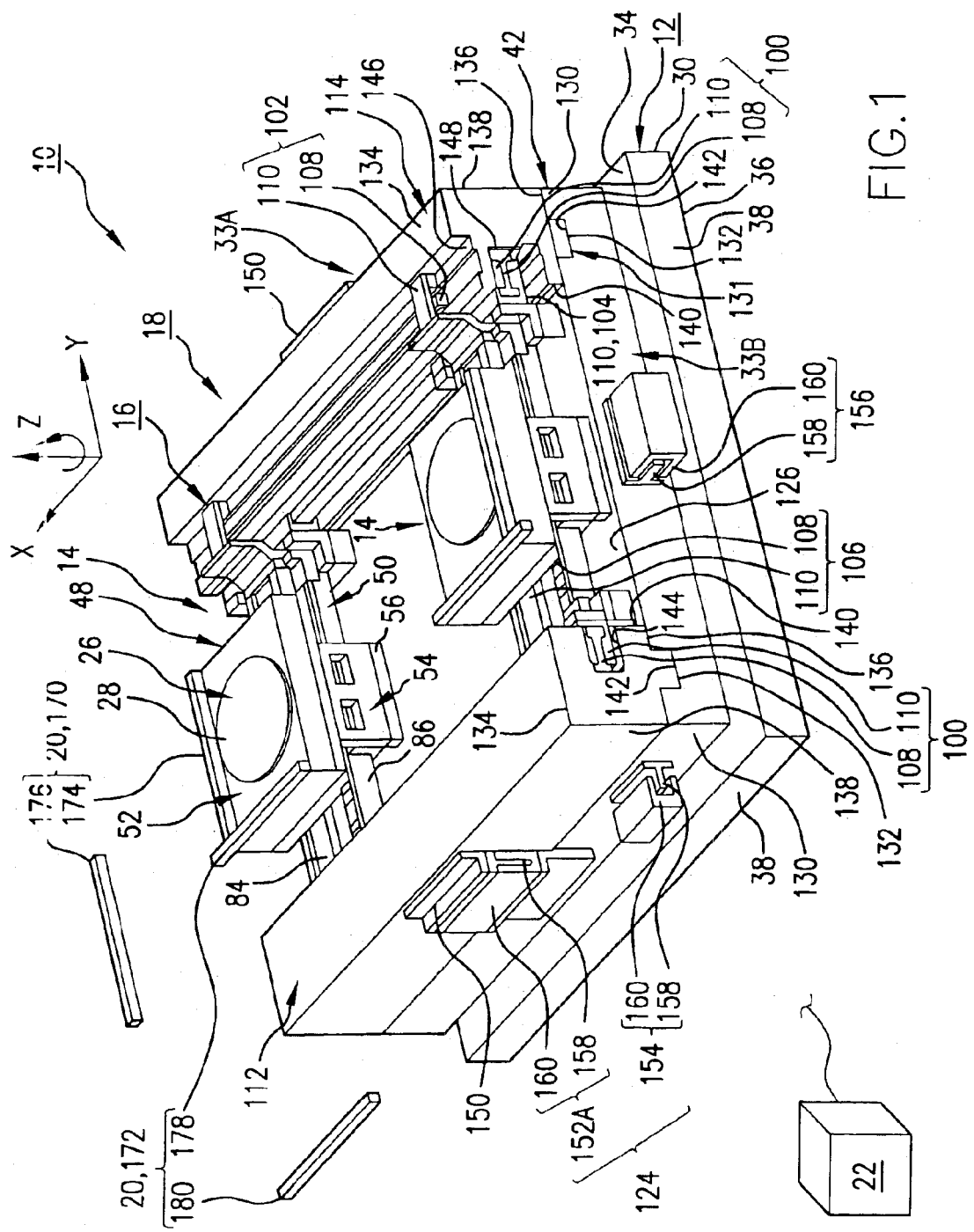
FIG. 1 is a perspective view of a first embodiment of a stage assembly having features of the present invention.

Referring initially to FIG. 1, a stage assembly 10, having features of the present invention, includes a stage base 12, at least one stage 14 (two are illustrated), a stage mover assembly 16, a reaction mass assembly 18, a measurement system 20 (only a portion is illustrated in FIG. 1), and a control system 22. The stage assembly 10 is positioned above a mounting base 24 (illustrated in FIG. 18). As an overview, the stage mover assembly 16 precisely moves each stage 14 relative to the stage base 12. Further, the reaction mass assembly 18 reduces and minimizes the amount of reaction forces from the stage mover assembly 16 that are transferred to the stage base 12 and the mounting base 24.

The stage assembly 10 is particularly useful for precisely positioning a device 26 during a manufacturing and/or an inspection process. The type of device 26 positioned and moved by the stage assembly 10 can be varied. For example, the device 26 can be a semiconductor wafer 28, and the stage assembly 10 can be used as part of an exposure apparatus 30 (illustrated in FIG. 18) for precisely positioning the semiconductor wafer 28 during manufacturing of the semiconductor wafer 28. Alternately, for example, the stage assembly 10 can be used to move other types of devices during manufacturing and/or inspection, to move a device under an electron microscope (not shown), or to move a device during a precision measurement operation (not shown).

Some of the Figures provided herein include a coordinate system that designates an X axis, a Y axis, and a Z axis. It should be understood that the coordinate system is merely for reference and can be varied. For example, the X axis can be switched with the Y axis and/or the stage assembly 10 can be rotated.

Figure 8:
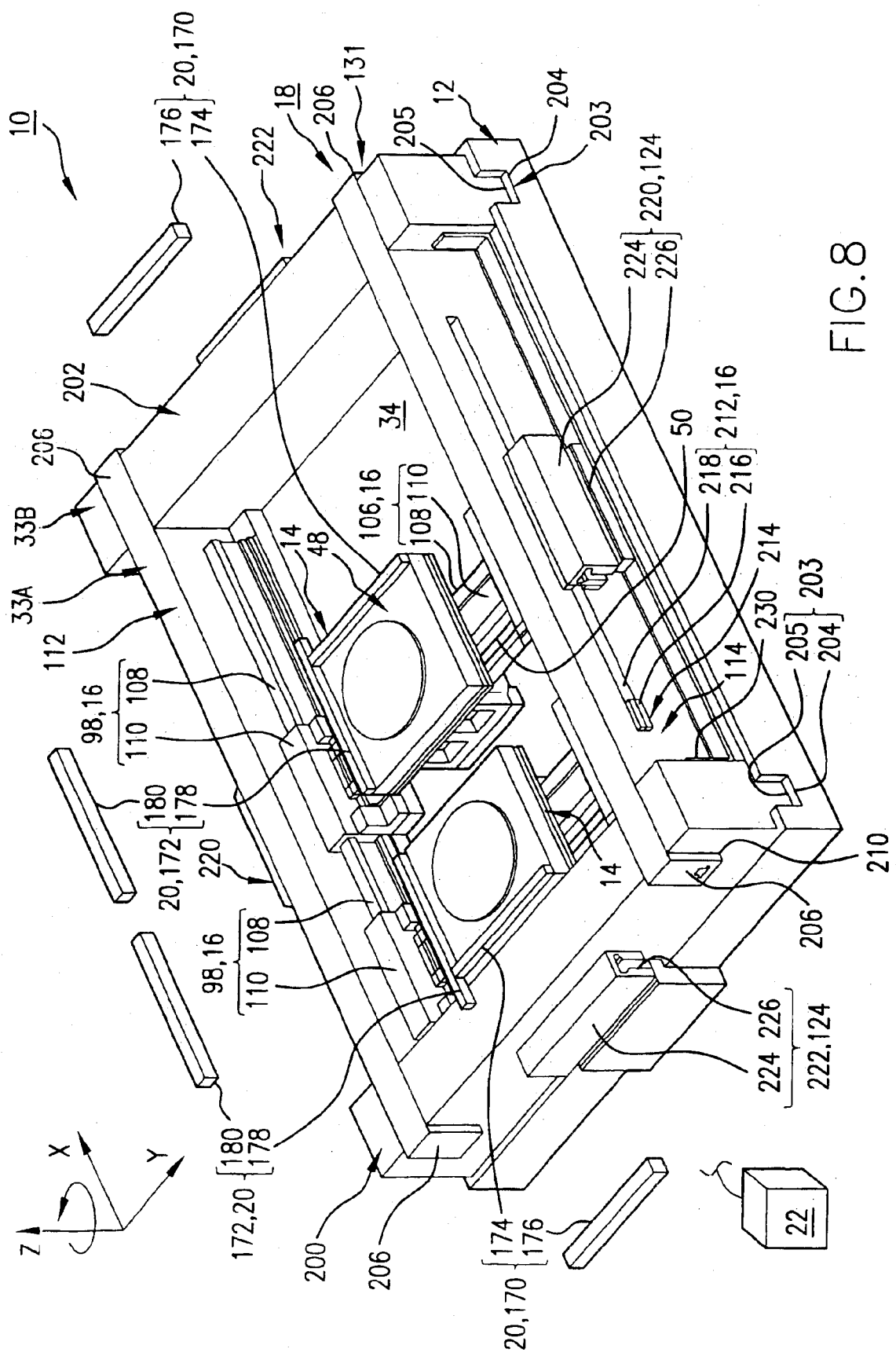
FIG. 8 is a perspective view of a second embodiment of a stage assembly having features of the present invention.
Figure 11:
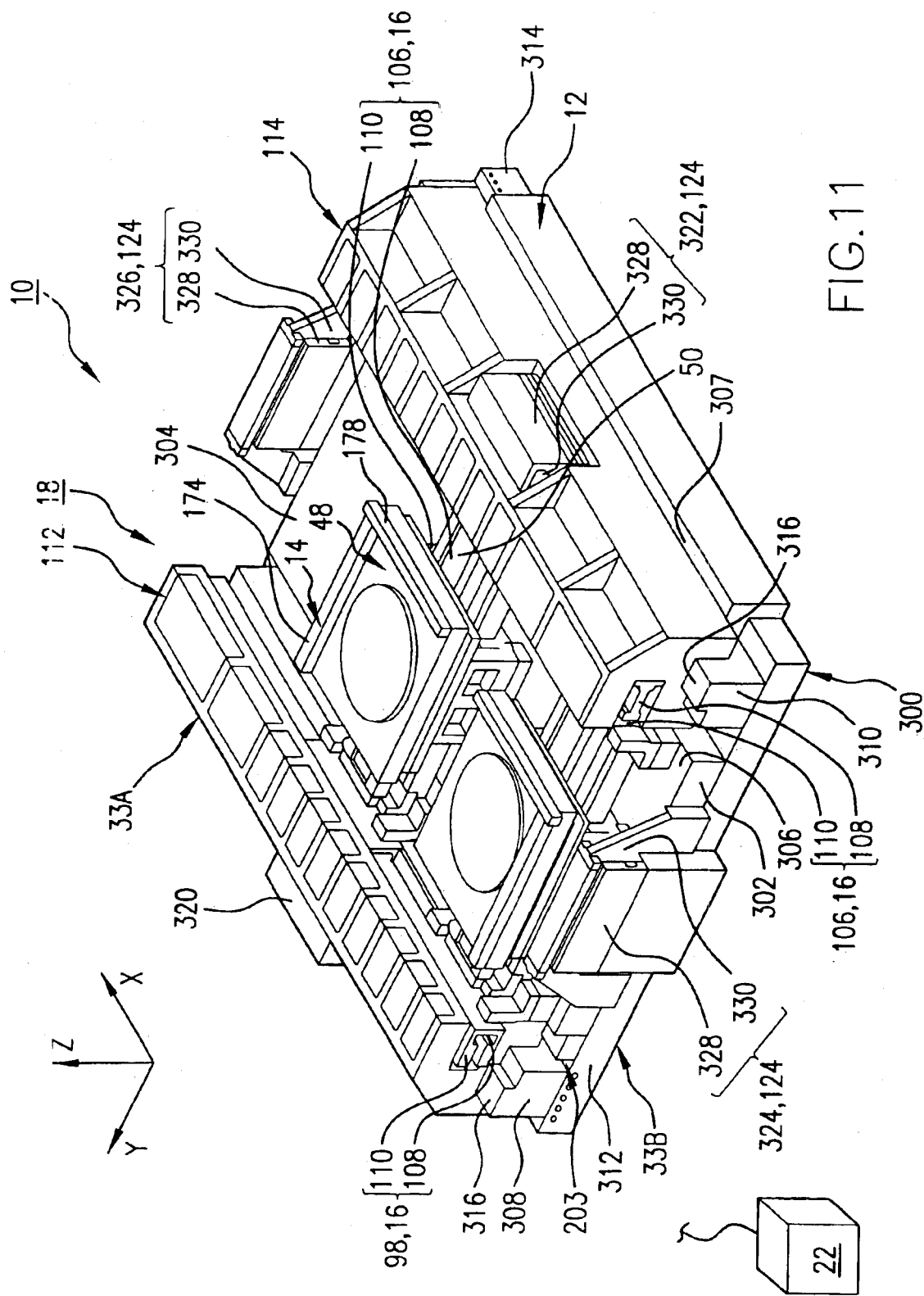
FIG. 11 is a perspective view of a third embodiment of a stage assembly having features of the present invention.
Figure 14:
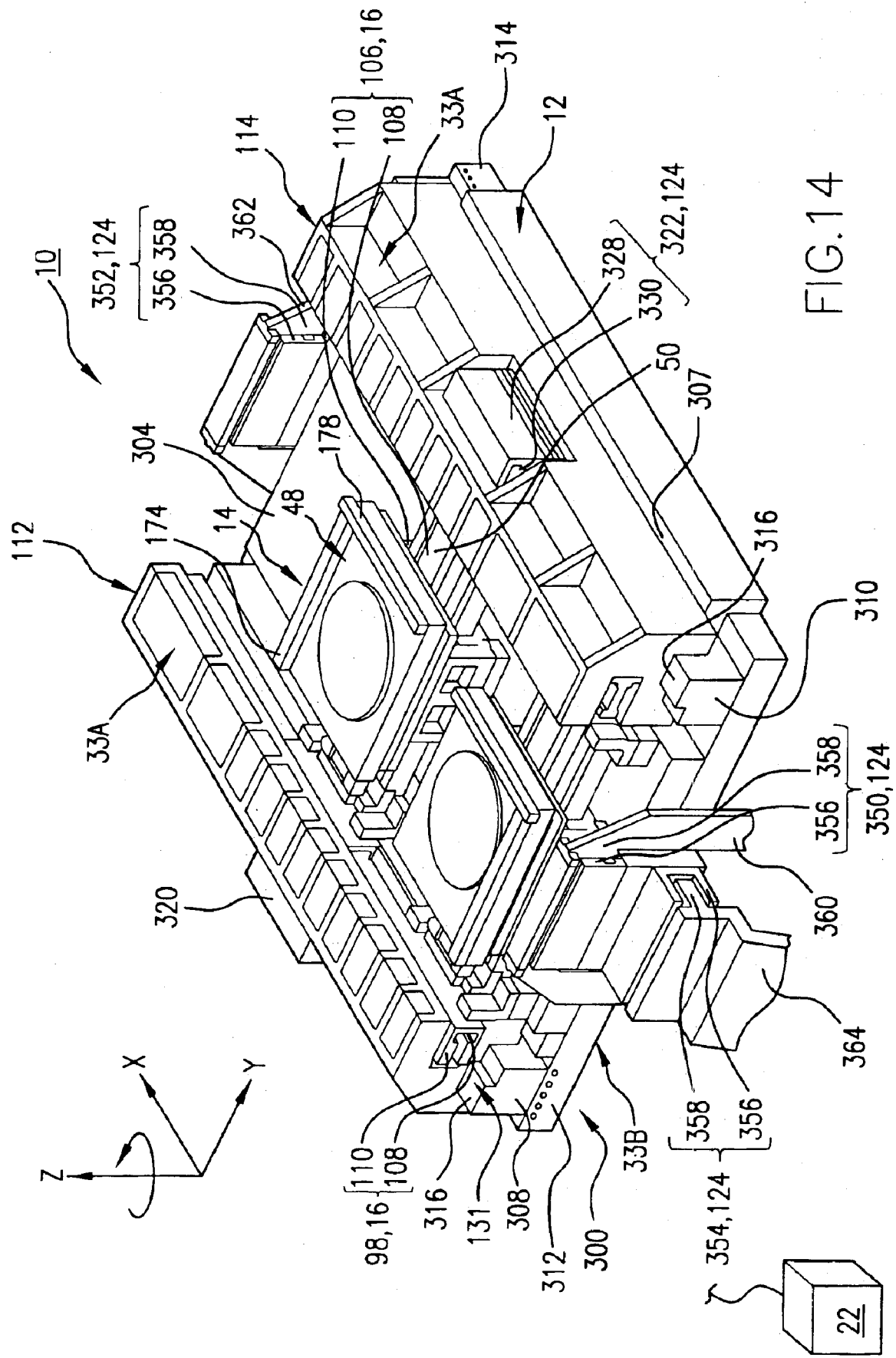
FIG. 14 is a perspective view of a fourth embodiment of a stage assembly having features of the present invention.

A number of alternate embodiments of the stage assembly 10 are illustrated in the Figures. In particular, FIG. 1 illustrates a perspective view of a first embodiment of the stage assembly 10, FIG. 8 illustrates a perspective view of a second embodiment of the stage assembly 10, FIG. 11 illustrates a perspective view of a third embodiment of the stage assembly 10, and FIG. 14 illustrates a perspective view of a fourth embodiment of the stage assembly 10.

In each embodiment illustrated herein, each stage 14 is moved relative to the stage base 12 along the X axis, along the Y axis, and about the Z axis (collectively "the planar degrees of freedom"). More specifically, the stage mover assembly 16 moves and positions each stage 14 along the X axis, along the Y axis, and about the Z axis under the control of the control system 22. Additionally, in each embodiment illustrated, the stage assembly 10 includes two stages 14 that independently move relative to the stage base 12. Alternately, however, each stage assembly 10 could include only one stage 14 or more than two stages 14.

Importantly, the reaction mass assembly 18 reduces and minimizes the amount of reaction force from the stage mover assembly 16 that are transferred to the stage base 12 and the mounting base 24. As an overview, in the embodiments provided herein, the reaction mass assembly 18 includes an X reaction component 33A and a Y reaction component 33B. The X reaction component 33A moves relative to the stage base 12 with at least two degrees of freedom and more preferably, three degrees of freedom. The Y reaction component 33B moves relative to the stage base 12 with at least one degree of freedom and more preferably three degrees of freedom.

Further, in the embodiments provided herein, the X reaction component 33A is coupled to the Y reaction component 33B and moves relative to the Y reaction component 33B along the X axis. Additionally, the X reaction component 33A and the Y reaction component 33B move concurrently along the Y axis relative to the stage base 12. In some of the embodiments, the X reaction component 33A and the Y reaction component 33B also move concurrently along the X axis and about the Z axis relative to the stage base 12.

In a preferred embodiment of the present invention, the reaction mass assembly 18 is free to move along the X axis, along the Y axis, and about the Z axis relative to the stage base 12. In this embodiment, when the stage mover assembly 16 applies a force to the stage 14 along the X axis, the Y axis, and/or about the Z axis, an equal and opposite force is applied to the reaction mass assembly 18. Further, the control system 22 corrects the position of the reaction mass assembly 18 along the X axis, along the Y axis, and about the Z axis.

The reaction mass assembly 18 provided herein, minimizes the disturbance that is transferred to the stage base 12. This improves the positioning performance of the stage assembly 10. Further, for an exposure apparatus 30, this allows for more accurate positioning of the semiconductor wafer 28 relative to a reticle 32 (illustrated in FIG. 18).

The stage base 12 supports a portion of the stage assembly 10 above the mounting base 24. The design of the stage base 12 can be varied to suit the design requirements of the stage assembly 10. In the embodiment illustrated in FIGS. 1–3, the stage base 12 is generally rectangular shaped and includes a planar base top 34 (sometimes referred to as a guide face), an opposed planar base bottom 36, four base sides 38, and a plurality of spaced apart base fluid pads 40 (illustrated in FIG. 3). The base fluid pads 40 are secured to base top 34.

In this embodiment, the reaction mass assembly 18 is maintained above the stage base 12 with a vacuum type fluid bearing. More specifically, in this embodiment, each of the base fluid pads 40 includes a plurality of spaced apart fluid outlets (not shown), and a plurality of spaced apart fluid inlets (not shown). Pressurized fluid (not shown) is released from the fluid outlets towards a reaction base 42 of the Y reaction component 33B of the reaction mass assembly 18. A vacuum is pulled in the fluid inlets to create a vacuum preload type, fluid bearing between the base top 34 and the reaction base 42. The vacuum preload type fluid bearing maintains the reaction mass assembly 18, spaced apart along the Z axis, relative to the stage base 12. Further, the vacuum preload type fluid bearing allows for motion of the X reaction component 33A, and the Y reaction component 33B along the X axis, along the Y axis, and about the Z axis relative to the stage base 12.

Alternately, the reaction mass assembly 18 can be supported spaced apart from the stage base 12 in other ways. For example, a magnetic type bearing or a ball bearing type of assembly could be utilized that allows for motion of the reaction mass assembly 18 relative to the stage base 12.

Figure 18:
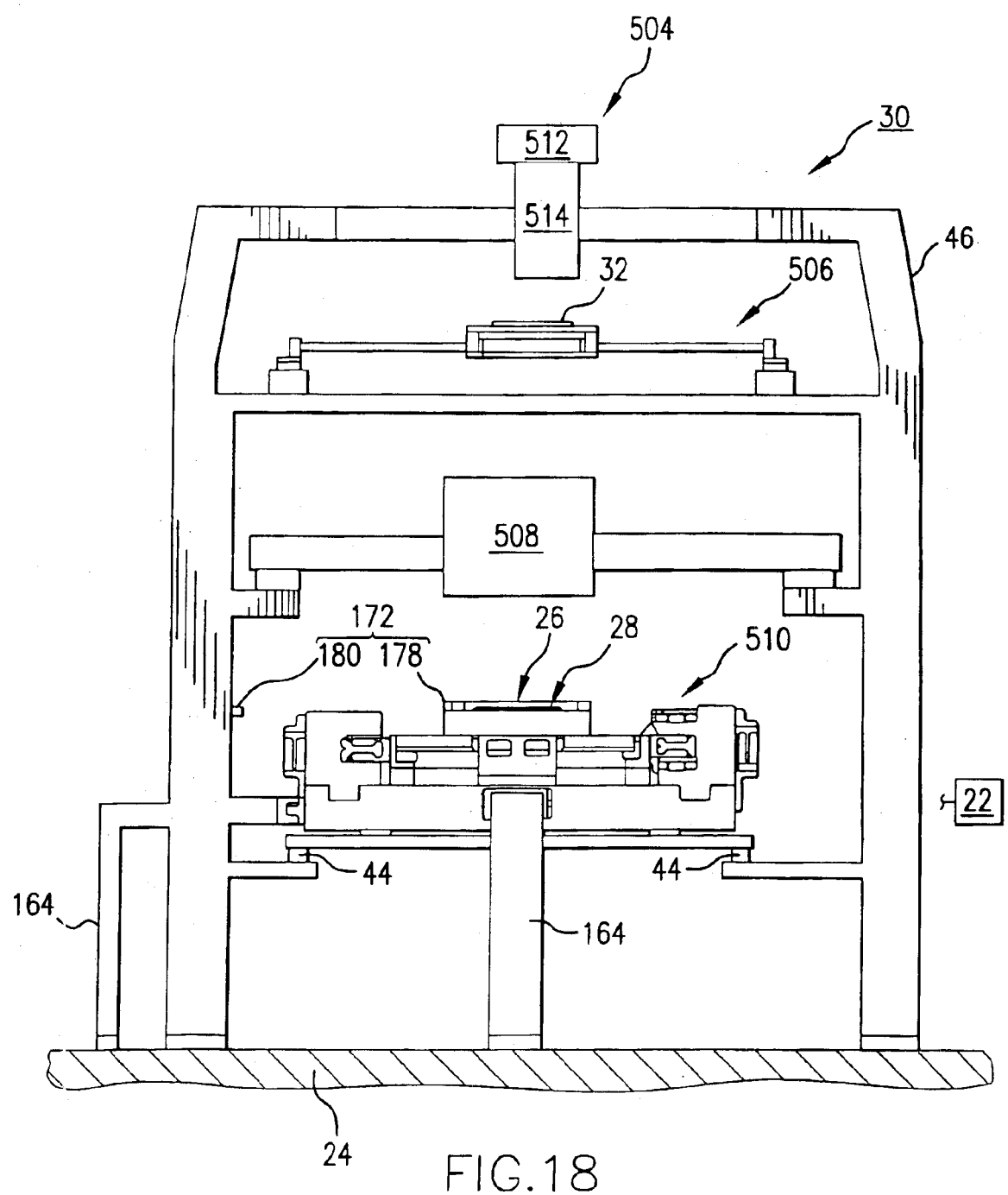
FIG. 18 is a schematic illustration of an exposure apparatus having features of the present invention.

Preferably, referring to FIG. 18, the stage base 12 is secured with resilient base isolators 44 and an apparatus frame 46 to the mounting base 24. The base isolators 44 reduce the effect of vibration of the apparatus frame 46 causing vibration on the stage base 12. Typically, three or four spaced apart base isolators 44 are utilized. Each base isolator 44 can include a pneumatic cylinder (not shown) and an actuator (not shown). Suitable base isolators 44 are sold by Technical Manufacturing Corporation, located in Peabody, Mass., or Newport Corporation located in Irvine, Calif.

Figure 2:
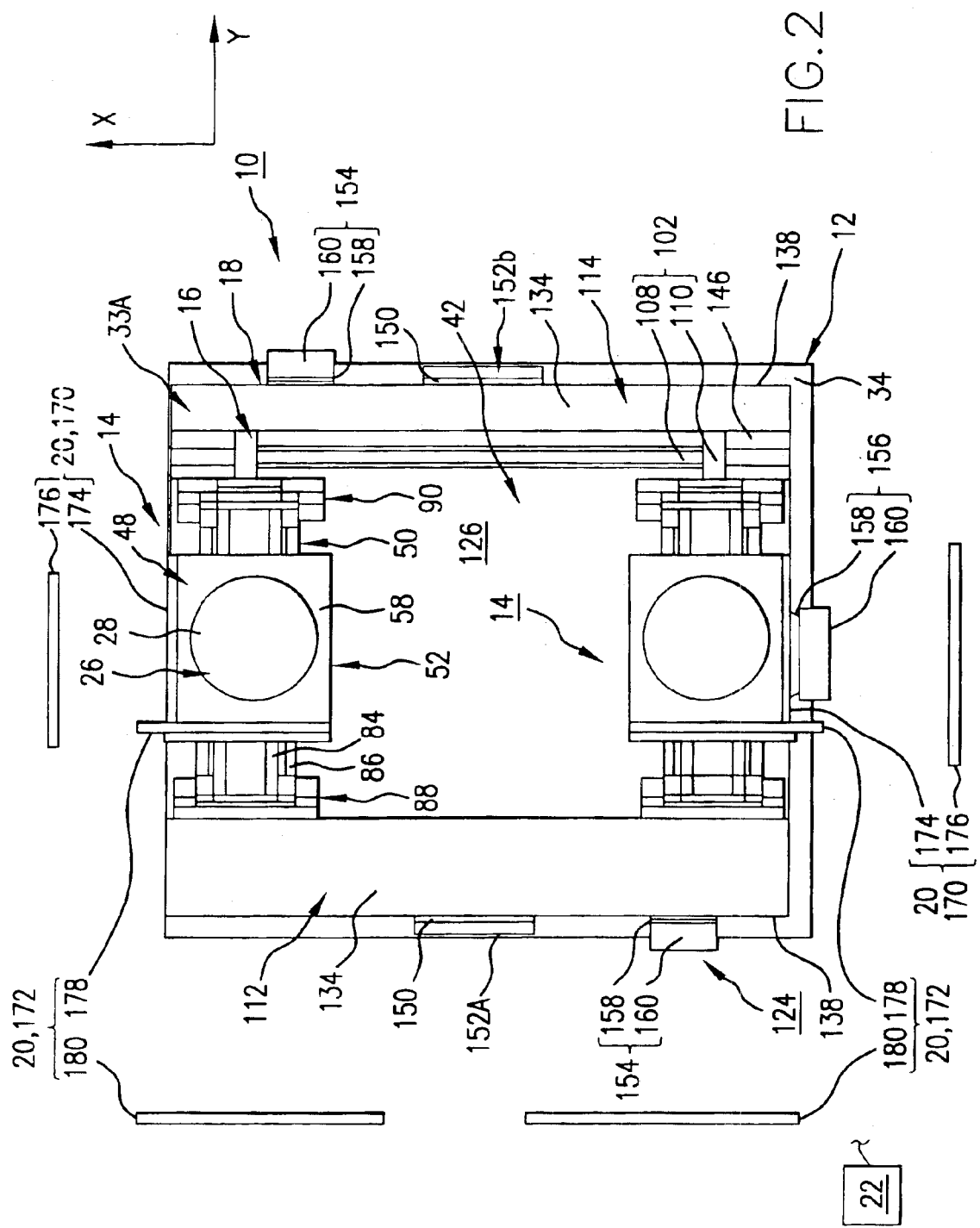
FIG. 2 is a top plan view of the stage assembly of FIG. 1.
Figure 3:
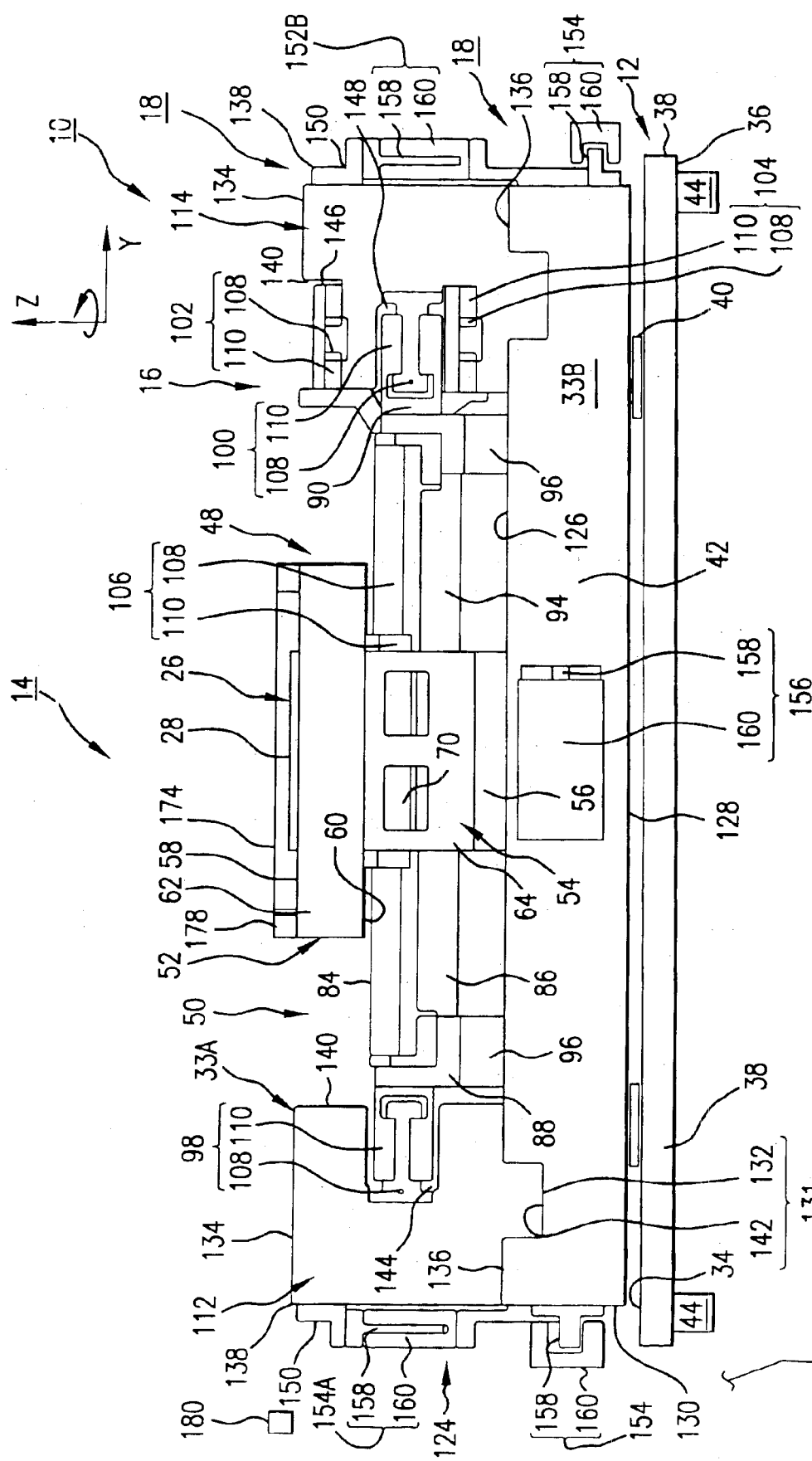
FIG. 3 is a front plan view of the stage assembly of FIG. 1.

The stage 14 retains the device 26. The stage 14 is precisely moved by the stage mover assembly 16 to precisely position the device 26. The design of each stage 14 can be varied to suit the design requirements of the stage assembly 10. A perspective view of one of the stages 14 is provided in FIG. 4. In this embodiment, the stage 14 includes a device table 48, a guide assembly 50, a portion of the stage mover assembly 16, and a portion of the measurement system 20. The design of each stage 14 illustrated in FIGS. 1–3 is substantially the same as the stage 14 illustrated in FIG. 4. Accordingly, the present discussion describes only one of the stages 14.

Figure 4:
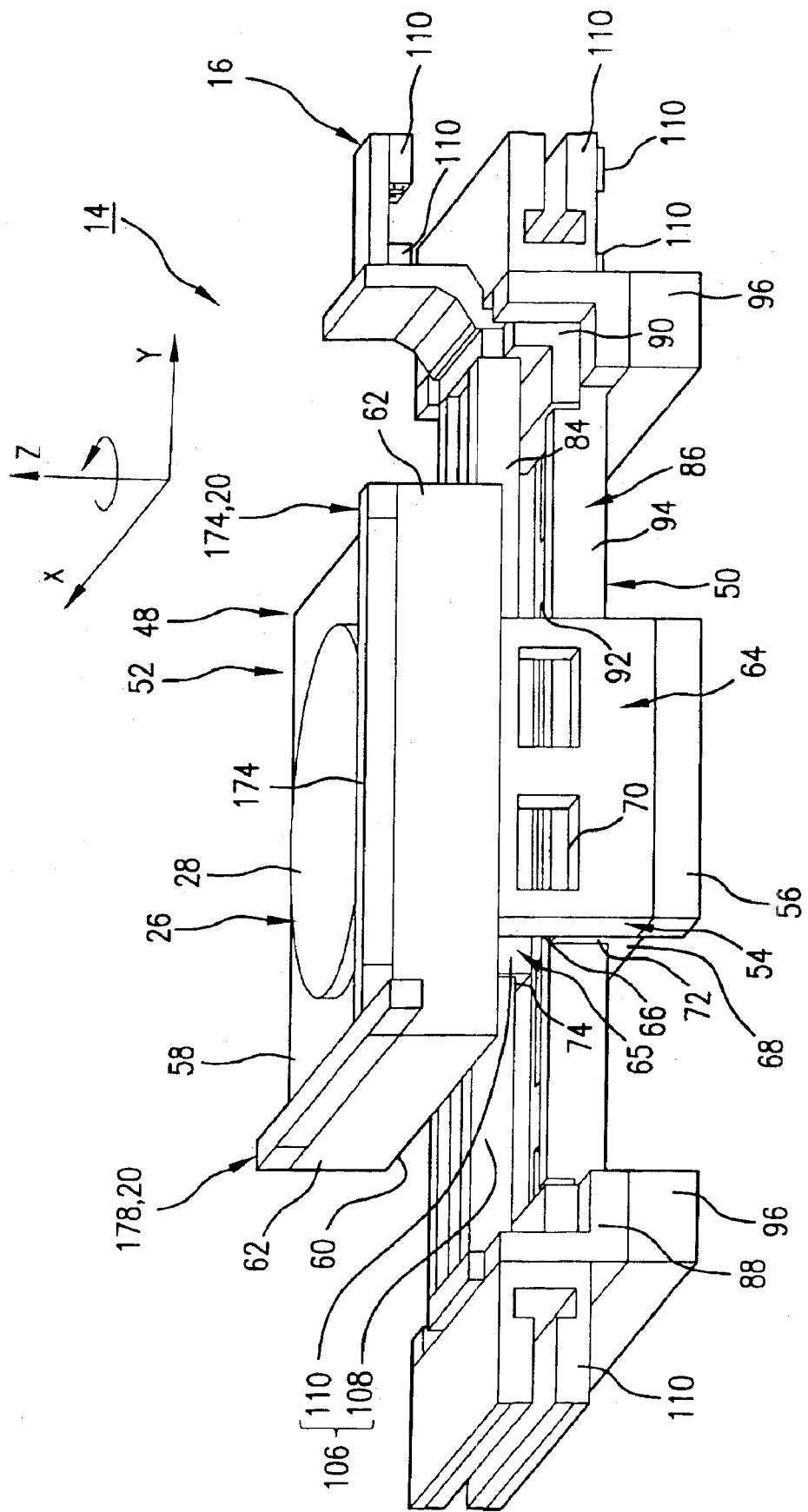
FIG. 4 is a perspective view of a stage having features of the present invention.

The design and movement of the device table 48 for each stage 14 can be varied to suit the design requirements of the stage assembly 10. In the embodiment illustrated in FIGS. 1–4, the device table 48 moves relative to the guide assembly 50 along the Y axis. Further, the device table 48 includes: (i) an upper table component 52, (ii) a lower table component 54 positioned below the upper table component 52, (iii) a pair of spaced apart table fluid pads 56 (only one is illustrated in FIG. 4) positioned below the lower table component 54.

Figure 5A:
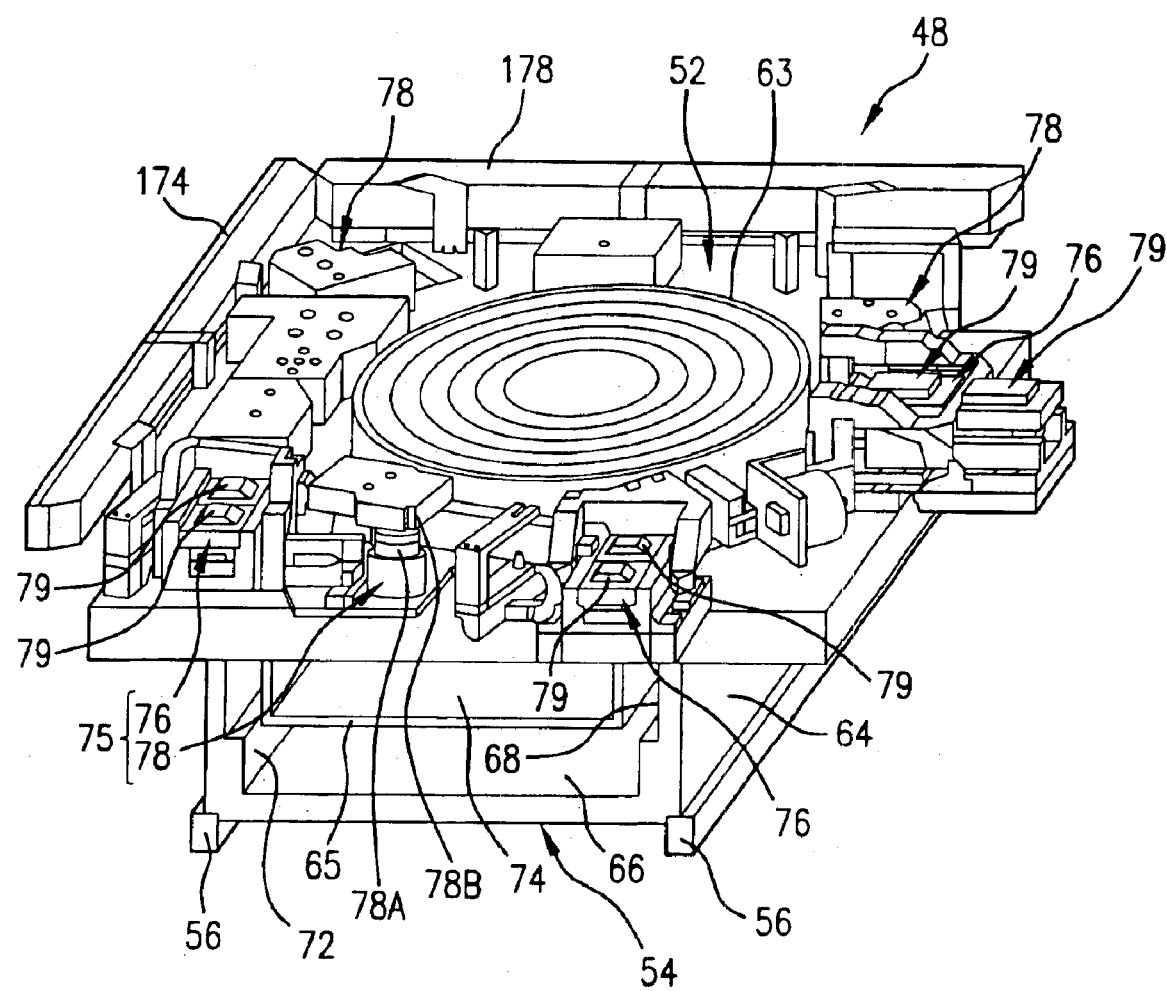
FIG. 5A is a perspective view of a device table having features of the present invention.
Figure 5B:
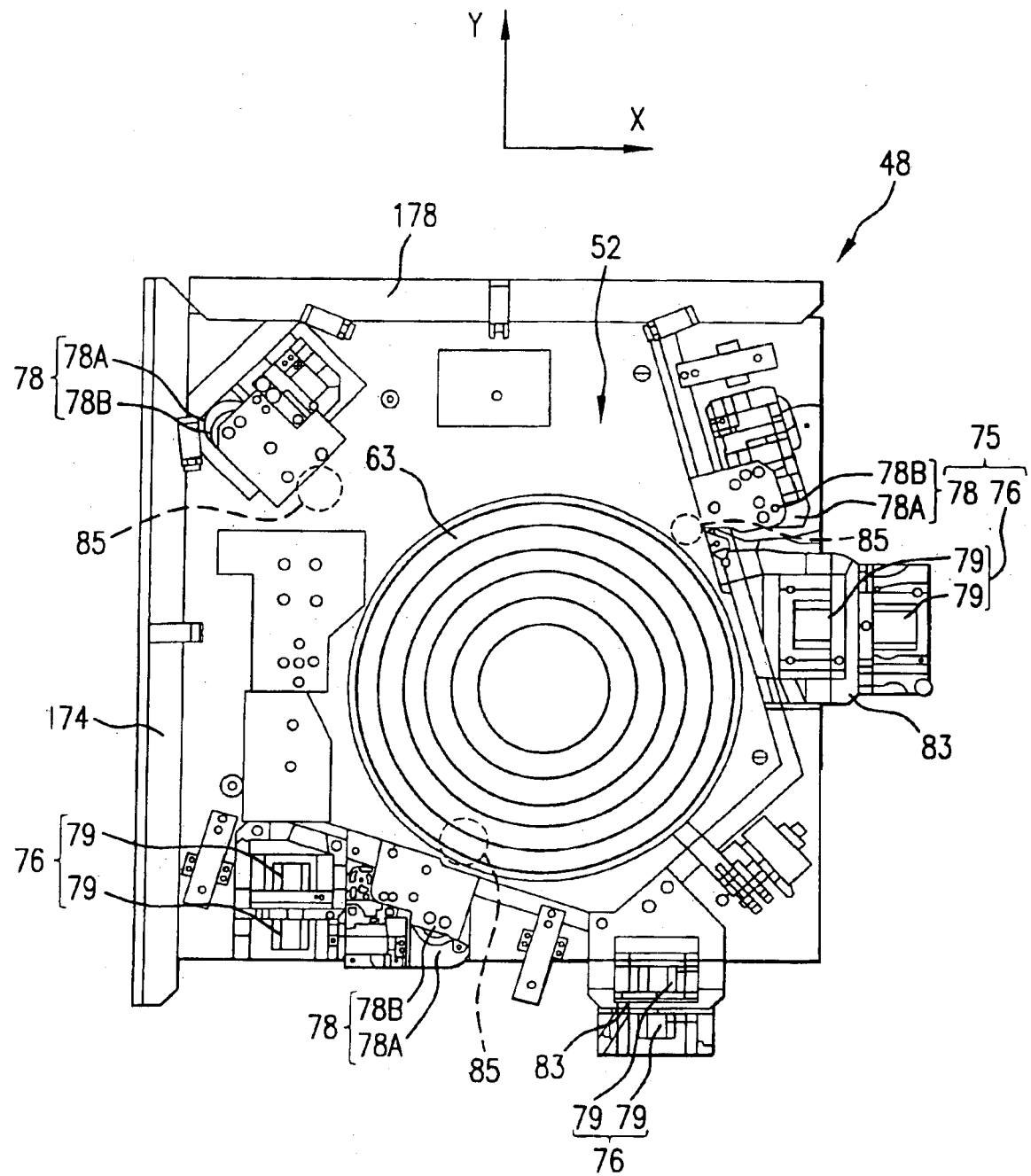
FIG. 5B is a top plan view of the device table of FIG. 5A.

The upper table component 52 is generally rectangular shaped and includes a table top 58, a table bottom 60, four table sides 62 (only two sides are illustrated in the Figures), and a device holder 63 (illustrated in FIGS. 5A and 5B). The device holder 63 is positioned near the table top 58 and retains the device 26 during movement of the stage 14. The device holder 63 can be a vacuum chuck, an electrostatic chuck, or some other type of clamp.

The lower table component 54 includes a generally rectangular tube shaped outer guide section 64, and generally rectangular tube shaped inner guide section 65. The outer guide section 64 is positioned below the upper table component 52. The outer guide section 64 defines a generally rectangular shaped guide channel 66 that is sized and shaped to receive a portion of the guide assembly 50. The guide channel 66 defines a pair of spaced apart side guide surfaces 68. The outer guide section 64 also includes a plurality of section apertures 70 that extend transversely through the outer guide section 64 to reduce the weight of the outer guide section 64.

Additionally, the outer guide section 64 includes a pair of spaced apart, section fluid pads 72 (only one is illustrated in the Figures) that are positioned along the side guide surfaces 68 in the guide channel 66. In this embodiment, each section fluid pad 72 includes a plurality of spaced apart fluid outlets (not shown). Pressurized fluid (not shown) is released from the fluid outlets towards the guide assembly 50 to create a fluid bearing between the device table 48 and the guide assembly 50. The fluid bearing maintains the device table 48 spaced apart from the guide assembly 50 along the X axis and allows for motion of the device table 48 along the Y axis relative to the guide assembly 50.

The inner guide section 65 is positioned within the guide channel 66, below the upper table component 52. The inner guide section 65 defines a generally rectangular shaped opening 74 that is sized and shaped to receive a portion of the guide assembly 50. Stated another way, the inner guide section 65 encircles a portion of the guide assembly 50. In the embodiments provided herein, the inner guide section 65 supports a portion of the stage mover assembly 16 as provided below.

The table fluid pads 56 extend downwardly from the lower table component 54. Each table fluid pad 56 includes a plurality of spaced apart fluid outlets (not shown), and a plurality of spaced apart fluid inlets (not shown). Pressurized fluid (not shown) is released from the fluid outlets towards the reaction base 42 of the reaction mass assembly 18. A vacuum is pulled in the fluid inlets to create a vacuum preload type fluid bearing between the table fluid pads 56 and the reaction base 42. The vacuum preload type fluid bearing maintains the device table 48 spaced apart along the Z axis relative to the reaction base 42. Further, the vacuum preload type fluid bearing allows for motion of the device table 48 along the X axis, along the Y axis, and about the Z axis relative to the reaction base 42.

Alternately, the device table 48 can be supported above the reaction base 42 in other ways. For example, a magnetic type bearing or a ball bearing type of assembly could be utilized that allows for movement of the device table 48 relative to the reaction base 42.

FIGS. 5A and 5B illustrate an alternate embodiment of a device table 48 having features of the present invention. In this design, the device table 48 includes a table mover assembly 75. Further, in this design, the upper table component 52 is moveable relative to the lower table component 54. More specifically, the table mover assembly 75 adjusts the position of the upper table component 52 relative to the lower table component 54 of the device table 48.

The design of the table mover assembly 75 can be varied to suit the design requirements to the stage assembly 10. In the embodiment illustrated in FIGS. 5A and 5B, the table mover assembly 75 adjusts the position of the upper table component 52 and the device holder 63 relative to the lower table component 54 with six degrees of freedom. Alternately, for example, the table mover assembly 75 can be designed to move the upper table component 52 relative to the lower table component 54 with only three degrees of freedom. The table mover assembly 75 can include one or more rotary motors, voice coil motors, linear motors, electromagnetic actuators 79, or some other force actuators.

In the embodiment illustrated in FIGS. 5A and 5B, the table mover assembly 75 includes three spaced apart, horizontal table movers 76 and three spaced apart, vertical table movers 78. The horizontal table movers 76 move the upper table component 52 along the X axis, along the Y axis, and about the Z axis relative to the lower table component 54. The vertical table movers 78 move the upper table component 52 about the X axis, about the Y axis, and along the Z axis relative to the lower table component 54.

The design of each table mover 76, 78 can be varied. In the embodiment illustrated in the Figures, each of the horizontal table movers 76 includes a pair of electromagnetic actuators 79, and each of the vertical table movers 78 is a non-commutated actuator commonly referred to as a voice coil actuator.

Figure 6A:
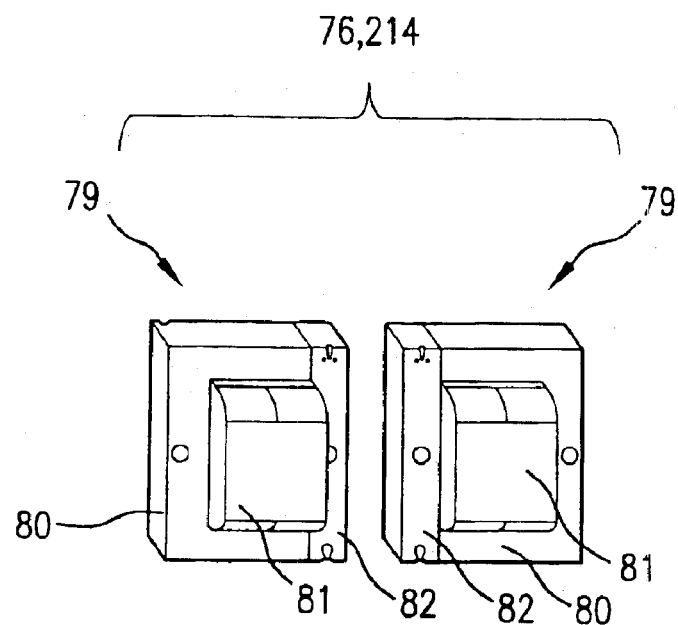
FIG. 6A illustrates a perspective view of a pair of electromagnetic actuators having features of the present invention.
Figure 6B:
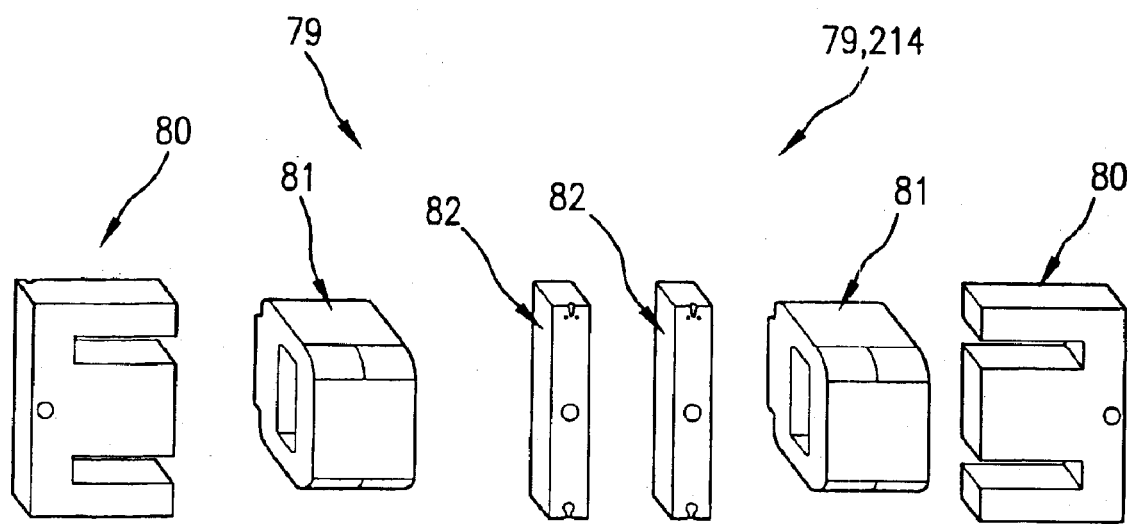
FIG. 6B illustrates an exploded perspective view of the actuators of FIG. 6A.

FIGS. 6A and 6B illustrate a perspective view of a preferred pair of electromagnetic actuators 79. More specifically, FIG. 6A illustrates a perspective view of a pair of electromagnetic actuators 79 commonly referred to as an E/I core actuators 214, and FIG. 6B illustrates an exploded perspective view of the E/I core actuators 214. Each E/I core actuator 214 is essentially an electromagnetic attractive device. Each E/I core actuator 214 includes an E shaped core 80, a tubular conductor 81, and an I shaped core 82. The E core 80 and the I core 82 are each made of a magnetic material such as iron, silicon steel, or Ni—Fe steel. The conductor 81 is positioned around the center bar of the E core 80. The combination of the E core 80 and the conductor 81 is sometimes referred to herein as an electromagnet. Further, the I core 82 is sometimes referred to herein as a target.

Each electromagnet and target is separated by an air gap g (which is very small and therefore difficult to see in the figures). The electromagnets are variable reluctance actuating portions and the reluctance varies with the distance defined by the gap g, which, of course also varies the flux and force applied to the target. The attractive force between the electromagnet and the target is defined by:

$$F = K(i/g)^2$$

Where F is the attractive force, measured in Newtons;

K=an electromagnetic constant which is dependent upon the geometries of the E-shaped electromagnet, I-shaped target, and number of conductor turns about the magnet. $K=1/2N^2 \mu_o wd$; where N=the number of turns about the E-shaped magnet conductor 81; $\mu_o$=a physical constant of about $1.26 \times 10^{-6}$ H/m; w=the half width of the center of the E-shaped core 80 in meters; and d=the depth of the center of the E-shaped core 80 in meters. In a preferred embodiment, $K = 7.73 \times 10^{-6}$ kg m$^3$/s$^2$A$^2$;

i=current, measured in amperes; and g=the gap distance, measured in meters.

Current (not shown) directed through the conductor 81 creates an electromagnetic field that attracts the I core 82 towards the E core 80. The amount of current determines the amount of attraction. Stated another way, when the conductor of an electromagnet is energized, the electromagnet generates a flux that produces an attractive force on the target in accordance with the formula given above, thereby functioning as a linear actuating portion. Because the electromagnets can only attract the targets, they must be assembled in pairs that can pull in opposition. The targets are fixed to the upper table component 52 and move relative to the lower table component 54. Opposing pairs of electromagnets are secured to the lower table component 54 on opposite sides of the targets. By making a current through the one conductor 81 of the pair of electromagnets larger than the current through the other conductor 81 in the pair, a differential force can be produced that draws the target in one direction or its opposing direction.

Preferably, the targets are attached to the upper table component 52 in such a way that the pulling forces of the opposing pair of electromagnets do not distort the upper table component 52. This is preferably accomplished by mounting the targets for an opposing pair of electromagnets very close to one another, preferably peripherally of the upper table component 52. It is preferable to extend a thin web 83 of material (FIG. 5B) that is made of the same material as the upper table component 52. The opposing electromagnets are mounted on the lower table component 54 by a predetermined distance, when thin web 83 and targets are positioned there between, a predetermined gap g is formed between each set of electromagnet and target. With this arrangement, only the resultant force, derived from the sum of the forces produced by the pair of electromagnets and targets, is applied to the upper table component 52 via transfer of the force through thin web 83. In this way, opposing forces are not applied to opposite sides of the upper table component 52 and stage distortion problems resulting from that type of arrangement are avoided.

FIG. 5B illustrates a preferred arrangement of the horizontal table movers 76. In this design, one opposing pair of attraction only actuators 79 are mounted so that the attractive forces produced thereby are substantially parallel with the X axis. Two opposing pairs of attraction only actuators 79 are mounted so that attractive forces from each pair are produced substantially parallel with the Y axis. With this arrangement, the horizontal table movers 76 can make fine adjustments to the position of the upper table component 52 relative to the lower table component 54 along the X axis, along the Y axis, and about the Z axis. More specifically, actuation of the single pair of electromagnetic actuators 79 aligned along the X axis can achieve fine movements along the X axis. Actuation of the two pairs of electromagnetic actuators 79 aligned along the Y axis can control fine movements of the upper stage component 52 along the Y axis or in rotation (clockwise or counterclockwise) in the X-Y plane (i.e., Theta Z control). Y axis movements are accomplished by resultant forces from both pairs that are substantially equal and in the same direction. Theta Z movements are generally accomplished by producing opposite directional forces from the two pairs of electromagnets, although unequal forces in the same direction will also cause some Theta Z adjustment.

Alternately, for example, two opposing pairs of electromagnetic actuators 79 can be mounted parallel with the Y direction, and one opposing pair of electromagnetic actuators 79 could be mounted parallel with the X direction. Other arrangements are also possible, but the preferred arrangement minimizes the number of actuating portions/bearings required for the necessary degrees of control.

Preferably, the lines of force of the electromagnetic actuators 79 are arranged to act through the center of gravity of the upper table component 52. The two Y pairs of electromagnetic actuators 79 are preferably equidistant from the center of gravity of the upper table component 52.

The vertical table movers 78 are used to precisely position the upper table component 52 relative to the lower table component 54 along the Z axis, about the X axis, and about the Y axis (collectively referred to as "vertical degrees of freedom"). Because control in the three vertical degrees of freedom requires less dynamic performance (e.g., acceleration requirements are relatively low), and is easier to accomplish, lower force requirements exist than in the previously described X, Y, and Theta Z degrees of freedom. Accordingly, three voice coil motors can be used as the vertical table movers 78 to adjust the position of the upper table component 52 in the vertical degrees of freedom. In this design, each motor includes a magnet array 78A attached to the lower table component 54 and a conductor array 78B attached to the upper table component 52.

Preferably, fluid bellows 85 (illustrated in phantom) are utilized to support the dead weight of the upper table component 52. The fluid bellows 85 prevent overheating of the vertical table movers 78. As provided herein, one fluid bellow 85 is preferably positioned next to vertical table mover 78. The bellows 85 have very low stiffness in all degrees of freedom so they do not significantly interfere with the control of the upper table component 52.

The guide assembly 50 for each stage 14 is used to move the device table 48 along the X axis and about the Z axis and guide the movement of the device table 48 along the Y axis. The design of the guide assembly 50 can be varied to suit the design requirements of the stage assembly 10. In the embodiment illustrated in FIGS. 1–4, the guide assembly 50 includes an upper beam 84, a lower guide 86, a first guide end 88, and a spaced apart second guide end 90.

The upper beam 84 and the lower guide 86 are spaced apart, substantially parallel, and extend between the guide ends 88, 90.

The upper beam 84 is somewhat rectangular shaped and defines a portion of the stage mover assembly 16. The upper beam 84 fits within the opening 74 of the inner guide section 65. The lower guide 86 is somewhat rectangular shaped and includes a plurality of apertures 92 to reduce the mass. The lower guide 86 also includes a pair of opposed sides 94 (only one side is illustrated in the Figures).

Pressurized fluid (not shown) is released from the fluid outlets of the section fluid pads 72 towards the opposed sides 94 of the lower guide 86 to create a fluid bearing between the device table 48 and the guide assembly 50. The fluid bearing maintains the device table 48 spaced apart from the guide assembly 50 along the X axis and allows for motion of the device table 48 along the Y axis relative to the guide assembly 50.

The guide ends 88, 90 secure the upper beam 84 to the lower guide 86, and secure a portion of the stage mover assembly 16 to the guide assembly 50. Additionally, each of the guide ends 88, 90 includes a guide fluid pad 96 that is positioned adjacent to the reaction base 42. In this embodiment, each of the guide fluid pads 96 includes a plurality of spaced apart fluid outlets (not shown), and a plurality of spaced apart fluid inlets (not shown). Pressurized fluid (not shown) is released from the fluid outlets towards the reaction base 42 and a vacuum is pulled in the fluid inlets to create a vacuum preload type, fluid bearing between each of the guide fluid pads 96 and the reaction base 42. The vacuum preload type, fluid bearing maintains the guide assembly 50 spaced apart along the Z axis relative to the reaction base 42 and allows for motion of the guide assembly 50 along the X axis, along the Y axis, and about the Z axis relative to 30 the reaction base 42.

Alternately, the guide assembly 50 can be supported spaced apart from the reaction base 42 by other ways. For example, a magnetic type bearing or a ball bearing type of assembly could be utilized that allows for motion of the guide assembly 50 relative to the reaction base 42.

The components of each stage 14 can be made of a number of materials including ceramic, such as alumina or silicon carbide; metals such as aluminum; composite materials; or plastic.

The stage mover assembly 16 controls and moves each stage 14 relative to the stage base 12. The design of the stage mover assembly 16 and the movement of the stages 14 can be varied to suit the movement requirements of the stage assembly 10. In the embodiment illustrated in FIGS. 1–3, the stage mover assembly 16 moves the stage 14 with a relatively large displacement along the X axis, a relatively large displacement along the Y axis, and a limited 10 displacement about the Z axis (theta Z) relative to the stage base 12. In this embodiment, the stage mover assembly 16 includes: (i) a first X stage mover 98, (ii) a second X stage mover 100, (iii) an upper Y guide mover 102, (iv) a lower Y guide mover 104, and (v) a Y stage mover 106. The X stage movers 98, 100 move the stage 14 along the X axis and about the Z axis. The Y stage movers 102, 104, 106 move the guide assembly 50 and the stage 14 along the Y axis. More specifically, in this embodiment, (i) the X stage movers 98, 100 move the guide assembly 50 with a relatively large displacement along the X axis and with a limited range of motion about the Z axis (theta Z), (ii) the Y guide movers 102, 104 move the guide assembly 50 with a small displacement along the Y axis, and (iii) the Y stage mover 106 moves the device table 48 with a relatively large displacement along the Y axis.

The design of each mover 98, 100, 102, 104, 106 can be varied to suit the movement requirements of the stage assembly 10. As provided herein, each mover 98, 100, 102, 104, 106 includes a first component 108 and an adjacent second component 110, which interact with the first component 108. In the embodiments provided herein, each of the Y guide movers 102, 104 is an E/I core type actuator. Further, in the embodiments provided herein, for the X stage movers 98, 100 and the Y stage mover 106, one of the components 108, 110 includes one or more magnet arrays (not shown) and the other component 108, 110 includes one or more conductor arrays (not shown).

Each magnet array includes one or more magnets (not shown). The design of each magnet array and the number of magnets in each magnet array can be varied to suit the design requirements of the movers 98, 100, 106. Each magnet can be made of a permanent magnetic material such as NdFeB.

Each conductor array includes one or more conductors (not shown). The design of each conductor array and the number of conductors in each conductor array is varied to suit the design requirements of the movers 98, 100, 106. Each conductor can be made of metal such as copper or any substance or material responsive to electrical current and capable of creating a magnetic field such as superconductors.

Electrical current (not shown) is individually supplied to each conductor in each conductor array by the control system 22. For each mover 98, 100, 106, the electrical current in each conductor interacts with a magnetic field (not shown) generated by one or more of the magnets in the magnet array. This causes a force (Lorentz force) between the conductors and the magnets that can be used to move the stage 14 relative to the stage base 12.

Specifically, the first component 108 and the second component 110 of each X stage mover 98, 100 interact to selectively move the stage 14 along the X axis and about the Z axis relative to the stage base 12. In the embodiment illustrated in the FIG. 1, each X stage mover 98, 100 is a commutated, linear motor.

The first component 108 for the first X stage mover 98 is secured to a first X reaction mass 112 of the X reaction component 33A of the reaction mass assembly 18 while the second component 110 of the first X stage mover 98 is secured to the first guide end 88 of the guide assembly 50. Similarly, the first component 108 for the second X stage mover 100 is secured to a second X reaction mass 114 of the X reaction component 33A of the reaction mass assembly 18 while the second component 110 of the second X stage mover 100 is secured to the second guide end 90 of the guide assembly 50. In this embodiment, the first component 108 of each X stage mover 98, 100 includes a conductor array (not shown) while the second component 110 of each X stage mover 98, 100 includes a pair of spaced apart magnet arrays (not shown). Alternately, for example, the first component 108 of each X stage mover 98, 100 can include a magnet array (not shown) while the second component 110 of each X stage mover 98, 100 can include a pair of spaced apart conductor arrays (not shown).

It should be noted that the first X stage mover 98 for each of the stages 14 illustrated in the FIGS. 1–3 share the same first component 108. Similarly, the second X stage mover 100 for each of the two stages 14 illustrated in the FIGS. 1–3 share the same first component 108.

With the design provided herein, the X stage movers 98, 100 make relatively large displacement adjustments to the position of the guide assembly 50 along the X axis. The required stroke of the X stage movers 98, 100 along the X axis will vary according to desired use of the stage assembly 10. More specifically, for an exposure apparatus 30, generally, the stroke of the X stage movers 98, 100 for moving the semiconductor wafer 28 is between approximately two hundred (200) millimeters and one thousand (1000) millimeters.

The X stage movers 98, 100 also make relatively slight adjustments to position of each stage 14 about the Z axis. In order to make the adjustments about the Z axis, the second component 110 of one of the X stage movers 98, 100 is moved relative to the second component 110 of the other X stage mover 98, 100. With this design, the X stage movers 98, 100 generate torque about the Z axis. A gap (not shown) exists between the first component 108 and the second component 110 of each X stage mover 98, 100 to allow for slight movement of each stage 14 about the Z axis. Typically, the gap is between approximately one millimeter and five millimeters. However, depending upon the design of the particular mover, a larger or smaller gap may be utilized.

The Y guide movers 102, 104 selectively move the guide assembly 50 along the Y axis relative to the stage base 12. In the embodiment illustrated in FIGS. 1–3, each Y guide mover 102, 104 includes an opposed pair of electromagnetic actuators. The electromagnetic actuators consume less power and generate less heat than a voice coil motor or a linear motor. Suitable electromagnetic actuators include the E/I core actuators 214 described above and illustrated in FIGS. 6A and 6B.

In the embodiments provided herein: (i) the combination E shaped core and conductor of each electromagnetic actuator is considered the second component 110 of each Y guide mover 102, 104 and is secured to the guide assembly 50, and (ii) the I shaped core of each electromagnetic actuator is considered the first component 108 of each Y guide mover 102, 104 and is secured to the second X reaction mass 114 of the reaction mass assembly 18. In this embodiment, each Y guide mover 102, 104 includes two E core and conductor combinations that are separated by a row of I cores.

It should be noted that the upper Y guide mover 102 for each of the stages 14 illustrated in the FIGS. 1–3 share the same first component 108. Similarly, the lower Y guide mover 104 for each of the two stages 14 illustrated in the FIGS. 1–3 share the same first component 108.

The Y stage mover 106 moves the stage 14 with a relatively large displacement along the Y axis relative to the stage base 12. More specifically, the first component 108 and the second component 110 of the Y stage mover 106 interact to selectively move the device table 48 along the Y axis relative to the guide assembly 50. In the embodiment illustrated in the FIGS. 1–3, the Y stage mover 106 is a commutated, linear motor. The first component 108 for the Y stage mover 106 is secured to the upper beam 84 of the guide assembly 50, and the second component (not shown) is secured to the inner guide section 65 of the device table 48. In this embodiment, the first component 108 of the Y stage mover 106 includes a conductor array (not shown) and the second component 110 of the Y stage mover 106 includes a magnet array (not shown). Alternately, for example, the first component 108 of the Y stage mover 106 could include a magnet array (not shown) while the second component 110 of the Y stage mover 106 could include a conductor array (not shown).

With this design, the Y stage mover 106 makes relatively large displacement adjustments to the position of the device table 48 along the Y axis. The required stroke of the Y stage mover 106 along the Y axis will vary according to desired use of the stage assembly 10. More specifically, for an exposure apparatus 30, generally, the stroke of the Y stage mover 106 for moving the semiconductor wafer 28 is between approximately one hundred (100) millimeters and six hundred (600) millimeters.

The reaction mass assembly 18 reduces and minimizes the amount of reaction forces from the stage movers 98, 100, 102, 104, 106 that is transferred to the stage base 12 and to the mounting base 24. Uniquely, the reaction mass assembly 18 provided herein is free to move with at least two, and more preferably three, degrees of freedom. More specifically, the reaction mass assembly 18 is free to move along the X axis, along the Y axis, and about the Z axis relative to the stage base 12. This design allows the reaction mass assembly 18 to reduce and minimize the amount of reaction forces from the stage movers 98, 100, 102, 104, 106 that is transferred to the stage base 12 and to the mounting base 24. Further, the reaction mass assembly 18 provided herein reduces and minimizes the reaction forces for multiple stages 14.

The design of the reaction mass assembly 18 can be varied to suit the design requirements of the stage assembly 10. In the embodiment illustrated in FIGS. 1–3, the reaction mass assembly 18 includes the Y reaction component 33B, the X reaction component 33A, and a reaction mover assembly 124. In this design, the Y reaction component 33B includes the reaction base 42, and the X reaction component 33A includes the first X reaction mass 112, and the second X reaction mass 114. Further, the reaction mass assembly 18 is supported above the stage base 12 by the fluid bearings as provided above.

As an overview, through the principle of conservation of momentum, movement of each stage 14 with the X stage movers 98, 100 along the X axis in one direction, moves the X reaction masses 112, 114 of the reaction mass assembly 18 in the opposite direction along the X axis. Somewhat similarly, movement of each stage 14 with the Y stage movers 102, 104, 106 along the Y axis in one direction, moves the X reaction masses 112, 114 and the reaction base 42 along the Y axis in the opposite direction. With this design, the reaction forces from the stage mover assembly 16 are negated. This inhibits the reaction forces from the stage mover assembly 16 from influencing the position of the stage base 12.

The reaction base 42 supports each stage 14 and the X reaction masses 112, 114. The design of the reaction base 42 can be varied to suit the design requirements of the stage assembly 10. In the embodiment illustrated in FIGS. 1–3, the reaction base 42 is generally rectangular shaped and includes a planar, upper surface 126, a planar bottom surface 128, and four sides 130.

The reaction base 42 also includes a mass guide assembly 131 that guides the X reaction masses 112, 114, and allow the X reaction masses 112, 114 to move relative to the reaction base 42 along the X axis. In the embodiments provided herein, the reaction base 42 includes a pair of base guides 132. Each base guide 132 is a rectangular shaped channel in the upper surface 126 that extends along the X axis. Pressurized fluid is released into the channel and a vacuum is created between the reaction base 42 and each of the X reaction masses 112, 114 to create a vacuum preload type fluid bearing (not shown). The fluid bearing maintains the X reaction masses 112, 114 spaced apart from the reaction base 42, and allows for independent motion of the X reaction masses 112, 114 along the X axis relative to the reaction base 42. Alternately, the X reaction masses 112, 114 can be supported above the reaction base 42 by other ways such as magnetic type bearing (not shown) or a ball bearing type of 5 assembly (not shown).

It should be noted in this embodiment, that the X reaction masses 112, 114 and the reaction base 42 move concurrently along the Y axis and about the Z axis. Stated another way, the X reaction masses 112, 114 are rigidly coupled along the Y axis.

Referring to FIGS. 1–3, each of the X reaction masses 112, 114 includes a mass top 134, a mass bottom 136, a mass outer side 138, and a mass inner side 140. Each of the X reaction masses 112, 114 also includes a mass follower 142 that interacts with one the base guides 132 in the reaction base 42 to allow for movement of each X reaction mass 112, 114 along the X axis. In the embodiment illustrated in FIGS. 1–3, the mass follower 142 is a rectangular shaped body that extends downward from the mass bottom 136 of each X reaction mass 112, 114.

The first X reaction mass 112 is generally rectangular shaped and includes a somewhat rectangular shaped first channel 144 that extends into the mass inner side 140 of the first X reaction mass 112. In this embodiment, the first component 108 of the first X stage mover 98 is positioned within the first channel 144 and secured to the first X reaction mass 112.

The second X reaction mass 114 is somewhat rectangular shaped and includes a rectangular shaped upper groove 146 in the mass top 134 and a somewhat rectangular shaped second channel 148 that extends into the mass inner side 140 of the second X reaction mass 114. In this embodiment, the first component 108 of the upper Y guide mover 102 is positioned within the upper groove 146 and is secured to the second X reaction mass 114. Additionally, the first component 108 of the second X stage mover 100 and the first component (not shown) of the lower Y guide mover 104 are positioned within the second channel 148 and are secured to the second X reaction mass 114.

Additionally, each of the X reaction masses 112, 114 includes an "L" shaped bracket 150 that is secured to the mass outer side 138. Each bracket 150 is used to secure a portion of the reaction mover assembly 124 to the X reaction masses 112, 114.

The reaction mover assembly 124 makes minor corrections (i) to the position of the X reaction masses 112, 114 relative to the reaction base 42 and (ii) to the position of the reaction mass assembly 18 relative to the stage base 12. As provided herein, the reaction mover assembly 124 can adjust the position of the reaction mass assembly 18 relative to the stage base 12 in one degree of freedom, and more preferably, in three degrees of freedom. For example, the reaction mover assembly 124 can: (i) move the X reaction component 33A relative to the Y reaction component 33B along the X axis, (ii) move the X reaction component 33A and the Y reaction component 33B concurrently relative to the stage base 12 along the Y axis, (iii) move the X reaction component 33A and the Y reaction component 33B concurrently relative to the stage base 12 along the X axis, and/or (iv) move the X reaction component 33A and the Y reaction component 33B concurrently relative to the stage base 12 about the Z axis.

In the embodiment illustrated in FIGS. 1–3, the reaction mover assembly 124 is used to make minor corrections along the X axis, along the Y axis, and about the Z axis to the position of the reaction mass assembly 18 relative to the stage base 12. Further, the reaction mover assembly 124 is used to 20 independently correct the position of the X reaction masses 112, 114 along the X axis relative to the reaction base 42.

The design of the reaction mover assembly 124 can be varied according to the design requirements of the stage assembly 10. For example, the reaction mover assembly 124 can include one or more rotary motors, voice coil motors, 25 linear motors, electromagnetic actuators, and/or force actuators. In the embodiment illustrated in the FIGS. 1–3, the reaction mover assembly 124 includes a first upper X reaction mover 152A, a second upper X reaction mover 152B, a pair of lower X reaction movers 154, and a Y reaction mover 156. Alternately, for example, the reaction mover assembly 124 could include a single, 30 lower X reaction mover and a pair of Y reaction movers.

In the embodiments illustrated in FIGS. 1–3, each reaction mover 152, 154, 156 includes a first component 158, and an adjacent second component 160. In the embodiments provided herein, one of the components 158, 160 of each mover 152, 154, 156 includes one or more magnet arrays (not shown) and the other component 158, 160 of each mover 152, 154, 156 includes one or more conductor arrays (not shown). Electrical current (not shown) is individually supplied to each conductor array by the control system 22. For each reaction mover 152, 154, 156, the electrical current in each conductor interacts with a magnetic field (not shown) generated by one or more of the magnets in the magnet array. This causes a force (Lorentz force) between the conductors and the magnets.

Specifically, the first component 158 and the second component 160 of each upper X reaction mover 152 interact to selectively and independently move one of the X reaction masses 112, 114 along the X axis relative to the reaction base 42. In the embodiment illustrated in the FIG. 1, each upper X reaction mover 152 is a commutated, linear motor. For the first upper X reaction mover 152A, the first component 158 is secured to the first X reaction mass 112, while the second component 160 is secured to the reaction base 42. Similarly, for the second upper X reaction mover 152B, the first component 158 is secured to the second X reaction mass 114, while the second component 160 is secured to the reaction base 42.

In this embodiment, the first component 158 of each upper X reaction mover 152 includes a conductor array (not shown), while the second component 160 of each upper X reaction mover 152 includes a pair of spaced apart magnet arrays (not shown). With this design, the upper X reaction movers 152 can independently make corrections to the positions of the X reaction masses 112, 114 along the X axis relative to the reaction base 42. Alternately, for example, the first component of each upper X reaction mover 152 could include a pair of spaced apart magnet arrays while the second component of each upper X reaction mover 152 could include a conductor array.

Preferably, the upper X reaction movers 152 include a measurement device (not shown) such as an encoder that provides information regarding the position of the X reaction masses 112, 114 relative to the reaction base 42 along 30 the X axis.

Somewhat similarly, the first component 158 and the second component 160 of each lower X reaction mover 154 interact to collectively move the reaction base 42 along the X axis relative to the stage base 12, and to rotate the reaction base 42 and the X reaction masses 112, 114 about the Z axis relative to the stage base 12. In the embodiment illustrated in the FIG. 1, each lower X reaction mover 154 is a commutated, linear motor. For each of the lower X reaction movers 154, the first component 158 is secured to the reaction base 42 while the second component 160 is secured to the mounting base 24 with a ground frame 164 (illustrated in FIG. 18). Alternately, for example, the second component 160 of each lower X reaction mover 154 can be secured to the stage base 12.

In this embodiment, the first component 158 of each lower X reaction mover 154 includes a conductor array (not shown), while the second component 160 of each lower X reaction mover 154 includes a pair of spaced apart magnet arrays (not shown). With this design, the lower X reaction movers 154 can make minor corrections to the positions of the reaction base 42 along the X axis relative to the stage base 12, and to rotate the reaction base 42 and the X reaction masses 112, 114 about the Z axis relative to the stage base 12. Alternately, for example, the first component 158 of each lower X reaction mover 154 could include a pair of spaced apart magnet arrays while the second component 160 of each upper X reaction mover 154 could include a conductor array.

Preferably, the lower X reaction movers 154 include a measurement device (not shown) such as an encoder that provides information regarding the position of the reaction base 42 relative to the stage base 12 along the X axis and 20 about the Z axis.

Similarly, the first component 158 and the second component 160 of the Y reaction mover 156 interact to selectively move the reaction base 42 and the X reaction masses 112, 114 concurrently along the Y axis relative to the stage base 12. In the embodiment illustrated in FIG. 1, the Y reaction mover 156 is a commutated, linear motor. For the Y reaction mover 156, the first component 158 is secured to the reaction base 42 while the second component 160 is secured to the mounting base 24 with the ground frame 164 (illustrated in FIG. 18). Alternately, for example, the second component 160 of each Y reaction mover 156 can be secured to the stage base 12.

In this embodiment, the first component 158 of each Y reaction mover 156 includes a conductor array while the second component 160 of each Y reaction mover 156 includes a pair of spaced apart magnet arrays (not shown). With this design, the Y reaction movers 156 can make minor corrections to the position of the reaction base 42 and the X reaction masses 112, 114 along the Y axis relative to the stage base 12. Alternately, for example, the first component of the Y reaction mover 156 could include a pair of spaced apart magnet arrays while the second component of the Y reaction mover 156 could include a conductor array.

Preferably, the Y reaction mover 156 includes a measurement device (not shown) such as an encoder that provides information regarding the position of the reaction base 42 relative to the stage base 12 along the Y axis.

For each of the embodiments provided herein, the ratio of the mass of the reaction mass assembly 18 to the mass stage 14 is preferably relatively high. This will minimize the movement of the reaction mass assembly 18 and minimize the required travel of the reaction movers 152, 154, 156. A suitable ratio of the mass of the reaction mass assembly 18 to the mass of the stage 14 is between approximately 1:2 and 1:10. A larger mass ratio is better, but is limited by the physical size of the reaction mass assembly 18.

Preferably, each of the movers in the stage mover assembly 16 and the reaction mover assembly 124, are at the same height along the Z axis. In the X axis, the Y stage mover 106, a center of gravity of the device table 48, and a center of gravity of the guide assembly 50 are preferably in line. Also, in the X axis, the Y reaction mover 156 and the center of gravity of the Y reaction component 33B are preferably in line. In the Y axis, the center of gravity of the device table 48 and the fluid bearing between the device table 48 and the guide assembly 50 are preferably in line. In the Y axis, the center of gravity of the first X reaction mass 112, the first X stage mover 98, and the first upper reaction mover 152A are preferably in line. In the Y axis, the center of gravity of the second X reaction mass 114, the second X stage mover 100, and the second upper X reaction mover 152 are preferably in line.

The measurement system 20 monitors movement of each stage 14 relative to the stage base 12, or to some other reference such as a lens assembly 508 (illustrated in FIG. 18). With this information, the stage mover assembly 16 can be used to precisely position the stages 14. The design of the measurement system 20 can be varied. For example, the measurement system 20 can utilize laser interferometers, encoders, and/or other measuring devices to monitor the position of the stages 14.

In the embodiment illustrated in FIGS. 1–3, the measurement system 20 monitors the position of the device table 48 for each stage 14 along the X axis, along the Y axis, and about the Z axis. For the design illustrated in FIGS. 1–3, for each stage 14, the measurement system 20 measures the position of the device table 48 relative to the guide assembly 50 along the Y axis, and the measurement system 20 measures the position of the device table 48 along the Y axis, along the X axis, and about the Z axis relative to the lens assembly 508.

In this embodiment, for each stage 14, the measurement system 20 utilizes a linear encoder (not shown) that measures the amount of movement of device table 48 relative to the guide assembly 50 as the device table 48 moves relative to the guide assembly 50. Alternately, for example, an interferometer system (not shown) can be utilized. A suitable interferometer system can be made with components obtained from Agilent Technologies in Palo Alto, Calif.

Additionally, for each stage 14, the measurement system 20 includes an XZ interferometer 170 and a Y interferometer 172. The XZ interferometer 170 includes an XZ mirror 174 and an XZ block 176. The XZ block 176 interacts with the XZ mirror 174 to monitor the location of the device table 48 along the X axis and about the Z axis (theta Z). More specifically, the XZ block 176 generates a pair of spaced apart XZ measurement laser beams (not shown) that are reflected off of the XZ mirror 174. With these laser beams, the location of the device table 48 along the X axis and about the Z axis can be monitored. Further, because the device table 48 does not move relative to the guide assembly 50 along the X axis or about the Z axis, the location of the guide assembly 50 along the X axis and about the Z axis can also be monitored by the XZ interferometer 170.

In the embodiment illustrated in the Figures, the XZ mirror 174 is rectangular shaped and extends along one side of the device table 48. The XZ block 176 is positioned away from the device table 48. The XZ block 176 can be secured to the apparatus frame 46 (illustrated in FIG. 18) or some other location that is isolated from vibration.

Somewhat similarly, the Y interferometer 172 includes a Y mirror 178 and a Y block 180. The Y mirror 178 interacts with the Y block 180 to monitor the position of the device table 48 along the Y axis. More specifically, the Y block 180 generates a Y measurement laser beam that is reflected off of the Y mirror 178. With this laser beam, the location of the device table 48 along the Y axis can be monitored. Further, because the position of the device table 48 relative to the guide assembly 50 along the Y axis is measured with the encoder, the position of the guide assembly 50 along the Y axis can also be monitored.

In the embodiment illustrated in the Figures, the Y mirror 178 is rectangular shaped and is positioned along one of the sides of the device table 48. The Y block 180 is positioned away from the device table 48. The Y block 180 can be secured to the apparatus frame 46 (illustrated in FIG. 18) or some other location that is isolated from vibration.

Additionally, for the embodiment illustrated in FIGS. 5A and 5B, the measurement system 20 includes one or more sensors (not shown) that measure the position of the upper table component 52 relative to the lower table component 54.

The control system 22 controls the stage mover assembly 16 for each stage 14 to precisely position the stages 14 and the devices 26. In the embodiment illustrated in FIGS. 1–3, the control system 22 directs and controls the current to the conductor array for each of the X stage mover 98, 100 to control movement of the stages 14 along the X axis and about the Z axis. Similarly, the control system 22 directs and controls the current to conductor array for the Y stage mover 106 to control movement of the stages 14 along the Y axis. Also, the control system 22 directs and controls the current to the conductors of each E/I core actuator of each Y guide mover 102, 104 to control the position of the guide assembly 50.

Additionally, the control system 22 directs and controls current to the reaction mover assembly 124 to control the position of the reaction mass assembly 18 along the X axis, along the Y axis and about the Z axis. More specifically, the control system 22 directs current to the conductor array for each upper X reaction mover 152 to independently control the position of each X reaction mass 112, 114 relative to the reaction base 42. Further, the control system 22 directs current to the conductor array for each lower X reaction mover 154 and the Y reaction mover 156 to control the position of the reaction base 42 along the X axis, along the Y axis and about the Z axis relative to the stage base 12.

Figure 7A:
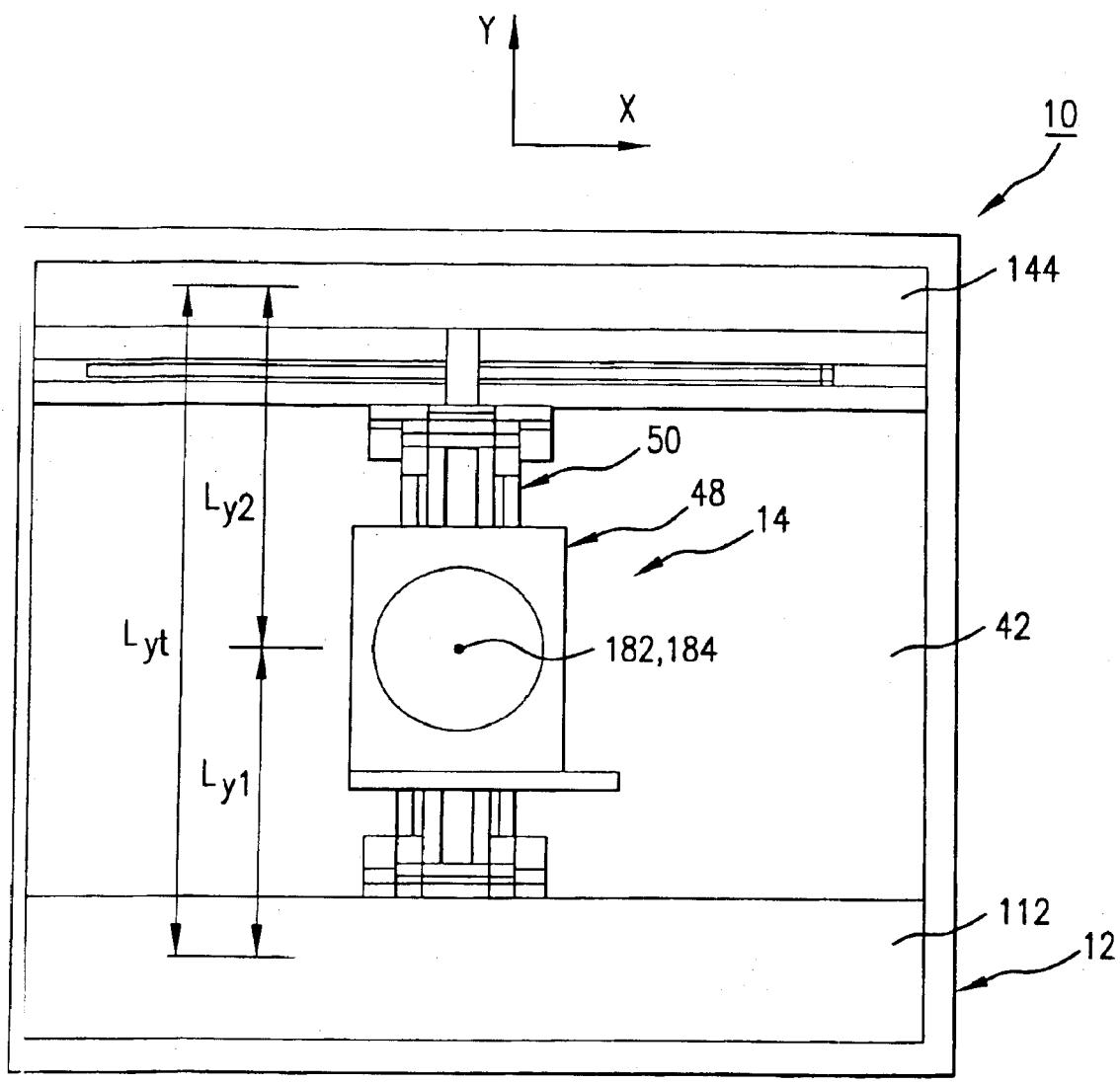
FIG. 7A is a simplified, schematic top view of a portion of a stage assembly.
Figure 7B:
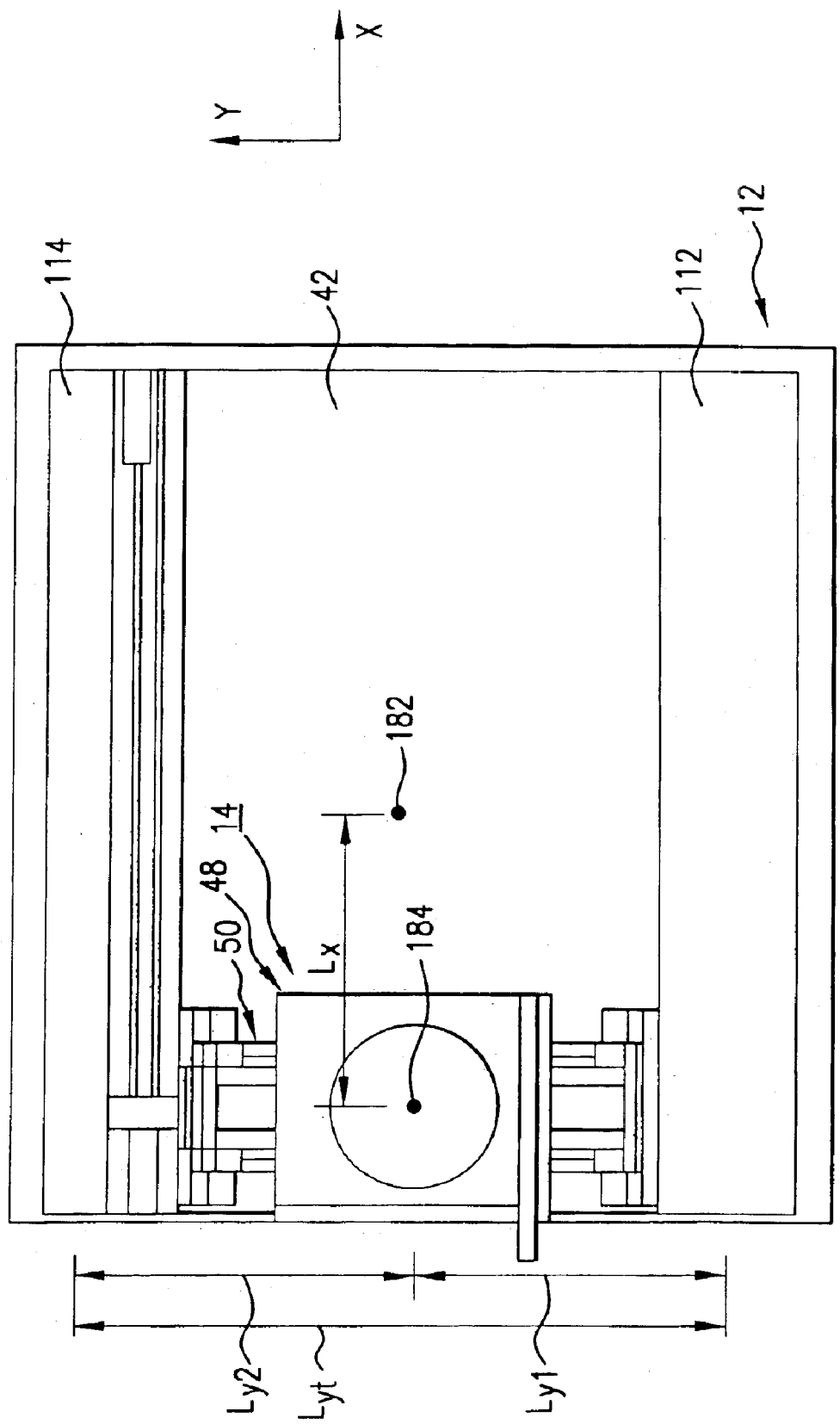
FIG. 7B is another, simplified schematic top view of a portion of the stage assembly.

FIGS. 7A and 7B illustrate simplified schematic top views of a portion of a stage assembly 10 having a single stage 14 that facilitate a discussion of the movement of the reaction mass assembly 18. In particular, FIG. 7A illustrates the stage assembly 10 with one device table 48 positioned approximately half-way between the X reaction masses 112, 114 along the Y axis. In FIG. 7A, the device table 48 is positioned near a stage assembly combined center of gravity 182 and a stage center of gravity 184. In this embodiment, the stage assembly combined center of gravity 182 represents the center of gravity of the device table 48, the guide assembly 50, the first X reaction mass 112, the second X reaction mass 114, and the reaction base 42 and the stage center of gravity 184 represents the center of gravity of the device table 48 and the guide assembly 50. FIG. 7B illustrates the stage assembly 10 with the guide assembly 50, device table 48, and the stage center of gravity 184 positioned away from the stage assembly combined center of gravity 182.

The following symbols are used in conjunction with FIGS. 7A and 7B and the discussion provided below to describe the movement of the reaction mass assembly 18:

$L_{y1}$, represents the distance along the Y axis between the center of the first X reaction mass 112 and a stage combined center of gravity 184.

$L_{y2}$ represents the distance along the Y axis between the center of the second X reaction mass 114 and the stage combined center of gravity 184.

$L_{yr}$ represents the distance along the Y axis between the center of the first X reaction mass 112 and the center of the second X reaction mass 114.

$L_x$ represents the distance along the X axis between the stage assembly combined center of gravity 182 and the stage combined center of gravity 184.

$M_s$ represents the total mass of the stage 14.

$M_1$ represents the total mass of the first X reaction mass 112.

$M_2$ represents the total mass of the second X reaction mass 114.

$M_d$ represents the total mass of the device table 48.

$M_{cm}$ represents the combined mass of the X reaction masses 112, 114 the reaction base 42 and the guide assembly 50.

$a^x_s$, represents the acceleration of the stage 14 along the X axis.

$a^x_1$, represents the acceleration of the first X reaction mass 112 along the X axis.

$a^x_2$ represents the acceleration of the second X reaction mass 114 along the X axis.

$a^Y_d$ represents the acceleration of the device table 48 along the Y axis.

$a^Y_{cm}$ represents the acceleration of the X reaction masses 112, 114, the reaction base 42, and the guide assembly 50 along the Y axis.

Referring to FIG. 7A, during a move of the stage 14 along the X axis, under the principles of the conservation of momentum, the following formulas are applicable:

$$Ms \int a^x_s dt + M_1 \int a^x_1 dt + M_2 \int a^x_2 dt = \text{constant} = 0$$

$$M_1 a_1 L_{y1} = M_2 a_2 L_{y2}$$

Referring to FIG. 7B, during a move of the stage 14 along the Y axis, under the principles of conservation of momentum, the following formulas are applicable:

$$M_d \int a^Y_d dt + M_{cm} \int a^Y_{cm} dt = \text{constant} = 0$$

Further, to achieve zero torque:

$$M_d a^Y_d L_x = (M_2 a^x_2 - M_1 a^x_1) L_{yt}$$

Further, to achieve no net force $$M_1 a_1^x + M_2 a_2^x = 0$$

Figure 7C:
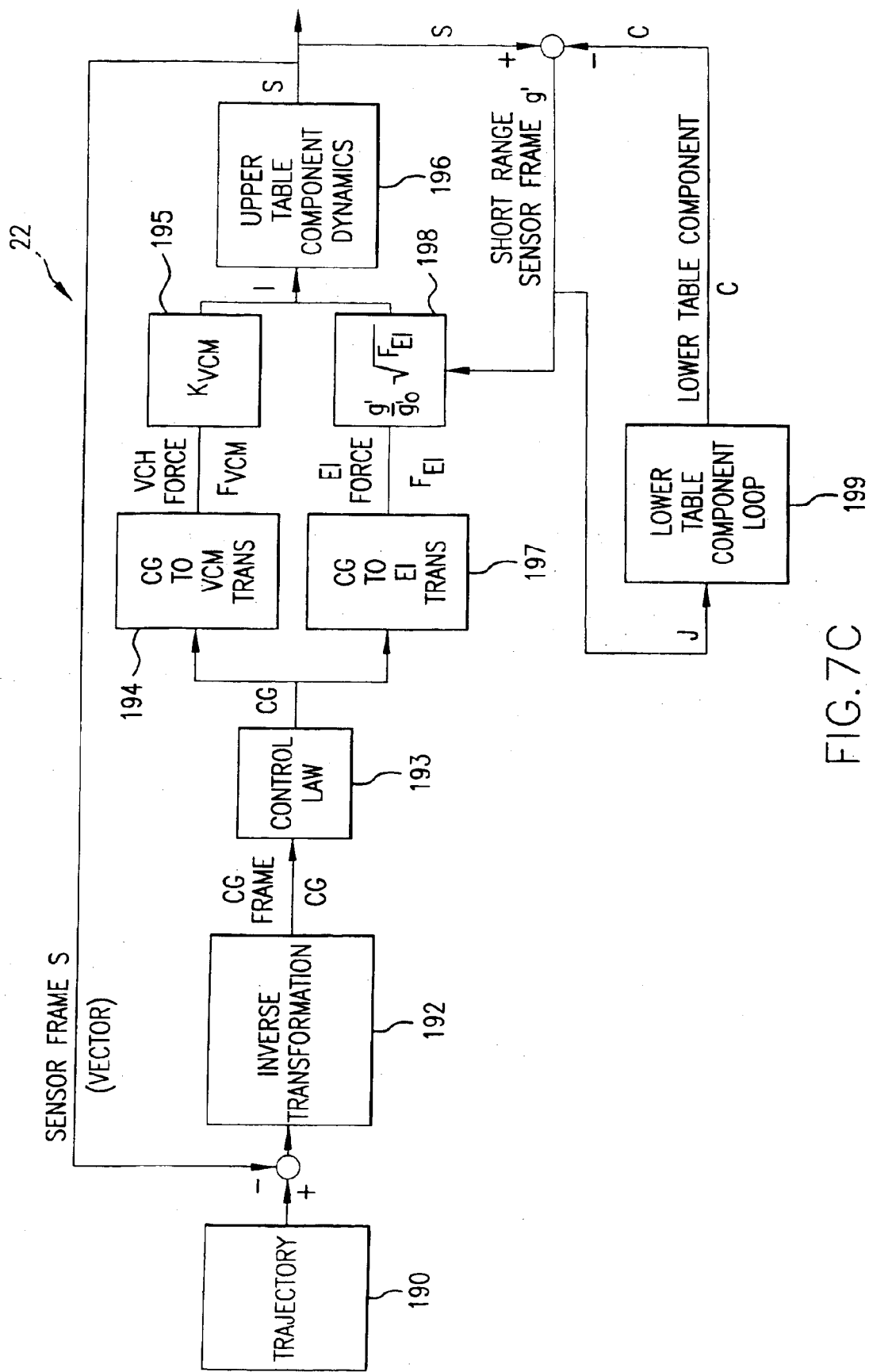
FIG. 7C is a simplified block diagram that illustrates the operation of a control system having features of the present invention.

FIG. 7C is a schematic that describes the sensing and control functions used to move and control a stage assembly 10 that includes the device table 48 illustrated in FIGS. 5A and 5B. The sensing and control functions are more thoroughly described in co-pending U.S. patent applications Ser. Nos. 09/022,713 field Feb. 12, 1998, 09/139,954 filed Aug. 25, 1998, and 09/141,762 filed Aug. 27, 1998, each of which is hereby incorporated by reference thereto, in their entireties. A trajectory 190, or desired path for the focused optical system to follow, is determined based on the desired path of the wafer or other object to which the focused optical system is to be applied. The trajectory 190 is next fed into the control system 22. The trajectory 190 is compared with a sensor signal vector S that is generated from the output of measurement system 20. The difference vector, which results from the comparison, is transformed to a CG coordinate frame though an inverse transformation 192. The control law 193 prescribes the corrective action for the signal. The control law may be in the form of a PID (proportional integral derivative) controller, proportional gain controller or preferably a lead-lag filter, or other commonly known law in the art of control, for example.

The vector for vertical motion is fed to the CG to VCM transformation 194. This transforms the CG signal to a value of force to be generated by the VCMs, which is then fed to the VCM gain 195, and output to the stage hardware 196. The vector for planar motion is fed to the CG to El-core transformation 197. This transforms the CG signal to a force to be generated by the El-core force (i.e., electromagnet and target arrangements). Because the El-core force depends upon the gap squared, it is compensated by the short range sensor vector g through the compensation block 198, to produce a linear output to the stage hardware 196. The stage hardware 196 responds to the input and is measured in the sensor frame S. A similar servo loop (block 199) is not shown in detail for moving the lower table component 54. The position of lower table component 54, is also computed using the upper table component 52 and the gap g. As provided herein, the lower table component 54 is servoed to maintain a predetermined relationship to the upper table component 52.

Figure 9:
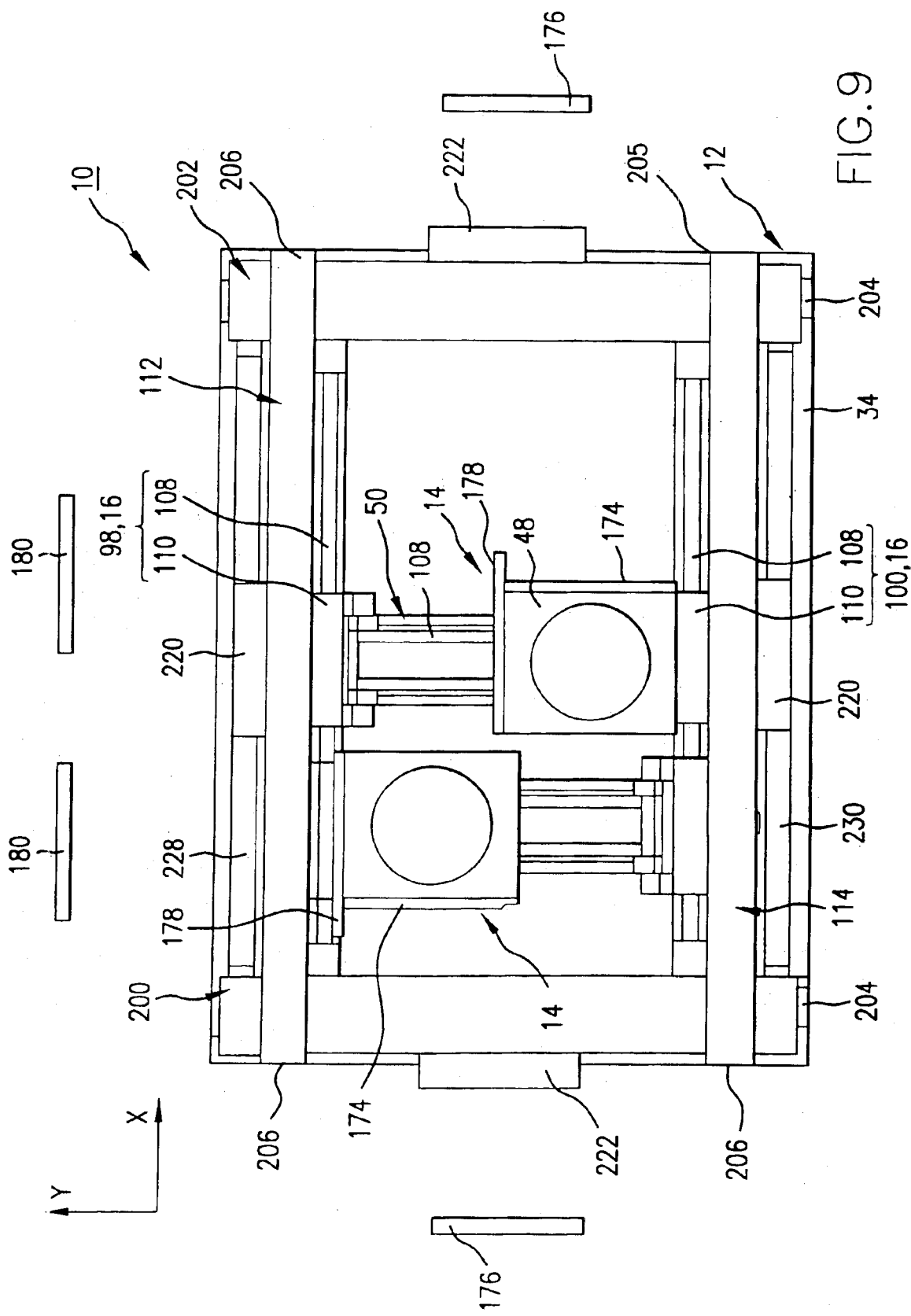
FIG. 9 is a top plan view of the stage assembly of FIG. 8.
Figure 10:
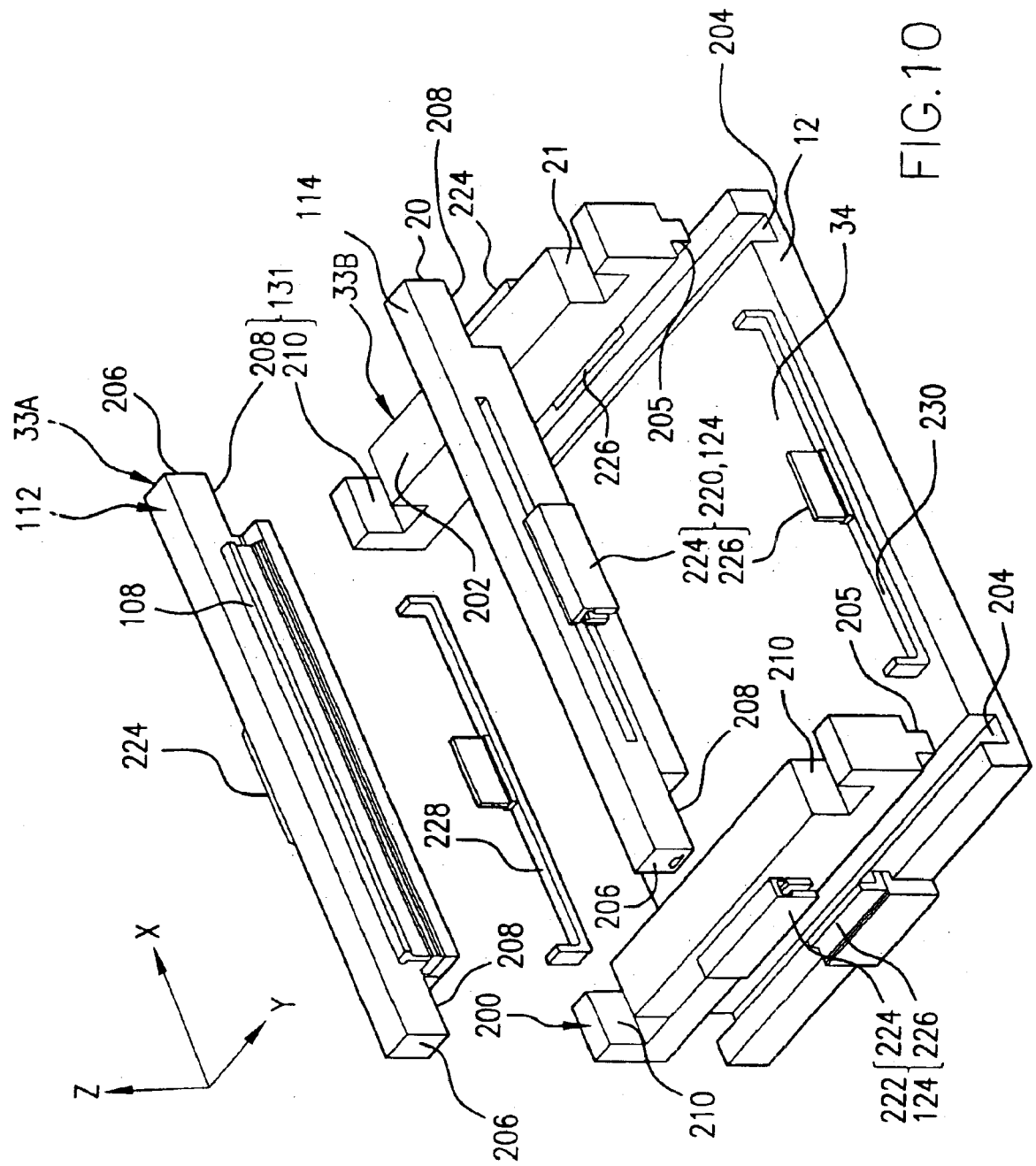
FIG. 10 is an exploded perspective view of a reaction mass assembly illustrated in FIG. 8.

FIGS. 8–10 illustrate a second embodiment having features of the present invention. In particular, FIG. 8 illustrates a perspective view of the stage assembly 10, FIG. 9 illustrates a top plan view of the stage assembly 10 of FIG. 8, and FIG. 10 illustrates an exploded perspective view of the reaction mass assembly 18. The stage assembly 10 illustrated in FIGS. 8 and 9 includes the stage base 12, a pair of stages 14, the stage mover assembly 16, the reaction mass assembly 18, the measurement system 20, and the control system 22.

In the embodiment illustrated in FIGS. 8–9, each stage 14, the stage mover assembly 16, the measurement system 20, and the control system 22 are somewhat similar to the equivalent components described above. However, in the embodiment illustrated in FIGS. 8–10, the stage base 12 and the reaction mass assembly 18 differ from the embodiment illustrated in FIGS. 1–3.

In the embodiment illustrated in FIGS. 8–10, the X reaction component 33A includes the X reaction masses 112, 114. However, in this embodiment, instead of a reaction base 42, the Y reaction component 33B includes a first Y reaction mass 200 and a second Y reaction mass 202.

Further, in this embodiment, the base top 34 of the stage base 12 includes a reaction guide assembly 203, e.g. a pair of reaction guides 204. Each Y reaction mass 200, 202 includes a Y follower 205. The reaction guides 204 cooperate with the Y followers 205 to guide movement of the Y reaction masses 200, 202 along the Y axis and allow the reaction masses 112, 114, 200, 202 to move relative to the stage base 12 along the Y axis. In the embodiments provided herein, each reaction guide 204 is a rectangular shaped channel in the base top 34 that extends along the Y axis, and each Y follower 205 is a rectangular shaped lip that extends below each Y reaction mass 200, 202 along the Y axis. Pressurized fluid is released into the channel and a vacuum is created between the stage base 12 and each of the Y reaction masses 200, 202 to create a vacuum preload type fluid bearing (not shown). The fluid bearing maintains the Y reaction masses 200, 202 spaced apart from the stage base 12 and allows for relative motion of the reaction masses 112, 114, 200, 202 along the Y axis relative to the stage base 12. Alternately, the Y reaction masses 200, 202 can be supported above the stage base 12 by other ways such as magnetic type bearing (not shown) or a ball bearing type assembly (not shown).

In this embodiment, the X reaction masses 112, 114 move independently relative to the Y reaction masses 200, 202 along the X axis. Further, all of the reaction masses 112, 114, 200, 202 move together along the Y axis. Stated another way, the X reaction masses 112, 114 are rigidly coupled in the Y direction and move concurrently with the Y reaction masses 200, 202 along the Y axis.

As can best be seen with reference to FIG. 10, each X reaction mass 112, 114 includes a pair of opposed ends 206. Each end 206 includes an X follower 208. In this embodiment, each X follower 208 is a notch in the end of the X reaction mass 112, 114. Each of the Y reaction masses 200, 202 includes two X guides 210. In this embodiment, each X guide 210 is a groove that is sized and shaped to receive a portion of one of the X reaction masses 112, 114. The X guides 210 and the X followers 208 cooperate to form the mass guide assembly 131. More specifically, the X guides 210 cooperate with the X followers 208, and allow the X reaction masses 112, 114 to move relative to the Y reaction masses 200, 202 along the X axis. Further, the X guides 210 cooperate with the X followers 208 to constraint the X reaction masses 112, 114 so that the X reaction masses 112, 114 move concurrently with the Y reaction masses 200, 202 along the Y axis.

In the design, pressurized fluid is released into each X guide 210 and a vacuum is created between each Y reaction mass 200, 202 and each of the X reaction masses 112, 114 to create a vacuum preload type fluid bearing (not shown). The fluid bearing maintains the X reaction masses 112, 114 spaced apart from the Y reaction masses 200, 202 and allows for relative motion of the X reaction masses 112, 114 independently along the X axis relative to the Y reaction masses 200, 202. Alternately, for example, the X reaction masses 112, 114 can be supported and allowed to move relative to the Y reaction masses 200, 202 by other ways, such as a magnetic type bearing (not shown) or a ball bearing type assembly (not shown).

Somewhat similar to the embodiment illustrated in FIGS. 1–3, in the embodiment illustrated in FIGS. 8–10, the first component 108 of the first X stage mover 98 is secured to and moves with the first X reaction mass 112. Additionally, the first component 108 of the second X stage mover 100 is secured to and moves with the second X reaction mass 114. Further, the first component 108 of the Y stage mover 106 is secured to the guide assembly 50, and the second component 110 is secured to the device table 48. However, in the embodiment illustrated in FIGS. 8–10, each stage 14 utilizes a single Y guide mover 212 to move the guide assembly 50 along the Y axis relative to the stage base 12. In the embodiment illustrated in FIGS. 8–10, the Y guide mover 212 is a pair of E/I core actuators 214.

In this embodiment, the reaction mover assembly 124 is again used to make minor corrections along the Y axis to the position of the reaction mass assembly 18 relative to the stage base 12. Further, the reaction mover assembly 124 is used to make minor corrections to the position of the X reaction masses 112, 114 along the X axis relative to the Y reaction masses 200, 202 and the stage base 12.

In the embodiment illustrated in FIGS. 8–10, the reaction mover assembly 124 includes a pair of X reaction movers 220 and a pair of Y reaction movers 222 that cooperate to correct the location of the reaction mass assembly 18 relative to the stage base 12. In the embodiment illustrated in FIGS. 8–10, each of the reaction movers 220, 222 includes a first component 224 and an adjacent, second component 226. In the embodiments provided herein, one of the components 224, 226 of each of the reaction movers 220, 222 includes one or more magnet arrays (not shown) and the other component 224, 226 of each of the reaction movers 220, 222 includes one or more conductor arrays (not shown).

Electrical current (not shown) is individually supplied to each conductor array by the control system 22.

For each of the reaction movers 220, 222, the electrical current in each conductor interacts with a magnetic field (not shown) generated by one or more of the magnets in the magnet array. This causes a force (Lorentz force) between the conductors and the magnets.

Specifically, the first component 224 and the second component 226 of each X reaction mover 220 interact to independently move one of the X reaction masses 112, 114 along the X axis relative to the Y reaction masses 200, 202. In the embodiment illustrated in the FIGS. 8–10, each X reaction mover 220 is a commutated, linear motor. For one of the X reaction movers 220, the first component 224 is secured to the first X reaction mass 112 while the second component 226 is secured to either or both of the Y masses 200, 202. Similarly, for the other X reaction mover 220, the first component 224 is secured to the second X reaction mass 114 while the second component 226 is secured to either or both of the Y masses 200, 202.

In the embodiment illustrated in FIGS. 8–10, a first connector bracket 228 and a spaced apart second connector bracket 230 each extend between the Y masses 200, 202. The connector brackets 228, 230 move with the Y masses 200, 202 above the stage base 12. The first connector bracket 228 extends along the first X reaction mass 112 and the second connector bracket 230 extends along the second X reaction mass 114. In this embodiment, the second component 226 of each of the X reaction movers 220 is secured to the connector brackets 228, 230.

In FIGS. 8–10, the first component 224 of each X reaction mover 220 includes a pair of spaced apart magnet arrays (not shown), while the second component 226 of each X reaction mover 220 includes a conductor array (not shown). With this desigh, the X reaction movers 220 can independently make corrections to the positions of the X reaction masses 112, 114 along the X axis relative to the stage base 12. Alternately, for example, the first component of each X reaction mover could include a conductor array while the second component of each X reaction mover could include a pair of spaced apart magnet arrays.

Preferably, the X reaction movers 220 include a measurement device (not shown) such as an encoder that provides information regarding the position of the X reaction masses 112, 114 relative to the stage base 12 or the Y masses 200, 202 along the X axis.

Somewhat similarly, the first component 224 and the second component 226 of each Y reaction mover 222 interact to selectively move the reaction masses 112, 114, 200, 202 along the Y axis relative to the stage base 12. In the embodiment illustrated in FIGS. 8–10, each Y reaction mover 222 is a commutated, linear motor. For each of the Y reaction movers 222, the first component 224 is secured to one of the Y reaction masses 200, 202 while the second component 226 is secured to the stage base 12.

In FIGS. 8–10, the first component 224 of each Y reaction mover 222 includes a pair of spaced apart magnet arrays (not shown) while the second component of each Y reaction mover includes a conductor array (not shown). With this design, the Y reaction movers 222 can make minor corrections to the positions of the reaction masses 112, 114, 200, 202 along the Y axis relative to the stage base 12. Alternately, for example, the first component 224 of each Y reaction mover 222 could include a conductor array while the second component 226 of each Y reaction mover 222 could include a pair of spaced apart magnet arrays.

Preferably, the Y reaction movers 222 include a measurement device (not shown) such as an encoder that provides information regarding the position of the Y reaction masses 200, 202 relative to the stage base 12 along the Y axis.

Alternately, in this embodiment, the second component 226 of each reaction mover 220, 222 could be secured to the mounting base 24 with the ground frame 164 (illustrated in FIG. 18) instead of to the stage base 12.

Figure 12:
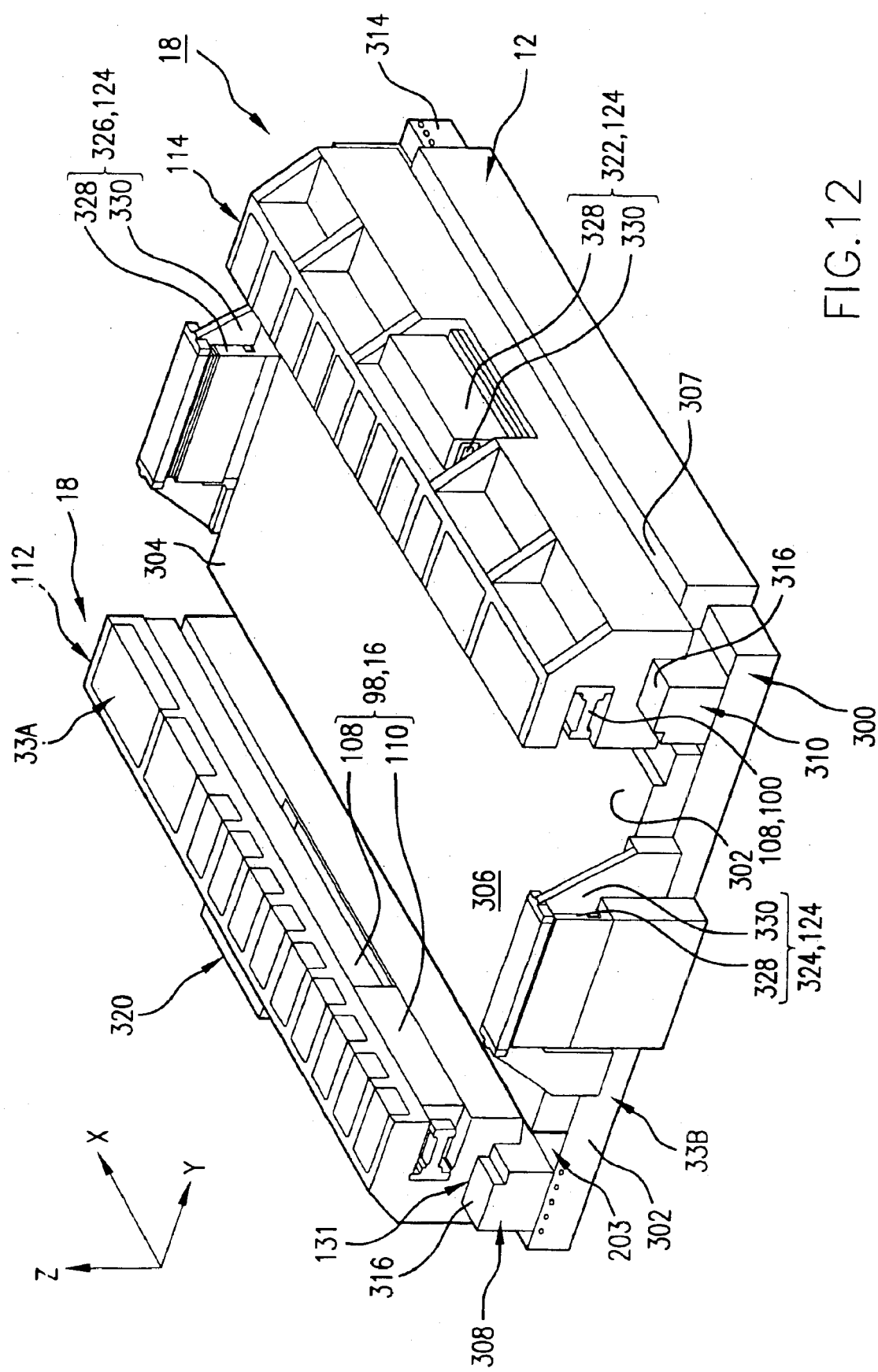
FIG. 12 is a perspective view of a reaction mass assembly illustrated in FIG. 11.
Figure 13:
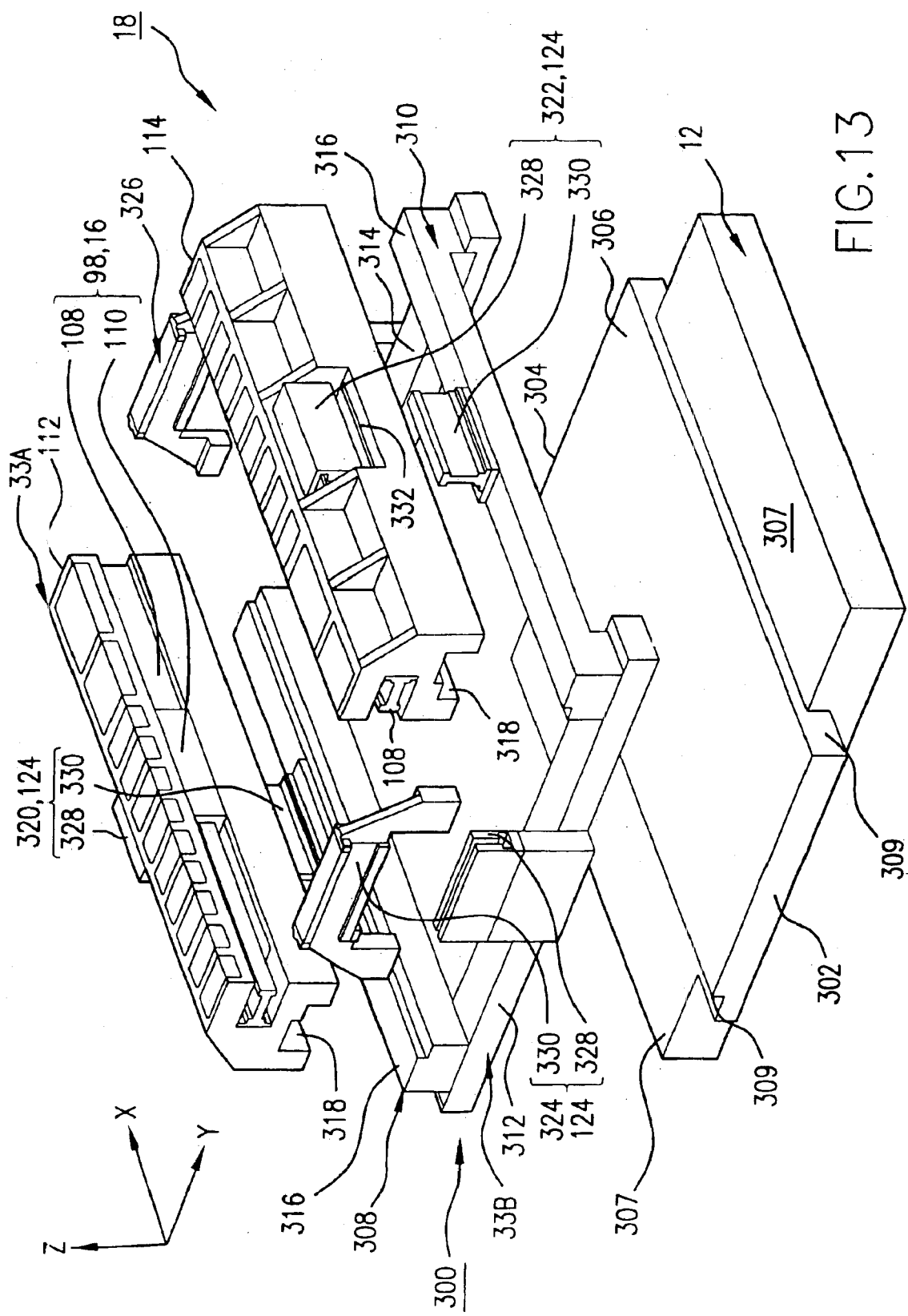
FIG. 13 is an exploded perspective view of the reaction mass assembly of FIG. 11.

FIGS. 11–13 illustrate a third embodiment having features of the present invention. In particular, FIG. 11 illustrates a perspective view of the stage assembly 10, FIG. 12 illustrates a perspective view of the reaction mass assembly 18, and FIG. 13 illustrates an exploded perspective view of the reaction mass assembly 18. The stage assembly 10 illustrated in FIG. 11 includes the stage base 12, a pair of stages 14, the stage mover assembly 16, the reaction mass assembly 18, and the control system 22. The measurement system is not illustrated in FIG. 11.

In the embodiment illustrated in FIG. 11, each stage 14, the stage mover assembly 16, and the control system 22 are somewhat similar to the equivalent components described above. However, in the embodiment illustrated in FIGS. 11–13, the stage base 12 and the reaction mass assembly 18 differ from the embodiment illustrated in FIGS. 1–3 and the embodiment illustrated in FIGS. 8–10.

In the embodiment illustrated in FIGS. 11–13, the X reaction component 33A includes the X reaction masses 112, 114. However, in this embodiment, instead of a reaction base, the Y reaction component 33B includes a reaction frame 300.

As can best be seen with reference to FIGS. 12 and 13, in this embodiment, the stage base 12 is somewhat rectangular shaped and includes a front lip 302, a rear lip 304, a raised central section 306, and a pair of spaced apart upper edge sections 307. The front lip 302 cantilevers away from a front side of the stage base 12, and the rear lip 304 cantilevers away from a rear side of the stage base 12. The raised central section 306 separates the upper edge sections 307. The raised central section 306 includes a pair of spaced apart section sides 309.

The reaction frame 300 is rectangular frame shaped and includes a first frame side 308, a second frame side 310, a front frame side 312, and a rear frame side 314. Referring to FIG. 13, the first and second frame sides 308, 310 are offset from and are positioned above the front and rear frame sides 312, 314. This feature enhances the access to the stages 14.

The first frame side 308 and the second frame side 310 each include an X mass guide 316 for guiding the X reaction masses 112, 114. Each X reaction mass 112, 114 includes an X follower 318. The X mass guides 316 and the X followers 318 cooperate to form the mass guide assembly 131. In this embodiment, each X mass guide 316 cooperates with the X follower 318 of one of the X reaction masses 112, 114, to guide the movement of the X reaction masses 112, 114 along the X axis relative to the reaction frame 300 and stage base 12. In the embodiments provided herein, the first and second frame sides 308, 310 are each somewhat rectangular beam shaped and each X follower 318 is a channel that extends along the X axis in each of the X reaction masses 112, 114. The front and rear frame sides 312, 314 are also generally rectangular shaped.

Pressurized fluid is released and a vacuum is created between the first and second frame sides 308, 310 and the X reaction masses 112, 114 to create a vacuum preload type fluid bearing (not shown). The vacuum preload type fluid bearing maintains the X reaction masses 112, 114 spaced apart from the reaction frame 300 and allows for independent relative motion of the X reaction masses 112, 114 along the X axis relative to the reaction frame 300 and stage base 12. Alternately, the X reaction masses 112, 114 can be supported above the reaction frame 300 by other ways such as a magnetic type bearing (not shown) or a ball bearing type assembly (not shown).

It should be noted in this embodiment, that the X reaction masses 112, 114 and the reaction frame 300 move concurrently along the Y axis.

In the design provided in FIGS. 11–13, the first frame side 308 and the second frame side 310 are positioned above the upper edge sections 307 and are separated by the raised central section 306. Further, the front frame side 312 is positioned below the front lip 302, and the rear frame side 314 is positioned below the rear lip 304. In the embodiment illustrated in FIGS. 11–13, the reaction frame 300 is maintained above the stage base 12 with a reaction guide assembly 203. More specifically, in this embodiment, pressurized fluid (not shown) is released and a vacuum is pulled in fluid inlets (not shown) to create a vacuum preload type fluid bearing between the stage base 12 and the reaction frame 300. The vacuum preload type, fluid bearing maintains the reaction frame 300 spaced apart from the stage base 12 along the X axis and along the Z axis. With this design, the vacuum preload type fluid bearing allows for motion of the reaction frame 300 along the Y axis relative to the stage base 12. Further, the fluid bearing inhibits movement of the reaction frame 300 relative to the stage base 12 along the X axis, along the Z axis, and about the X, Y and Z axis.

Alternately, the reaction frame 300 can be supported spaced apart from the stage base 12 by other ways. For example, a magnetic type bearing (not shown) or a ball bearing type assembly (not shown) could be utilized that allows for motion of the reaction frame 300 relative to the stage base 12.

Somewhat similar to the embodiment illustrated in FIGS. 1–3, in this embodiment, the first component 108 of the first X stage mover 98 is secured to and moves with the first X reaction mass 112; and, the first component 108 of the second X stage mover 100 is secured to and moves with the second X reaction mass 114.

Further, the stage assembly 10 illustrated in FIG. 11 includes a single, Y guide mover (not shown) that moves the guide assembly 50 along the Y axis relative to the stage base 12. In this embodiment, the reaction mover assembly 124 is used to make minor corrections along the Y axis to the position of the reaction mass assembly 18 relative to the stage base 12. Further, the reaction mover assembly 124 is used to independently make corrections to the position of the X reaction masses 112, 114 along the X axis relative to the reaction frame 300.

In the embodiment illustrated in FIGS. 11–13, the reaction mover assembly 124 includes a first X reaction mover 320, a second X reaction mover 322, a first Y reaction mover 324, and a second Y reaction mover 326, that cooperate to move the reaction mass assembly 18 relative to the stage base 12.

Each of the reaction movers 320, 322, 324, 326 includes a first component 328 and an adjacent, second component 330. In the embodiments provided herein, one of the components 328, 330 of each reaction mover 320, 322, 324, 326 includes one or more magnet arrays (not shown) and the other component 328, 330 of each mover 320, 322, 324, 326 includes one or more conductor arrays (not shown). Electrical current (not shown) is individually supplied to each conductor array by the control system 22. For each reaction mover 320, 322, the electrical current in each conductor interacts with a magnetic field (not shown) generated by one or more of the magnets in the magnet array. This causes a force (Lorentz force) between the conductors and the magnets.

Specifically, in the embodiment illustrated in the FIGS. 11–13, each X reaction mover 320, 322 is a commutated, linear motor. For the first X reaction mover 320, the first component 328 is secured to the first X reaction mass 112 while the second component 330 is secured to the first frame side 308 of the reaction frame 300. Similarly, for the second X reaction mover 322, the first component 328 is secured to the second X reaction mass 114 while the second component 330 is secured to the second frame side 310 of the reaction frame 300.

It should be noted in this embodiment that each X reaction mass 112, 114 includes a mass aperture 332, and that the second component 330 of each X reaction mover 320, 322 extends through the mass aperture 332.

In this embodiment, the first component 328 of each X reaction mover 320, 322 includes a pair of spaced apart magnet arrays (not shown) while the second component 330 of each X reaction mover 320, 322 includes a conductor array (not shown). With this design, the X reaction movers 320, 322 can make minor corrections to the positions of the X reaction masses 112, 114 along the X axis relative to the reaction frame 300 and the stage base 12. Alternately, for example, the first component of each X reaction mover could include a conductor array while the second component of each X reaction mover could include a pair of spaced apart magnet arrays.

Preferably, the X reaction movers 320, 322 include a measurement device (not shown) such as an encoder that provides information regarding the position of the X reaction masses 112, 114 relative to the reaction frame 300 and the stage base 12 along the X axis.

Somewhat similarly, in the embodiment illustrated in FIGS. 11–13, each Y reaction mover 324, 326 is a commutated, linear motor. For each of the Y reaction movers 324, 326, the first component 328 is secured to the reaction frame 300, while the second component 330 is secured to the stage base 12 or preferably to the mounting base 24. More specifically, for the first Y reaction mover 324, the first component 328 is secured to the front frame side 312, and the second component 330 is secured to the front lip 302. Similarly, for the second Y reaction mover 326, the first component 328 is secured to the rear frame side 314, and the second component 330 is secured to the rear lip 304.

In this embodiment, the first component 328 of each Y reaction mover 324, 326 includes a pair of spaced apart magnet arrays (not shown) while the second component 330 of each Y reaction mover 324, 326 includes a conductor array (not shown). With this design, the Y reaction movers 324, 326 can make minor corrections to the position of the reaction frame 300 and the X reaction masses 112, 114 along the Y axis relative to the stage base 12. Alternately, for example, the first component of each Y reaction mover could include a conductor array while the second component of each Y reaction mover could include a pair of spaced apart magnet arrays.

Preferably, the Y reaction movers 324, 326 include a measurement device (not shown) such as an encoder that provides information regarding the position of the reaction frame 300 relative to the stage base 12 along the Y axis.

Figure 15:
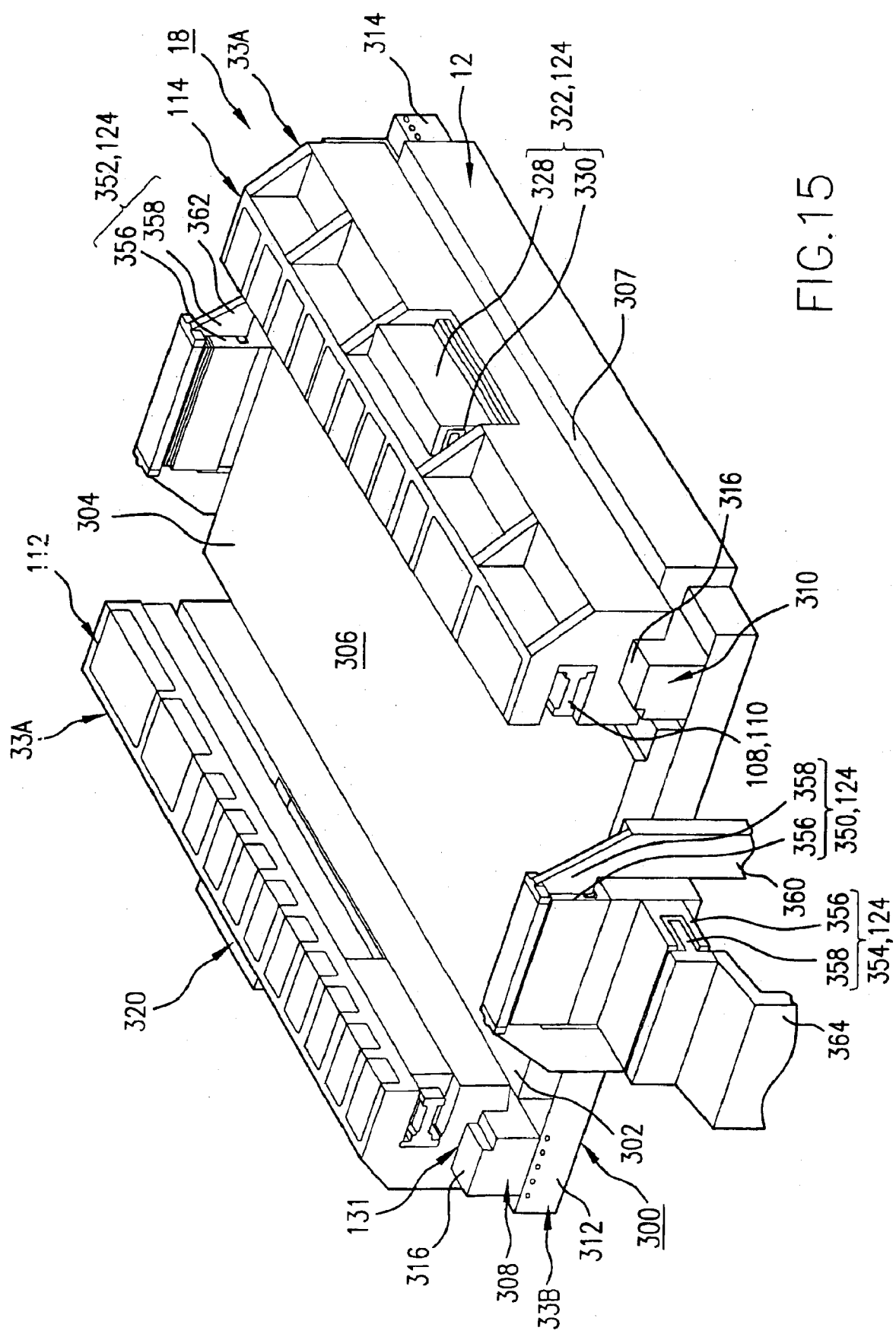
FIG. 15 is a perspective view of a reaction mass assembly illustrated in FIG. 14.
Figure 16:
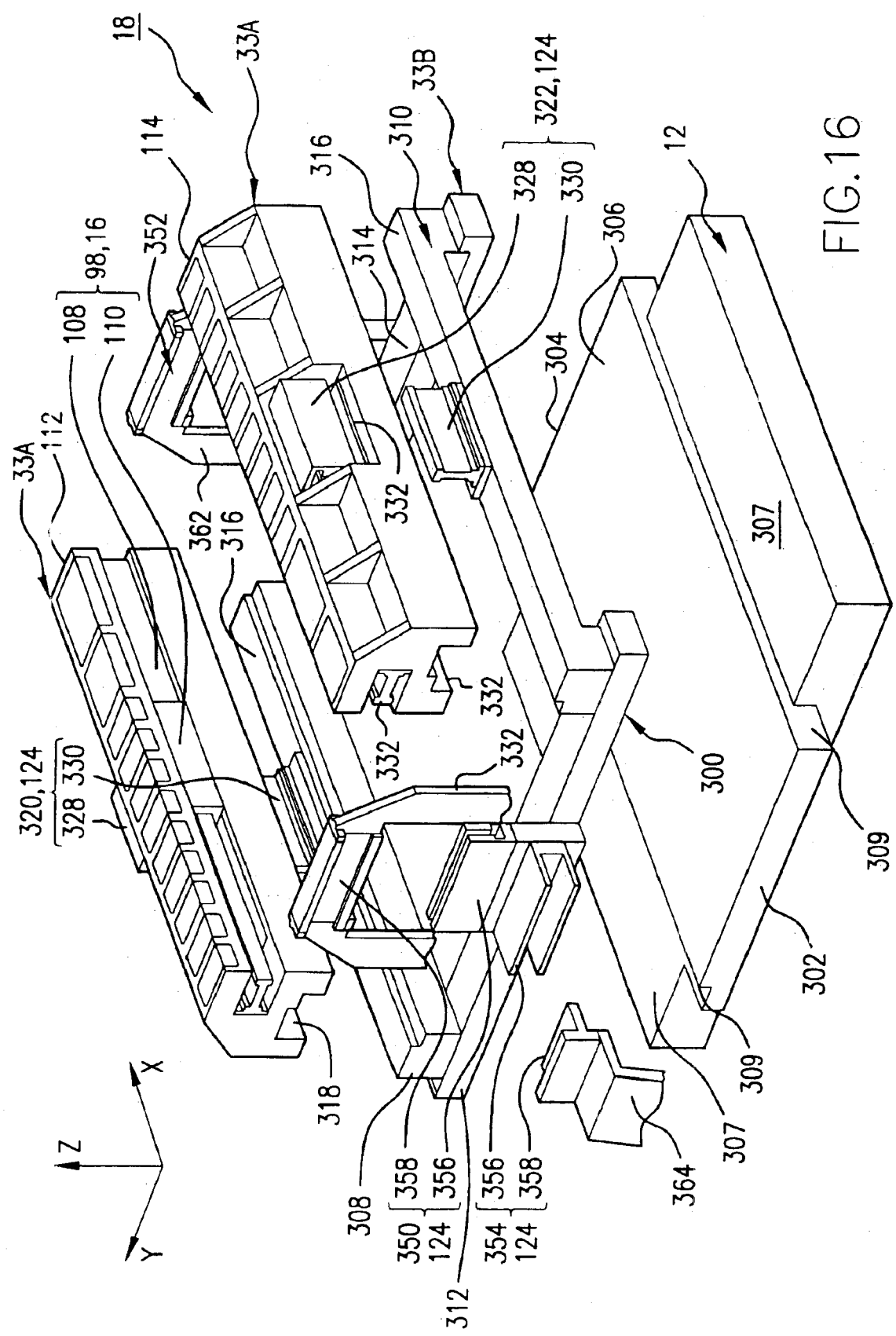
FIG. 16 is an exploded perspective view of the reaction mass assembly of FIG. 15.

FIGS. 14–16 illustrate a fourth embodiment having features of the present invention. In particular, FIG. 14 illustrates a perspective view of the stage assembly 10, FIG. 15 illustrates a perspective view of the reaction mass assembly 18, and FIG. 16 illustrates an exploded perspective view of the reaction mass assembly 18. The stage assembly 10 illustrated in FIG. 14 includes the stage base 12, a pair of stages 14, the stage mover assembly 16, the reaction mass assembly 18, and the control system 22. The measurement system is not illustrated in FIG. 14.

In the embodiment illustrated in FIG. 14, each stage 14, the stage mover assembly 16, and the control system 22 are somewhat similar to the equivalent components described above. Further, the stage base 12 and the reaction mass assembly 18 illustrated in FIGS. 14–16 are similar to the stage base 12 and reaction mass assembly 18 illustrated in FIGS. 11–13 and described above. However, in the embodiment illustrated in FIGS. 14–16, the reaction frame 300 is free to move along the X axis, along the Y axis, and about the Z axis relative to the stage base 12. More specifically, in the embodiment, the fluid bearing between the reaction frame 300 and the stage base 12 only maintains the reaction frame 300 spaced apart along the Z axis relative to the stage base 12. Stated another way, the fluid bearing allows for motion of the reaction frame 300 along the X axis, along the Y axis, and about the Z axis relative to the stage base 12.

Further, in the embodiment illustrated in FIGS. 14–16, the reaction mover assembly 124 differs from the reaction mover assembly 124 illustrated in FIGS. 11–13 and described above. In particular, in the embodiment illustrated in FIGS. 14–16, the reaction mover assembly 124 includes the X reaction movers 320, 322, a first Y reaction mover 350, a second Y reaction mover 352, and a lower X reaction mover 354 that cooperate to move the reaction mass assembly 18 relative to the stage base 12.

In this embodiment, the reaction mover assembly 124 makes minor corrections along the X axis, along the Y axis, and about the Z axis to the position of the reaction frame 300 relative to the stage base 12. Further, the reaction mover assembly 124 makes independent corrections to the position of the X reaction masses 112, 114 along the X axis relative to the reaction frame 300.

The first and second X reaction movers 320, 322 are the same as illustrated in FIGS. 11–13 and described above. Each Y reaction mover 350, 352, and the lower X reaction mover 354 includes a first component 356 and an adjacent second component 358. One of the components of each reaction mover 350, 352, 354 includes one or more magnet arrays (not shown) and the other component of each reaction mover 350, 352, 354 includes one or more conductor arrays (not shown). Electrical current (not shown) is individually supplied to each conductor array by the control system 22. For each reaction mover 350, 352, 354, the electrical current in each conductor interacts with a magnetic field (not shown) generated by one or more of the magnets in the magnet array. This causes a force (Lorentz force) between the conductors and the magnets.

In the embodiment illustrated in the FIGS. 14–16, each Y reaction mover 350, 352 is a commutated linear motor. For the first Y reaction mover 350, the first component 356 is secured to the front frame side 312 of the reaction frame 300, while the second component 358 is secured to the mounting base 24 (illustrated in FIG. 18) with a first reaction mover frame 360. Similarly, for the second Y reaction mover 352, the first component 356 is secured to the rear frame side 314 of the reaction frame 300, and the second component 358 is secured to the mounting base 24 with a second reaction mover frame 362. Only a portion of each reaction mover frame 360, 362 is illustrated in FIGS. 14–16.

In this embodiment, the first component 356 of each Y reaction mover 350, 352, includes a pair of magnet arrays (not shown) while the second component 358 of each Y reaction mover 350, 352 includes a conductor array (not shown). With this design, the Y reaction movers 350, 352 can make minor corrections to the positions of the X reaction masses 112, 114 and the reaction frame 300 along the Y axis and about the Z axis relative to the stage base 12. Alternately, for example, the first component of each Y reaction mover could include a conductor array while the second component of each Y reaction mover could include a pair of spaced apart magnet arrays.

Preferably, the Y reaction movers 350, 352 include a measurement device (not shown) such as an encoder that provides information regarding the position of the X reaction frame 300 relative to the stage base 12.

Somewhat similarly, the first component 356 and the second component 358 of the lower X reaction mover 354 interact to selectively move the reaction frame 300 along the X axis relative to the stage base 12. In the embodiment illustrated in FIGS. 14–16, the lower X reaction mover 354 is a non-commutated voice coil motor. In this embodiment, for the lower X reaction mover 354, the first component 356 is secured to the front frame side 312 of the reaction frame 300, while the second component 358 is secured to the mounting base 24 with a third reaction mover frame 364.

In this embodiment, the first component 356 of the lower X reaction mover 354 includes a pair of spaced apart magnet arrays (not shown) while the second component 358 includes a conductor array (not shown). With this design, the lower X reaction mover 354 can make minor corrections to the position of the reaction frame 300 and the X reaction masses 112, 114 along the X axis relative to the stage base 12. Alternately, for example, the first component of the lower X reaction mover could include a conductor array while the second component of each Y reaction mover could include a pair of spaced apart magnet arrays.

Preferably, the lower X reaction mover 354 includes a measurement device (not shown) such as an encoder that provides information regarding the position of the reaction frame 300 relative to the stage base 12 along the X axis.

Although it is not presently preferred, the second component 358 of the first Y reaction mover 350, the second Y reaction mover 352 and lower X reaction mover 354 could be attached to the stage base 12.

As discussed above, the control system 22 directs and controls current to the reaction mover assembly 124 to control the position of the reaction mass assembly 18 relative to the stage base 12. Preferably, the control system 22 controls current to the reaction mover assembly 124 to prevent the X reaction masses 112, 114 from achieving a constant velocity, and to keep the stroke of the reaction movers relatively short. Stated another way, the control system 22 controls current to the reaction mover assembly 124 to: (i) correct external disturbances that can influence the position of the reaction mass assembly 18, (ii) to prevent the X reaction masses 112, 114 from drifting off of the stage base 12, (iii) to prevent unwanted motion of the assembly's center of gravity 182, (iv) to prevent the exposure apparatus 30 from moving, and (v) to correct any torque that is transferred to the reaction mass assembly 18.

Basically, the control system 22 controls current to the reaction mover assembly 124 to ensure that the X reaction masses 112, 114 and the rest of the reaction mass assembly 18 are properly positioned and/or centered relative to the stage base 12.

The control system 22 can control and direct current to the reaction mover assembly 124 at any time during the operation of the stage assembly 10 to correct the position of the X reaction masses 112, 114 and the rest of the reaction mass assembly 18. As provided herein, the control system 22 and the reaction mover assembly 124 can continuously servo the reaction mass assembly 18 so that the reaction mass assembly 18 is centered on the stage base 12.

Preferably, the control system 22 controls and directs current to the reaction mover assembly 124 in a way that minimizes the disturbances created by the reaction mover assembly 124 on the stage assembly 10 and the exposure apparatus 30. More specifically, the timing and/or the amount of current from the control system 22 directed to the reaction mover assembly 124 can be varied to minimize the influence of the disturbances created by the reaction mover assembly 124 on the stage assembly 10. Further, the timing and/or the amount of current can be varied according to the use of the stage assembly.

In a first embodiment, for an exposure apparatus 30, the control system 22 can control and direct current to the reaction mover assembly 124 so that the reaction movers only move and correct the position of the reaction mass assembly 18 at selected times. For example, the reaction movers can be activated between exposures of the exposure apparatus 30 and deactivated during an exposure. Stated another way, for the exposure apparatus 30, the control system 22 can be designed to direct current to the reaction mover assembly 124 only when an illumination system 504 (illustrated in FIG. 18) is not directing a beam of light energy at the reticle 32.

In this embodiment, the control system 22 can direct current to the reaction mover assembly 124 between each chip (not shown) on the semiconductor wafer 28, between each row of chips on the semiconductor wafer 28, between every scan of the semiconductor wafer 28, or between each semiconductor wafer 28 processed by the exposure apparatus 30. Stated another way, the reaction mover assembly 124 can be activated to move the reaction mass assembly 18 between each chip (not shown) on the semiconductor wafer 28, between each row of chips on the semiconductor wafer 28, between every scan of the semiconductor wafer 28, or between each semiconductor wafer 28 processed by the exposure apparatus 30.

Because the reaction mover assembly 124 is not activated during an exposure, the disturbances created by the reaction mover assembly 124 on the stage assembly 10 during exposure are minimized.

In another embodiment of the control system 22, the rate of movement of the reaction movers is varied according to the operation of the stage assembly 10. For example, for an exposure apparatus 30, the control system 22 can control and direct current to the reaction mover assembly 124 at a different rate during an exposure than between exposures of the exposure apparatus 30. For example, during an exposure, the control system 22 can direct current to the reaction mover assembly 124 so that the forces generated by the reaction mover assembly 124 are relatively small and the gain is low. Alternately, between exposures, the control system 22 can direct current to the reaction mover assembly 124 so that the forces generated by the reaction mover assembly 124 are relatively large and the gain is high.

Stated another way, for the exposure apparatus 30, the control system 22 can be designed to direct a relatively large current to the reaction mover assembly 124 only when an illumination system 504 (illustrated in FIG. 18) is not directing a beam of light energy at the reticle 32.

As provided herein, the control system 22 can direct a relatively large current to the reaction mover assembly 124 between each chip (not shown) on the semiconductor wafer 28, between each row of chips on the semiconductor wafer 28, between every scan of the wafer 28, or between each semiconductor wafer 28 processed by the exposure apparatus 30. With this design, the control system 22 changes the closed loop bandwidth between exposures. Stated another way, the reaction mover assembly 124 can make relatively large adjustments to the position of the reaction mass assembly 18 between each chip (not shown) on the wafer 28, between each row of chips on the semiconductor wafer 28, between every scan of the semiconductor wafer 28, or between each semiconductor wafer 28 processed by the exposure apparatus 30. Alternately, the reaction mover assembly 124 makes relatively small adjustments to the position on the reaction mass assembly 18 during an exposure.

Because the reaction mover assembly 124 makes relatively small adjustments to the position on the reaction mass assembly 18 during an exposure, the disturbances created by the reaction mover assembly 124 on the stage assembly 10 during exposure are minimized.

Figure 17A:
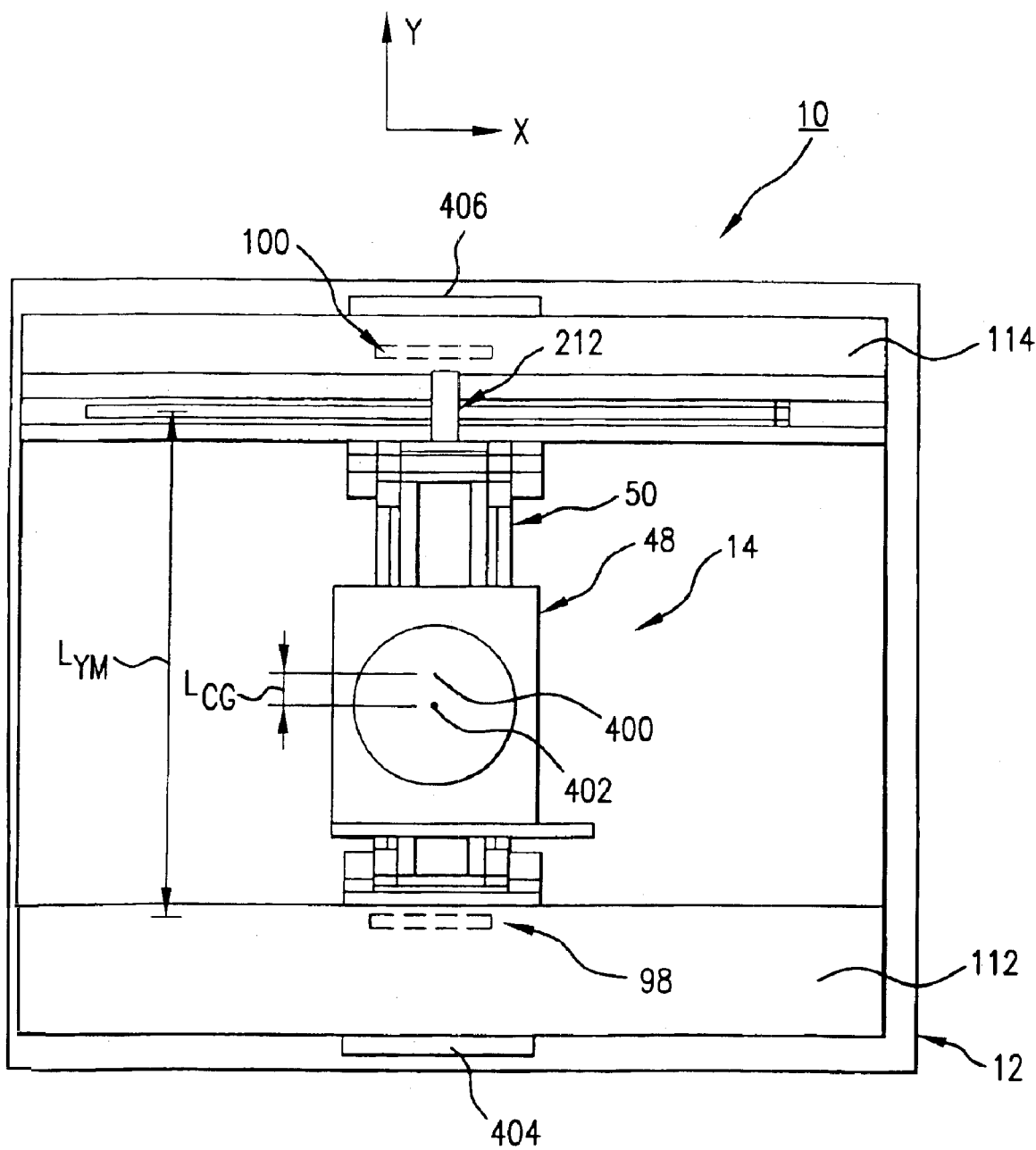
FIG. 17A is a simplified schematic top view of a portion of a stage assembly.

FIG. 17A illustrates a simplified schematic top view of a portion of a stage assembly 10 having a single stage 14 to facilitate a discussion of the control system 22. In particular, FIG. 17A illustrates the stage assembly 10 with one device table 48 positioned approximately half-way between the X reaction masses 112, 114 along the Y axis. In FIG. 17A, the device table 48 is positioned near the center of gravity 400 of the stage assembly 10.

The following symbols are used in conjunction with FIG. 17A and the discussion provided below to describe the movement of the reaction mass assembly 18:

$L_{YM}$ represents the distance along the Y axis between the center of the first X stage mover 98 and the second X stage mover 100.

$L_{CG}$ represents the distance along the Y axis between a stage assembly center of gravity 400 and a stage center of gravity 402.

$P_{M1}$ represents the momentum of the first X reaction mass 112 along the X axis.

$P_{M2}$ represents the momentum of the second X reaction mass 114 along the X axis.

$F_{S1}$ represents the force generated by the first X stage mover 98 (illustrated in phantom in FIG. 17A).

$F_{S2}$ represents the force generated by the second X stage mover 100.

$F_{r1}$ represents the force generated by the first X reaction mover 404.

$F_{r2}$ represents the force generated by the second X reaction mover 406.

The two equations that define the X stage mover 98, 100 force balance are $F_{S1}+F_{S2}=F_x$      Force equation $F_{S1}(L_{YM}/2+L_{CG})-F_{S2}(L_{YM}/2-L_{CG})=0$      Moment equation Solving these two equations leads to $F_{S1}=F_x/2-[F_xL_{CG}]/[L_{YM}] \quad F_{S2}=F_x/2+[F_xL_{CG}]/[L_{YM}]$ For each X reaction mass 112, 114, the total momentum (mxv) is equal to the time integral of the forces acting on it. Each X reaction mass 112, 114 has a reaction force generated by one of the X stage movers 98, 100 and a corrective force generated by one of the X reaction movers 404, 406.

$P_1 = m_1 V_1 = \int (F_{S1}+F_{r1})dt$

It is assumed that the first X reaction mover 404 and the second X reaction mover 406 are driven in opposite directions with the same amplitude.

$F_{r1}=F_{r2}=F_t$

A similar equation applies to the second X reaction mass 114. Substituting the previous result into these equations leads to:

$P_1 = \int (F_x/2)dt - 1/2L_{ym}(\int F_x L_{CG} dt) + \int F_{r1} dt$ $P_2 = \int (F_x/2)dt + 1/2L_{ym}(\int F_x L_{CG} dt) + \int F_{r2} dt$ These equations show that the momentum of each X reaction mass 112, 114 is one-half the stage 14 momentum, plus a term that depends on the time history of $F_x$ and $L_{CG}$, and the time integral of the reaction mover 404, 406 force. To ensure that the X reaction masses 112, 114 are not left with a constant velocity when the stage 14 returns to zero velocity, the second and third terms must cancel. This leads to the following equation:

$\int F_t dt = 1/(2Lym) \int F_x L_{CG} dt$      (equation 1)

One easy solution to this integral equation is to let $F_t = F_x L_{CG}/(2Lym)$

But this transmits the high frequency components of $F_x$ through the reaction movers 404, 406. Ideally, the $F_t$ would only have low frequency components.

Figure 17B:
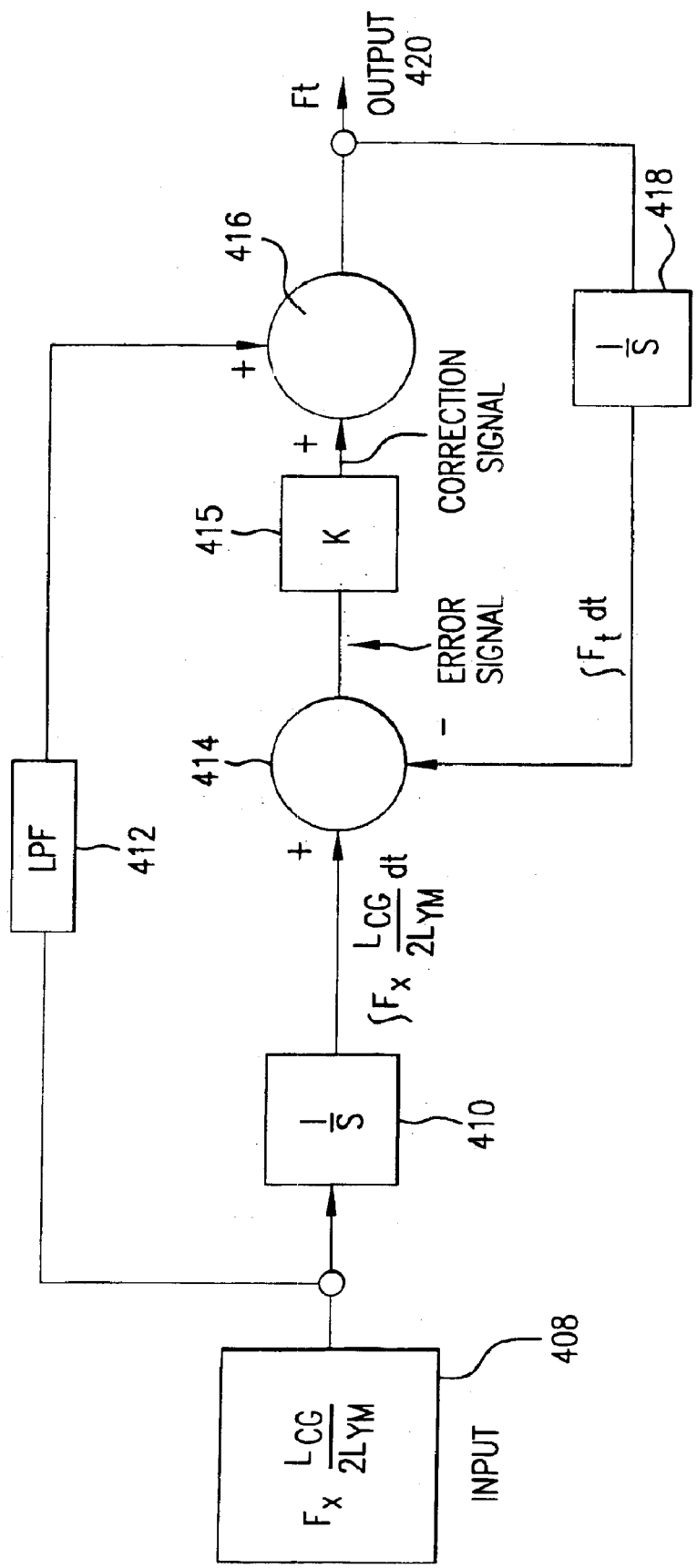
FIG. 17B is a simplified block diagram that illustrates the operation of a control system having features of the present invention.

FIG. 17B is a schematic that describes a method for reducing the frequency content of $F_t$. An input 408 is equal to $F_x(L_{CG}/2Lym)$. The low frequency components of this input signal pass through low pass filter 412 to summing junction 416. The output of summing junction 416 is the reaction force $F_t$. The input signal 408 also goes to integrator 410, which calculates the time integral $\int F_x(L_{CG}/2Lym)dt$.

A second integrator 418 integrates the output signal 420, and produces the time integral $\int F_t dt$. A differencing junction 414 calculates an error signal which is the difference between the outputs of integrator 410 and second integrator 418. Compensator 415 performs a calculation (such as multiplying by a gain K) on the error signal to produce a correction signal that is added to the output of low pass filter 412 in summing junction 416 to produce the output signal 420. By adjusting the cutoff frequency of the low pass filter 412 and the compensation calculation 415, the frequency content of output 420 can be limited to any desired value. The feedback loop through integrator 418 and differencing junction 414 ensures that over time, the two integrals are equal and equation 1 is satisfied.

FIG. 18 is a schematic view illustrating an exposure apparatus 30 useful with the present invention. The exposure apparatus 30 includes the apparatus frame 46, the ground frame 164, an illumination system 504 (irradiation apparatus), a reticle stage assembly 506, a lens assembly 508, and a wafer stage assembly 510. The stage assemblies 10 provided herein can be used as the wafer stage assembly 510. Alternately, with the disclosure provided herein, the stage assembly 10 provided herein can be modified for use as the reticle stage assembly 506.

The exposure apparatus 30 is particularly useful as a lithographic device that transfers a pattern (not shown) of an integrated circuit from the reticle 32 onto the semiconductor wafer 28. The exposure apparatus 30 mounts to the mounting base 24, e.g., the ground, a base, or floor or some other supporting structure.

The apparatus frame 46 is rigid and supports the components of the exposure apparatus 30. The design of the apparatus frame 46 can be varied to suit the design requirements for the rest of the exposure apparatus 30. The apparatus frame 46 illustrated in FIG. 18 supports the lens assembly 508 and the illumination system 504 and the reticle stage assembly 506 above the mounting base 24.

The illumination system 504 includes an illumination source 512 and an illumination optical assembly 514. The illumination source 512 emits a beam (irradiation) of light energy. The illumination optical assembly 514 guides the beam of light energy from the illumination source 512 to the lens assembly 508. The beam illuminates selectively different portions of the reticle 32 and exposes the semiconductor wafer 28. In FIG. 18, the illumination source 512 is illustrated as being supported above the reticle stage assembly

506. Typically, however, the illumination source 512 is secured to one of the sides of the apparatus frame 46 and the energy beam from the illumination source 512 is directed to above the reticle stage assembly 506 with the illumination optical assembly 514.

The lens assembly 508 projects and/or focuses the light passing through the reticle to the wafer. Depending upon the design of the exposure apparatus 30, the lens assembly 508 can magnify or reduce the image illuminated on the reticle 32.

The reticle stage assembly 506 holds and positions the reticle relative to the lens assembly 508 and the wafer. Similarly, the wafer stage assembly 510 holds and positions the wafer with respect to the projected image of the illuminated portions of the reticle 32. In FIG. 18, the wafer stage assembly 510 utilizes a stage assembly 10 having features of the present invention. Depending upon the design, the exposure apparatus 30 can also include additional motors to move the stage assemblies 506, 510.

There are a number of different types of lithographic devices. For example, the exposure apparatus 30 can be used as scanning type photolithography system that exposes the pattern from the reticle 32 onto the wafer 28 with the reticle 32 and the wafer 28 moving synchronously. In a scanning type lithographic device, the reticle 32 is moved perpendicular to an optical axis of the lens assembly 508 by the reticle 32 stage assembly 506 and the wafer 28 is moved perpendicular to an optical axis of the lens assembly 508 by the wafer 28 stage assembly 510. Scanning of the reticle 32 and the wafer 28 occurs while the reticle and the wafer 28 are moving synchronously.

Alternately, the exposure apparatus 30 can be a step-and-repeat type photolithography system that exposes the reticle 32 while the reticle 32 and the wafer 28 are stationary. In the step and repeat process, the wafer 28 is in a constant position relative to the reticle 32 and the lens assembly 508 during the exposure of an individual field. Subsequently, between consecutive exposure steps, the wafer 28 is consecutively moved by the wafer stage assembly 510 perpendicular to the optical axis of the lens assembly 508 so that the next field of the wafer 28 is brought into position relative to the lens assembly 508 and the reticle 32 for exposure. Following this process, the images on the reticle 32 are sequentially exposed onto the fields of the wafer 28 so that the next field of the wafer 28 is brought into position relative to the lens assembly 508 and the reticle 32.

However, the use of the exposure apparatus 30 provided herein is not limited to a photolithography system for semiconductor manufacturing. The exposure apparatus 30, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern by closely locating a mask and a substrate without the use of a lens assembly. Additionally, the present invention provided herein can be used in other devices, including other semiconductor processing equipment, machine tools, metal cutting machines, and inspection machines.

The illumination source 512 can be g-line (436 nm), i-line (365 nm), KrF excimer laser (248 nm), ArF excimer laser (193 nm) and $F_2$ laser (157 nm). Alternately, the illumination source 512 can also use charged particle beams such as an x-ray and electron beam. For instance, in the case where an electron beam is used, thermionic emission type lanthanum hexaboride ($LaB_6$) or tantalum (Ta) can be used as an electron gun. Furthermore, in the case where an electron beam is used, the structure could be such that either a mask is used or a pattern can be directly formed on a substrate without the use of a mask.

In terms of the magnification of the lens assembly 508 included in the photolithography system, the lens assembly 508 need not be limited to a reduction system. It could also be a 1× or magnification system.

With respect to a lens assembly 508, when far ultra-violet rays such as the excimer laser is used, glass materials such as quartz and fluorite that transmit far ultra-violet rays is preferable to be used. When the $F_2$ type laser or x-ray is used, the lens assembly 508 should preferably be either catadioptric or refractive (a reticle should also preferably be a reflective type), and when an electron beam is used, electron optics should preferably consist of electron lenses and deflectors. The optical path for the electron beams should be in a vacuum.

Also, with an exposure device that employs vacuum ultra-violet radiation (VUV) of wavelength 200 nm or lower, use of the catadioptric type optical system can be considered. Examples of the catadioptric type of optical system include the disclosure Japan Patent Application Disclosure No.8-171054 published in the Official Gazette for Laid-Open Patent Applications and its counterpart U.S. Pat. No. 5,668,672, as well as Japan Patent Application Disclosure No.10-20195 and its counterpart U.S. Pat. No. 5,835,275. In these cases, the reflecting optical device can be a catadioptric optical system incorporating a beam splitter and concave mirror. Japan Patent Application Disclosure No.8-334695 published in the Official Gazette for Laid-Open Patent Applications and its counterpart U.S. Pat. No. 5,689,377 as well as Japan Patent Application Disclosure No.10-3039 and its counterpart U.S. patent application Ser. No. 873,605 (Application Date: Jun. 12, 1997) also use a reflecting-refracting type of optical system incorporating a concave mirror, etc., but without a beam splitter, and can also be employed with this invention. As far as is permitted, the disclosures in the above-mentioned U.S. patents, as well as the Japan patent applications published in the Official Gazette for Laid-Open Patent Applications are incorporated herein by reference.

Further, in photolithography systems, when linear motors (see U.S. Pat. Nos. 5,623,853 or 5,528,118) are used in a wafer stage or a mask stage, the linear motors can be either an air levitation type employing air bearings or a magnetic levitation type using Lorentz force or reactance force. Additionally, the stage could move along a guide, or it could be a guideless type stage that uses no guide. As far as is permitted, the disclosures in U.S. Pat. Nos. 5,623,853 and 5,528,118 are incorporated herein by reference.

Alternatively, one of the stages could be driven by a planar motor, which drives the stage by an electromagnetic force generated by a magnet unit having two-dimensionally arranged magnets and an armature coil unit having two-dimensionally arranged coils in facing positions. With this type of driving system, either the magnet unit or the armature coil unit is connected to the stage and the other unit is mounted on the moving plane side of the stage.

Movement of the stages as described above generates reaction forces that can affect performance of the photolithography system. Reaction forces generated by the wafer (substrate) stage motion can be mechanically released to the floor (ground) by use of a frame member as described in U.S. Pat. No. 5,528,118 and published Japanese Patent Application Disclosure No. 8-166475. Additionally, reaction forces generated by the reticle (mask) stage motion can be mechanically released to the floor (ground) by use of a frame member as described in U.S. Pat. No. 5,874,820 and published Japanese Patent Application Disclosure No. 8-330224. As far as is permitted, the disclosures in U.S. Pat. No. Nos. 5,528,118 and 5,874,820 and Japanese Patent Application Disclosure No. 8-330224 are incorporated herein by reference.

As described above, a photolithography system according to the above described embodiments can be built by assembling various subsystems, including each element listed in the appended claims, in such a manner that prescribed mechanical accuracy, electrical accuracy, and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, a total adjustment is performed to make sure that accuracy is maintained in the complete photolithography system. Additionally, it is desirable to manufacture an exposure system in a clean room where the temperature and cleanliness are controlled.

Figure 19:
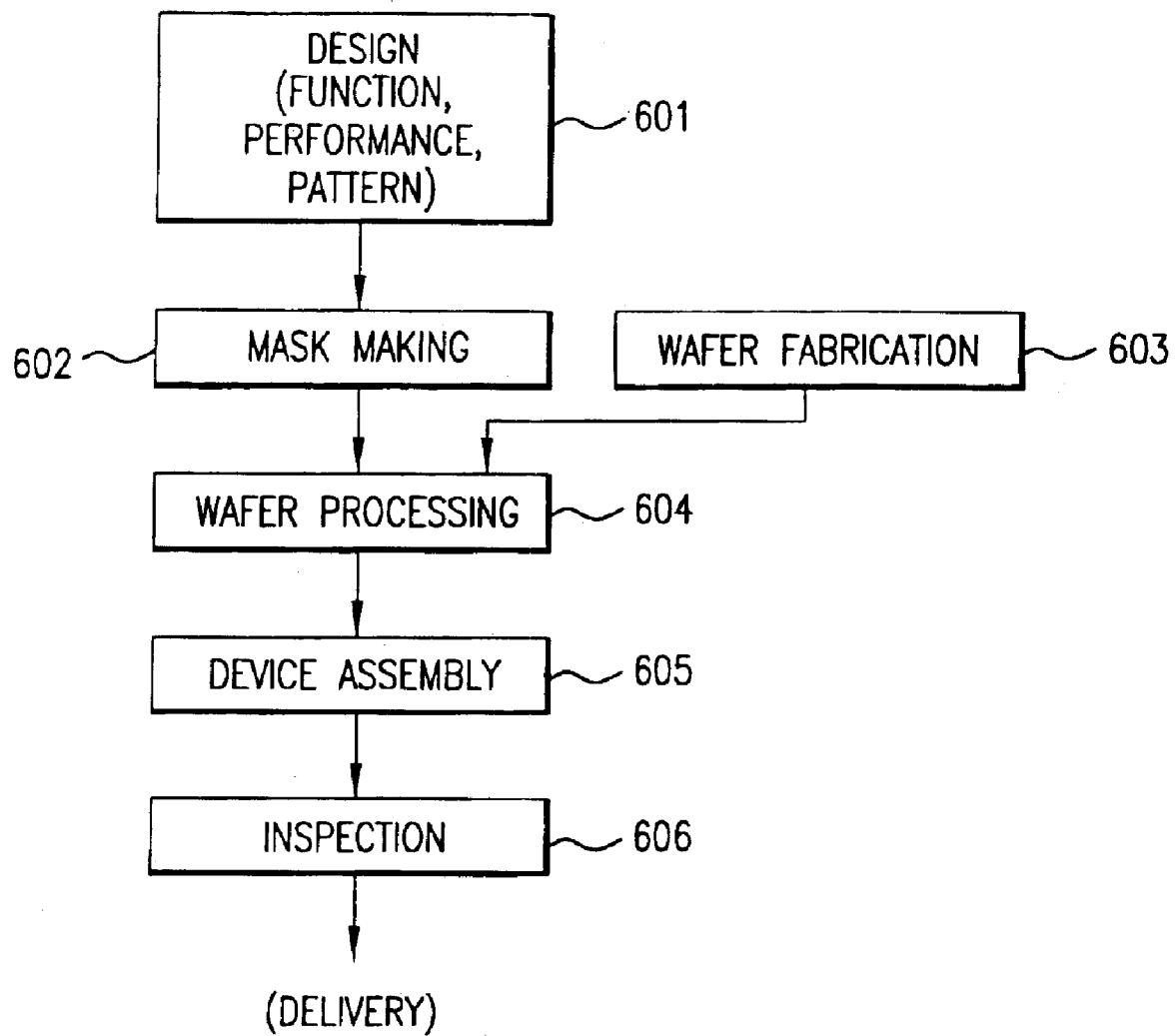
FIG. 19 is a flow chart that outlines a process for manufacturing a device in accordance with the present invention.

Further, semiconductor devices can be fabricated using the above described systems, by the process shown generally in FIG. 19. In step 601 the device's function and performance characteristics are designed. Next, in step 602, a mask (reticle) having a pattern is designed according to the previous designing step, and in a parallel step 603 a wafer is made from a silicon material. The mask pattern designed in step 602 is exposed onto the wafer from step 603 in step 604 by a photolithography system described hereinabove in accordance with the present invention. In step 605 the semiconductor device is assembled (including the dicing process, bonding process and packaging process), finally, the device is then inspected in step 606.

Figure 20:
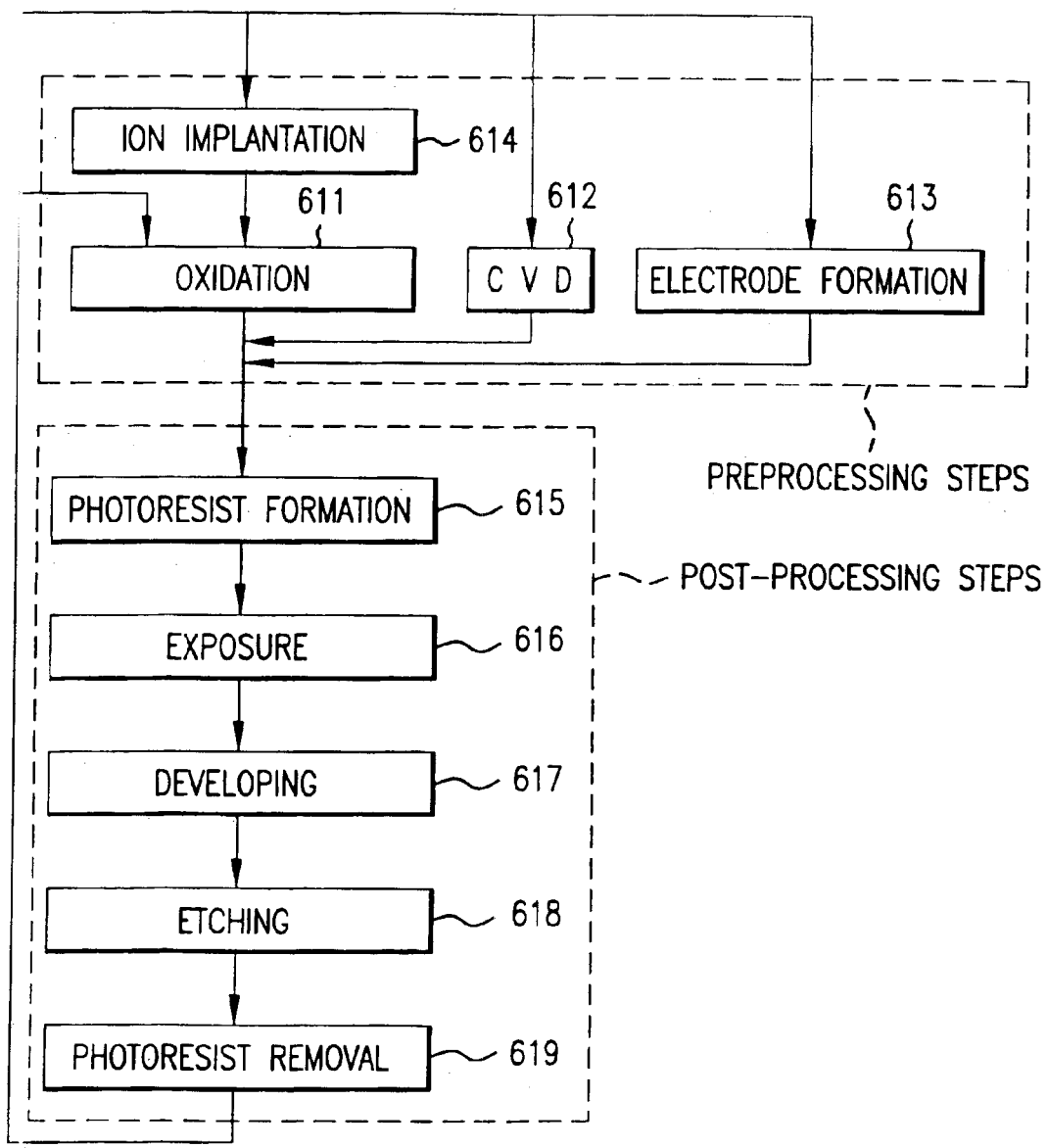
FIG. 20 is a flow chart that outlines device processing in more detail.

FIG. 20 illustrates a detailed flowchart example of the above-mentioned step 604 in the case of fabricating semiconductor devices. In FIG. 20, in step 611 (oxidation step), the wafer surface is oxidized. In step 612 (CVD step), an insulation film is formed on the wafer surface. In step 613 (electrode formation step), electrodes are formed on the wafer by vapor deposition. In step 614 (ion implantation step), ions are implanted in the wafer. The above mentioned steps 611–614 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 615 (photoresist formation step), photoresist is applied to a wafer. Next, in step 616 (exposure step), the above-mentioned exposure device is used to transfer the circuit pattern of a mask (reticle) to a wafer. Then in step 617 (developing step), the exposed wafer is developed, and in step 618 (etching step), parts other than residual photoresist (exposed material surface) are removed by etching. In step 619 (photoresist removal step), unnecessary photoresist remaining after etching is removed.

Multiple circuit patterns are formed by repetition of these preprocessing and post-processing steps.

A further embodiment of the invention will be described below with reference to FIGS. 21 to 28.

Figure 21:
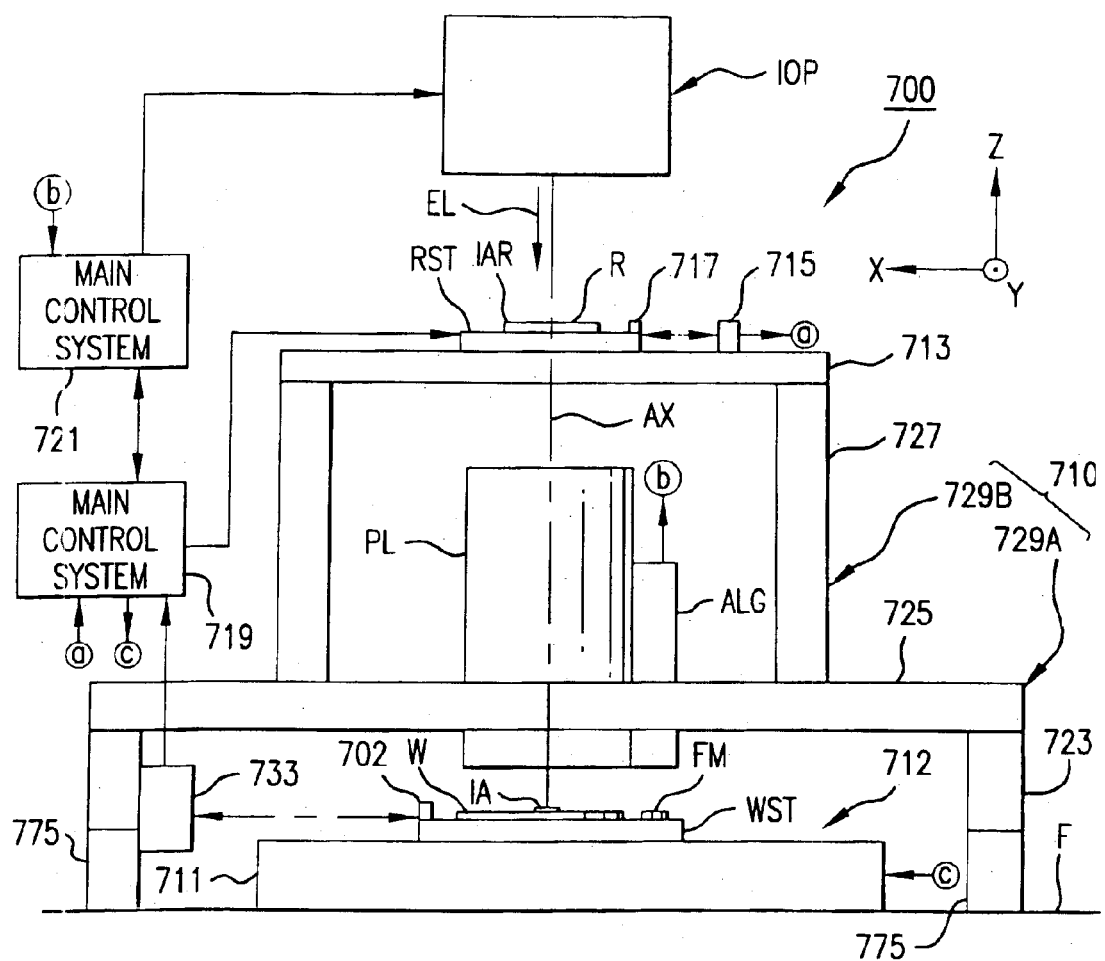
FIG. 21 is a schematic view showing the configuration of an exposure apparatus according to an embodiment of the invention.

FIG. 21 shows the general configuration of an exposure apparatus 700 according to an embodiment of the present invention. The exposure apparatus 700 is a scan-exposure apparatus of a step-and-scan type, that is, a so-called scanning stepper. As will be described later, the exposure apparatus 700 of this embodiment includes a projection optical system PL. In the following description: (a) the direction of the optical axis AX of the projection optical system PL is designated a Z-axis direction; (b) the direction in which a reticle R serving as a mask, and a wafer W serving as a substrate, are relatively scanned in a plane orthogonal to the Z-axis direction is designated a Y-axis direction; and (c) the direction orthogonal to the Z-axis and Y-axis directions is designated an X-axis direction. Additionally, the reticle and the wafer are generically referred to as "object".

The exposure apparatus 700 includes an illumination system IOP, a reticle stage RST serving as a mask stage for holding a reticle R, the projection optical system PL, a wafer stage assembly 712 composed of a wafer stage WST serving as a substrate stage for holding a wafer W and a wafer driving unit 711 for two-dimensionally driving the wafer stage WST in the X and Y directions, a control system for the devices, and the like.

As disclosed in, for example, Japanese Laid-Open Patent Application Publication Nos. 9-320956 and 4-196513 and U.S. Pat. No. 5,473,410 corresponding thereto, the illumination system IOP includes a light-source unit, a shutter, a secondary light-source forming optical system (optical integrator), a beam splitter, a light-collecting lens system, a reticle blind, an imaging lens system, and the like (all not shown). The IOP emits illumination light EL for exposure (hereinafter simply referred to "exposure light") serving as an exposure beam having a substantially uniform illumination distribution. The exposure light EL illuminates a rectangular (or arcuate) illumination area IAR on a reticle R at uniform illuminance. Used as the exposure light EL is, for example, ultraviolet bright lines (g-rays and i-rays) from an extra-high pressure mercury lamp, or far-ultraviolet or vacuum ultraviolet light such as KrF excimer laser light (with a wavelength of 248 nm), ArF excimer laser light (with a wavelength of 193 nm), and $F_2$ laser light (with a wavelength of 157 nm).

The reticle stage RST is placed on a top plate 713 of a second column 729B constituting a main column 710, which will be described later. The top plate 713 also functions as a reticle base. Hereinafter, the top plate 713 will also be referred to as a "reticle base 713".

A reticle R is fixed on the reticle stage RST by, for example, vacuum suction. In order to position the reticle R, the reticle stage RST is capable of two-dimensional micromotion (in the X-axis direction, the Y-axis direction orthogonal thereto, and the direction of rotation about the Z-axis direction orthogonal to the XY plane) in a plane perpendicular to the Z-axis.

The reticle stage RST can also be moved on the reticle base 713 at a designated scanning speed in a predetermined scanning direction (in the Y-axis direction in this embodiment) by a reticle driving section (not shown) serving as a driving device having a linear motor and the like. The stroke of the reticle stage RST is set so that the entire surface of the reticle R can cross at least the optical axis of the illumination system IOP.

A movable mirror 17 is fixed on the reticle stage RST so as to reflect a laser beam from a reticle laser interferometer (hereinafter referred to as a "reticle interferometer") 715.

The position of the reticle stage RST in a stage moving plane is constantly detected by the reticle interferometer 715 with a resolution of, for example, approximately 0.5 nm to 1 nm. In reality, and as is known in the art, a movable mirror having a reflecting surface orthogonal to the scanning direction (Y-axis direction) and a movable mirror having a reflecting surface orthogonal to the non-scanning direction (X-axis direction) are disposed on the reticle stage RST, and one reticle interferometer is disposed in the scanning direction and two reticle interferometers are disposed in the non-scanning direction. In FIG. 21, the mirrors are represented by the movable mirror 717 and the interferometers are represented by the reticle interferometer 715.

Positional information (or speed information) about the reticle stage RST from the reticle interferometer 15 is sent to a main control system 721 via a stage control system 719. The stage control system 719 drives the reticle stage RST via the reticle driving section (not shown) based on the positional information about the reticle stage RST according to directions from the main control system 21.

A pair of reticle alignment systems (not shown) is placed above the reticle R. The reticle alignment systems each include an epi-illumination system for illuminating a mark to be detected with illumination light having the same wavelength as that of the exposure light EL, and a reticle alignment microscope for picking up an image of the mark to be detected. The reticle alignment microscope includes an imaging optical system and an image pickup device. The result of image pickup by the reticle alignment microscope is supplied to the main control system 721.

The above-described main column 710 includes a first column 729A placed on a floor F of a clean room via a plurality of vibration-isolating units 775, and the second column 729B placed on the first column 729A.

The first column 729A is composed of a plurality of column supports 723 placed in line at the tops of the respective vibration-isolating units 775, and a barrel surface plate 725 horizontally supported by the column supports 723. In this case, microvibrations to be transmitted from the floor F to the main column 710 including the barrel surface plate 725 are isolated by the vibration-isolating units 775 on the microgravity level.

The second column 729B is composed of a plurality of leg portions 727 embedded in the upper surface of the first column 729A, and the above-described top plate (reticle base) 713 horizontally supported by the leg portions 727.

The projection optical system PL is inserted from above through an opening (not shown) formed in the center of the barrel surface plate 725, and is supported by the barrel surface plate 725 via a flange (not shown) formed at about the center of a barrel thereof in the height direction. In this embodiment, the projection optical system PL is a refracting optical system that is formed of a double-sided telecentric reduction system composed of a plurality of lens elements arranged at predetermined intervals along the optical-axis direction AX (the Z-axis direction). The projection optical system PL may be a reduction system that is one-sided telecentric (for example, telecentric only on the side of the wafer stage WST). The projection magnification of the projection optical system PL is set at, for example, ¼, ⅕, or ⅙. For this reason, when the illumination area IAR on the reticle R is illuminated with illumination light from the illumination optical system IOP, a reduced image (partial inverted image) of a circuit pattern in the illumination area IAR of the reticle R is formed on an exposure area IA of a wafer W having a photoresist applied on its surface, which is conjugate with the illumination area IAR, via the projection optical system PL by the illumination light passed through the reticle R.

Adjacent to the projection optical system PL, an off-axis alignment microscope ALG is placed. The alignment microscope ALG includes three types of alignment sensors, an LSA (Laser Step Alignment) type, an FIA (Field Image Alignment) type, and an LIA (Laser Interferometric Alignment) type, and can measure the positions in the X and Y two-dimensional directions of a fiducial mark on a fiducial mark plate and an alignment mark on the wafer.

In this embodiment, the three types of alignment sensors are used depending on the operation, such as so-called search alignment for detecting the positions of a predetermined number of search alignment marks on the wafer W so as to measure the general position of the wafer W, and fine alignment for detecting the positions of a predetermined number of fine alignment marks on the wafer W so as to exactly measure the positions of shot areas.

Digitized wave signals, which are obtained by converting information from the alignment sensors constituting the alignment microscope ALG from analog to digital by an alignment control device (not shown), are subjected to computation, and the mark positions are thereby detected. The detection result is transmitted to the main control system 721.

The exposure apparatus 700 of this embodiment further includes a multipoint focal position detecting system serving as one of oblique-incidence type focus detecting systems for detecting the positions of the exposure area IA and the adjacent area in the Z-axis direction (the optical axis direction AX) on the wafer W. The multipoint focal position detecting system is composed of a light-emitting optical system and a light-receiving optical system that are not shown, and has a structure similar to that disclosed in, for example, Japanese Laid-Open Patent Application Publication No. 6-283403 and U.S. Pat. No. 5,448,332 corresponding thereto.

The above-described wafer stage assembly 712 is placed below the projection optical system PL. The wafer stage assembly 712 is composed of the wafer stage WST for holding a wafer W and the wafer driving unit 711 serving as a driving device.

A wafer W is fixed on the upper surface of the wafer stage WST via a wafer holder (not shown) by electrostatic suction or vacuum suction. A fiducial mark plate FM is also fixed on the wafer stage WST. The fiducial mark plate FM has various fiducial marks for base line measurement for measuring the distance from the center of detection of the alignment microscope ALG to the optical axis of the projection optical system PL.

Figure 22:
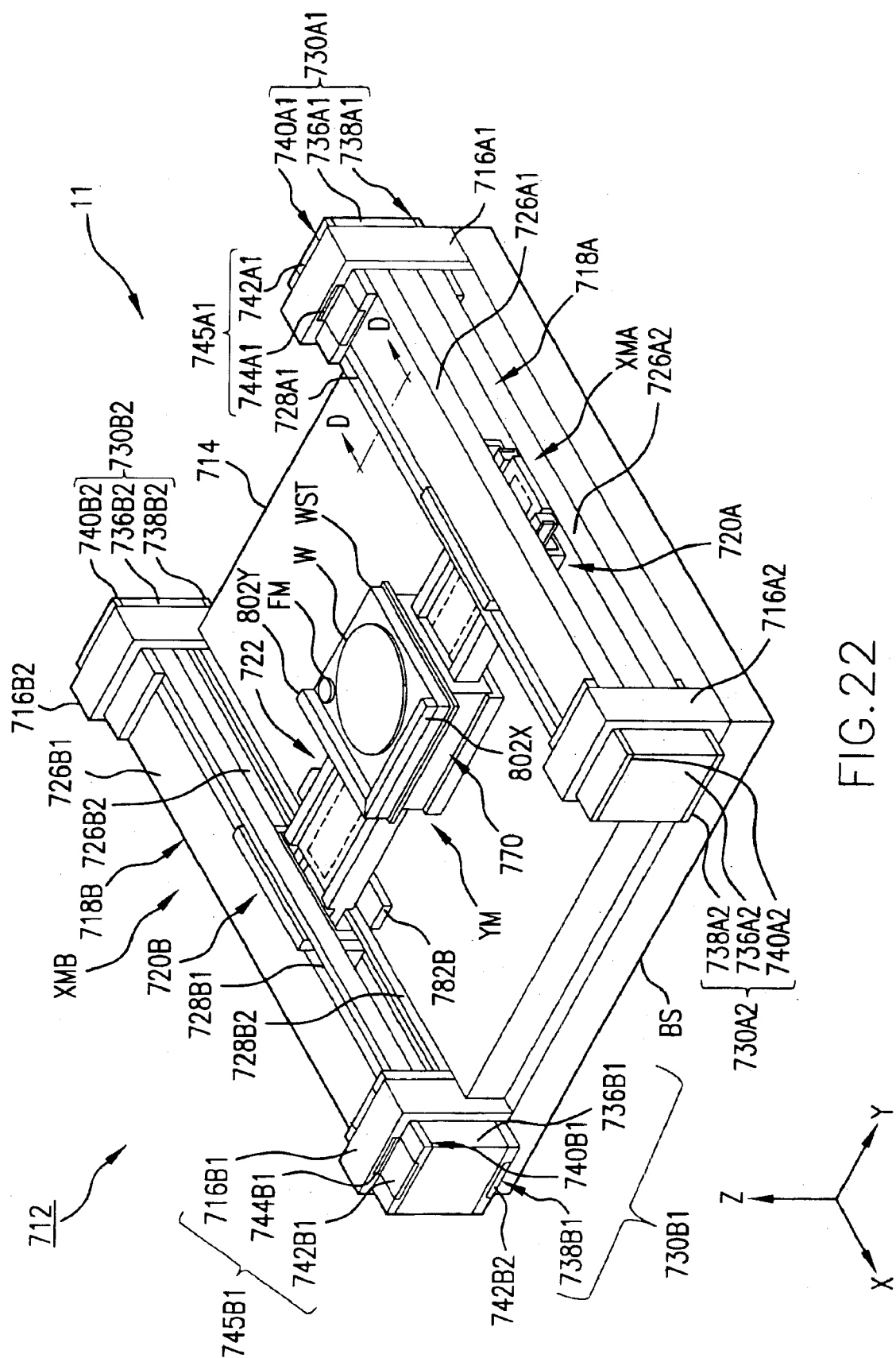
FIG. 22 is a perspective view of a wafer stage assembly shown in FIG. 21.

On the upper surface of the wafer stage WST, as shown in FIG. 22, an X movable mirror 802X is disposed at one end in the X-axis direction (a +X-side end), and extends in the Y-axis direction, and a Y movable mirror 802Y is disposed at one end in the Y-axis direction (a −Y-side end), and extends in the X-axis direction. The outer surfaces of the movable mirrors 802X and 802Y are mirror-finished reflecting surfaces. In FIG. 21, the movable mirrors 802X and 802Y are represented by a movable mirror 802.

An X-axis interferometer and a Y-axis interferometer (not shown) are placed opposed to the reflecting surfaces of the movable mirrors 802X and 802Y. Interferometric beams from the X-axis and Y-axis interferometers are projected onto the reflecting surfaces of the movable mirrors 802X and 802Y, and the reflected beams from the reflecting surfaces are received by the respective interferometers. The amounts of displacement of the reflecting surfaces of the movable mirrors from the reference positions are thereby measured, so that the two-dimensional position of the wafer stage WST is detected. In FIG. 21, the X-axis interferometer and the Y-axis interferometer are represented by a wafer interferometer 33.

The wafer driving unit 711 will now be described in detail with reference to FIGS. 22 to 27.

Referring to FIG. 22, the wafer driving unit 711 includes: (a) a Y-axis linear motor device (hereinafter referred to as a "Y-axis motor device") YM serving as a first driving device (or as a second driving device) for driving the wafer stage WST on a wafer surface plate 714 in the Y-axis direction, and (b) a first X-axis linear motor device (hereinafter referred to as a "first X-axis motor device") XMA and a second X-axis linear motor device (hereinafter referred to as a "second X-axis motor device") XMB serving as a second driving device (or as a first driving device) for moving the wafer stage WST and the Y-axis motor device YM on the wafer surface plate 714 in the X-axis direction.

The first X-axis motor device XMA (more specifically, an X-axis stationary member 718A which will be described later) is supported in a non-contact manner by frames 716A1 and 716A2 fixed on the upper surfaces of two corners of a wafer base BS on the +Y-direction side so that it is restrained in the Y-axis direction and the Z-axis direction. The second X-axis motor device XMB (more specifically, an X-axis stationary member 718B which will be described later) is similarly supported in a non-contact manner by frames 716B1 and 716B2 fixed on the upper surfaces of two corners of the wafer base BS on the −Y-direction side so that it is restrained in the Y-axis direction and the Z-axis direction.

Figure 23:
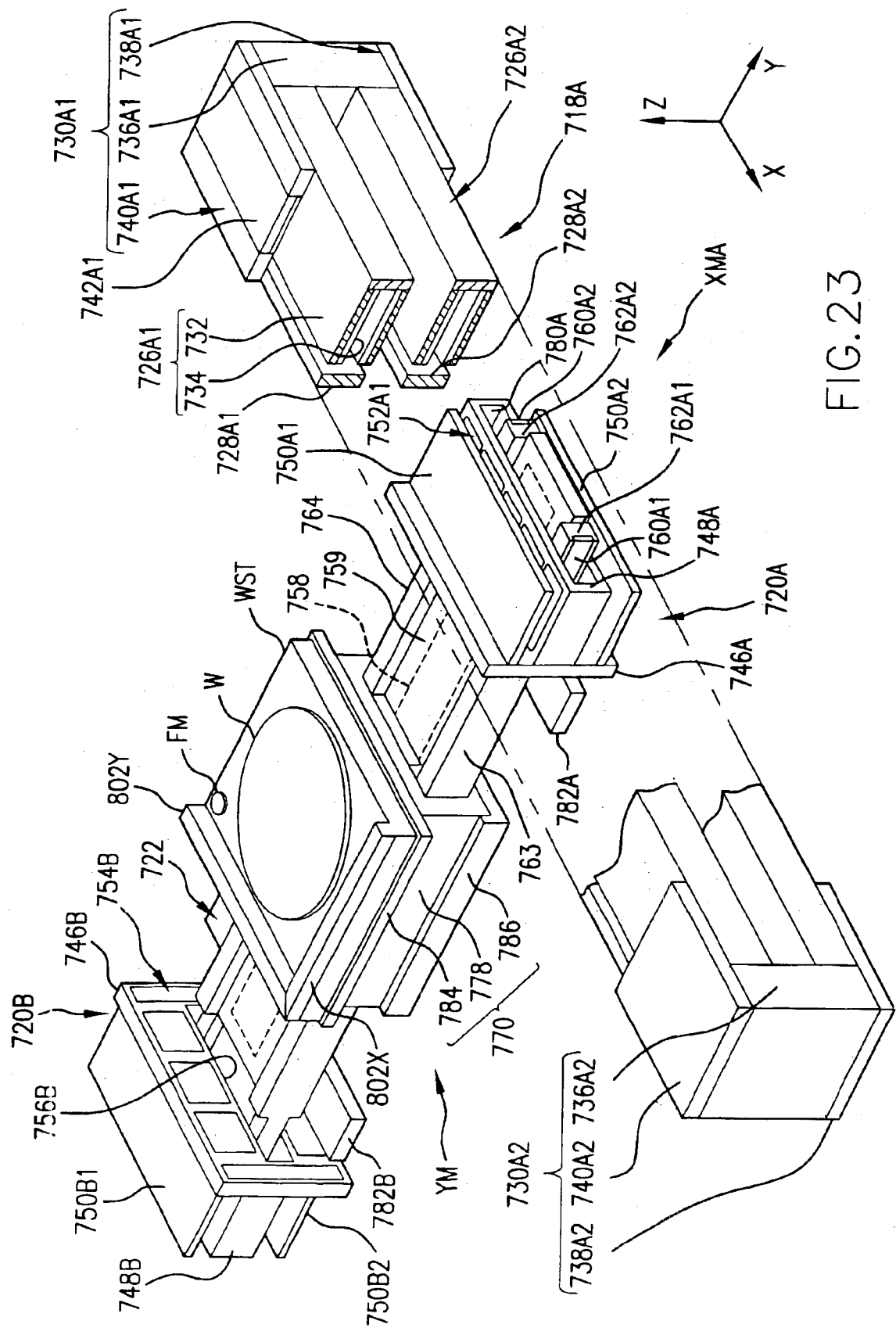
FIG. 23 is a partly broken view of a wafer stage and a wafer driving device shown in FIG. 22.

The first X-axis motor device XMA includes the X-axis stationary member 718A and an X-axis moving member 720A that moves in the X-axis direction along the X-axis stationary member 718A in engagement therewith, as shown in FIG. 22 and in FIG. 23, which is a partially broken view of the wafer stage WST and a part of the wafer driving device shown in FIG. 22.

The X-axis stationary member 18A includes: (i) a magnetic pole unit 726A1 of U-shaped YZ-plane cross section that extends in the X-axis direction, (ii) a magnetic pole unit 726A2 disposed on the −Z side (lower side) of the magnetic pole unit 726A1 and having a structure similar to that of the magnetic pole unit 726A1, (iii) platelike X-axis guide members 728A1 and 728A2 respectively disposed on the −Y-sides of the magnetic pole units 726A1 and 726A2 so as to extend in the X-axis direction, and (iv) holding members 730A1 and 730A2 for holding the magnetic pole units 726A1 and 726A2 and the X-axis guide members 728A1 and 728A2 in a predetermined positional relationship.

As shown in FIG. 23, the magnetic pole unit 726A1 includes a yoke 732 of U-shaped cross section, and a plurality of field magnets 734 arranged on the upper and lower opposing surfaces of the yoke 732 at predetermined intervals in the X-axis direction. Since the pole faces of the field magnets 734 opposing in the Z-axis direction are opposite in polarity, Z-axis direction magnetic flux is mainly generated between the opposing field magnets 734. Since the pole faces of the field magnets 734 that are adjacent to each other in the X-axis direction are opposite in polarity, an alternating magnetic field is formed in the X-axis direction in a space inside the yoke 732.

The magnetic pole unit 726A2 has a structure similar to that of the above-described magnetic pole unit 726A1.

Figure 24A:
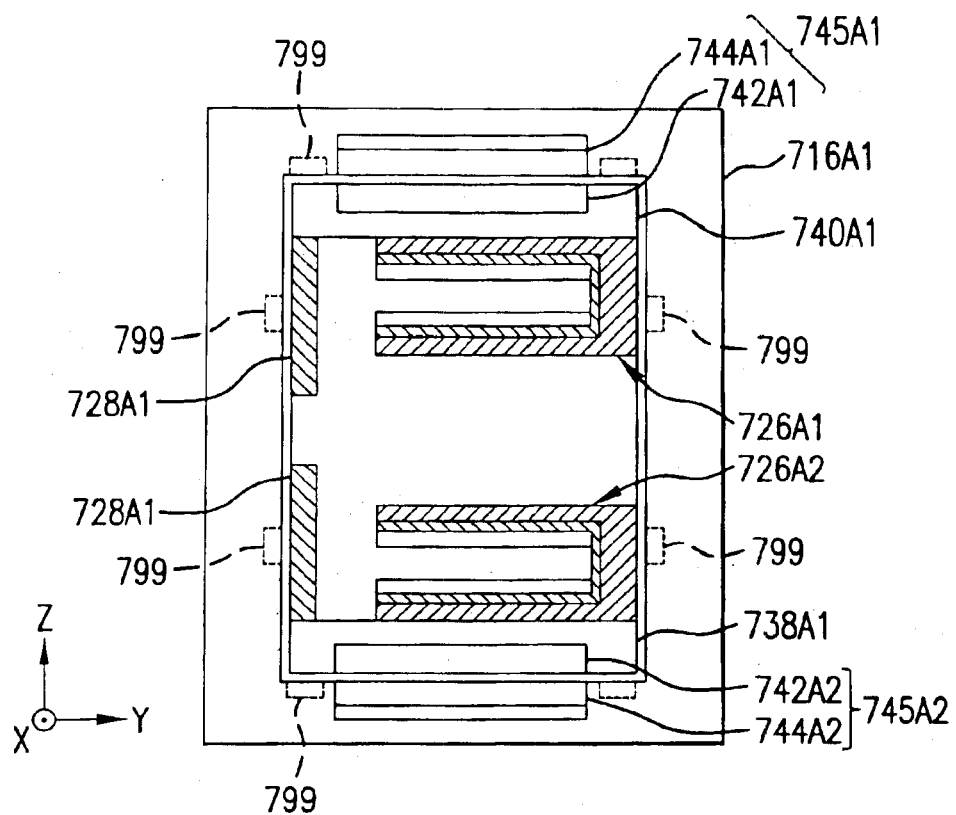
FIG. 24A is a cross-sectional view, taken along line D—D in FIG. 22.

As shown in FIG. 23, the holding member 30A1 includes: (i) a fixing member 736A1 for fixing the magnetic pole units 726A1 and 726A2 and the X-axis guide members 728A1 and 728A2 in a predetermined positional relationship, and (ii) an upper face member 740A1 and a lower face member 738A1 for clamping the fixing member 736A1 from both sides in the Z-axis direction (from above and below). An armature unit 742A1 composed of armature coils arranged at predetermined intervals in the X-axis direction is embedded in the upper surface of the upper face member 740A1, as shown in FIG. 23 and FIG. 24A, which is a cross-sectional view, taken along line D—D in FIG. 22. An armature unit 742A2 similar to the armature unit 742A1 is embedded in the lower surface of the lower face member 738A1.

The other holding member 730A2 includes a fixing member 736A2, and an upper face member 740A2 and a lower face member 738A2 for clamping the fixing member 736A2 from above and below, as shown in FIG. 23.

The X-axis stationary member 718A with the above-described structure is supported in a non-contact manner by vacuum preload hydrostatic gas bearing devices (hereinafter simply referred to as "bearing devices" for convenience) 99 disposed on the inner sides (both inner sides in the Y-axis direction and both inner sides in the Z-axis direction) of the frames 716A1 and 716A2 shown in FIG. 22 (see FIG. 24A; the bearing devices disposed in the frame 716A2 are not shown). That is, while the X-axis stationary member 718A is restrained in the Y-axis direction and the Z-axis direction, it is not restrained at all in the X-axis direction. Therefore, when force in the X-axis direction acts on the X-axis stationary member 718A, the X-axis stationary member 718A moves in the X-axis direction in response to this force.

Figure 27:
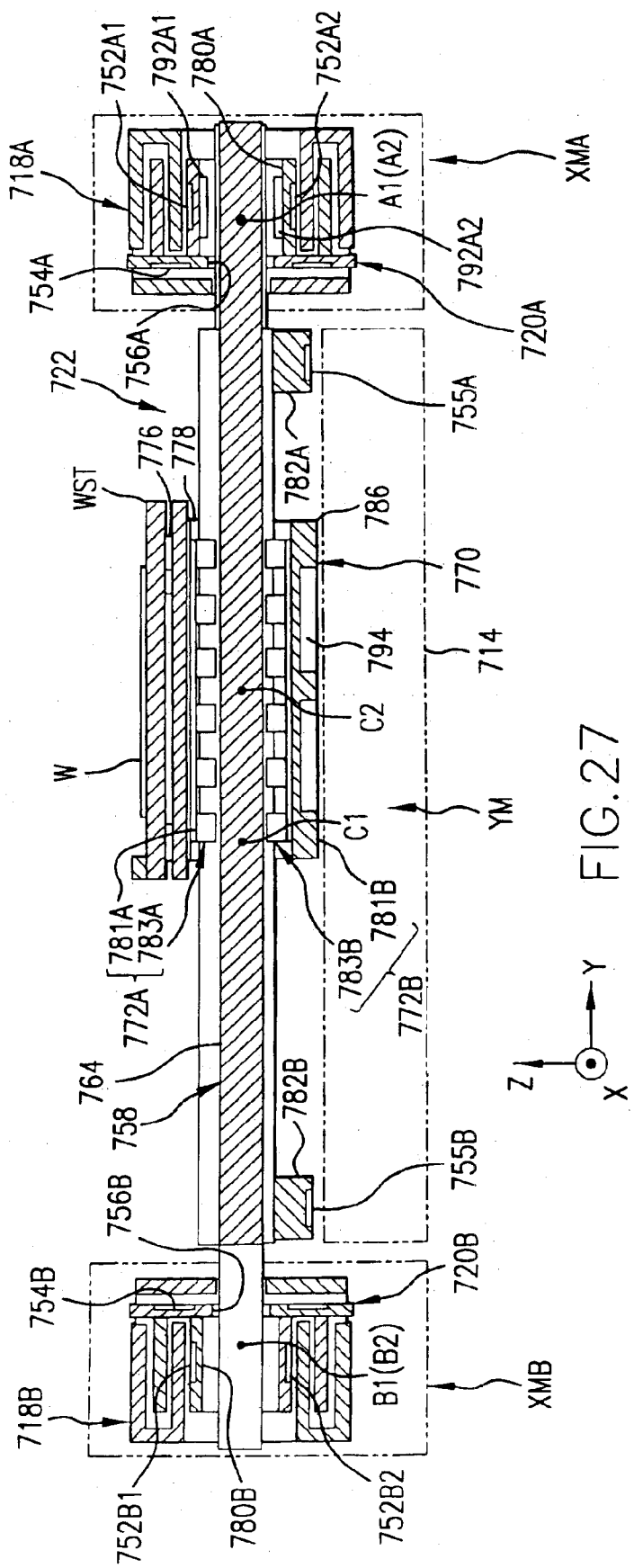
FIG. 27 is an explanatory view showing the positions of the centers of gravity of the wafer stage and the wafer driver.

The X-axis stationary member 718A is substantially symmetric in the vertical direction with respect to its center in the Z-axis direction, as shown in FIG. 27 as a YZ cross-sectional view of the wafer stage assembly 712. For this reason, the center of gravity of the X-axis stationary member 718A in the Z-axis direction lies at a point $A_1$.

The X-axis moving member 20A includes, as generally shown in FIGS. 22 and 23: (a) a slide member 746A, (b) a frame member 748A, and (c) armature units 750A1 and 750A2. The slide member 746A is formed of a flat plate having a +Y-side face opposing the X-axis guide members 728A1 and 728A2. The frame member 748A has a rectangular cross section that is disposed at about the center of the +Y-side face of the slide member 746A in a space between the magnetic pole units 726A1 and 726A2 so as to extend toward the +Y side. The armature units 750A1 and 750A2 are disposed at a nearly equal distance from the frame member 748A in the ±Z-axis direction (at the positions corresponding to the inner spaces of the magnetic pole units 726A1 and 726A2) and have therein a plurality of armature coils arranged at predetermined intervals in the X-axis direction.

The −Y-side face of the slide member 746A is provided with a bearing device 754A (see FIG. 27), similar to a bearing device 754B of a slide member 746B, constituting an X-axis moving member 720B of the second X-axis motor device XMB which will be described later with reference to FIG. 23. The X-axis moving member 720A is supported in no contact with the X-axis stationary member 718A with a clearance of approximately several micrometers therebetween in the Y-axis direction by static pressure of compressed gas (for example, helium or gaseous nitrogen (or clean air)) jetted from the bearing device 754A onto the X-axis guide members 728A1 and 728A2 constituting the above-described X-axis stationary member 718A.

Similar bearing devices 752A1 and 752A2 are also disposed on the upper and lower surfaces of the frame member 748A (the bearing device 752A2 is not shown in FIG. 23, but is shown in FIG. 27). The X-axis moving member 720A is supported in no contact with the X-axis stationary member 718A with a clearance of approximately several micrometers therebetween in the Z-axis direction by static pressure of compressed gas jetted from the bearing devices 752A1 and 752A2 onto the lower surface of the magnetic pole unit 726A1 and the upper surface of the magnetic pole unit 726A2 constituting the X-axis stationary member 718A.

At the center of the slide member 746A, an opening 756A (see FIG. 27) is formed so as to be similar to an opening 756B formed in the slide member 746B constituting the X-axis moving member 720B of the second X-axis motor device XMB shown in FIG. 23, which will be described later. The opening 756A communicates with a cavity 780A of the frame member 748A.

Since the X-axis moving member 720A is substantially symmetric in the vertical direction with respect to its center in the Z-axis direction, as shown in FIG. 27, the position in the Y-axis direction and the Z-axis direction of a center of gravity $A_2$ thereof coincides with that of the center of gravity $A_1$ of the X-axis stationary member 718A.

In the first X-axis motor device XMA with the above-described structure, the X-axis moving member 720A is moved along the X-axis guide members 728A1 and 728A2 in the X-axis direction by Lorentz force produced by an electromagnetic interaction between the current passing through the armature coils of the armature units 750A1 and 750A2 and a magnetic field generated by the field magnets of the magnetic pole units 726A1 and 726A2 of the X-axis stationary member 718A. In this case, the position of the driving force (point of action of the driving force) acting on the X-axis moving member 720A in the X-axis direction coincides with the position of the center of gravity $A_2$ of the X-axis moving member 720A. The position in the Y-axis direction and the Z-axis direction of the reaction force (point of action of the reaction force) acting on the X-axis stationary member 718A in the X-axis direction in connection with the driving of the X-axis moving member 720A coincides with the position in the Y-axis direction and the Z-axis direction of the center of gravity $A_1$ of the X-axis stationary member 718A.

The amount and direction of driving force in the X-axis direction acting on the X-axis moving member 720A are controlled by the waveform (amplitude and phase) of current supplied from the main control system 721 to the armature coils of the armature units 750A1 and 750A2 via the stage control system 719.

Refrigerant (coolant) is supplied to the armature units 750A1 and 750A2 so as to cool the armature coils. The flow rate of the refrigerant is also controlled by the main control system 721.

The second X-axis motor device XMB is placed in rotational symmetry to the above-described first X-axis motor device XMA, as shown in FIG. 22, and is similarly constructed. That is, the second X-axis motor device XMB includes an X-axis stationary member 718B having a structure similar to that of the X-axis stationary member 718A of the first X-axis motor device XMA, and an X-axis moving member 720B having a structure similar to that of the X-axis moving member 720A.

The X-axis stationary member 718B includes: (i) magnetic pole units 726B1 and 726B2 similar to the above magnetic pole units 726A1 and 726A2, (ii) X-axis guide members 728B1 and 728B2 similar to the above X-axis guide members 728A1 and 728A2, and (iii) holding members 730B1 and 730B2 for holding the magnetic pole units 726B1 and 726B2 and the X-axis guide members 728B1 and 728B2 in a predetermined positional relationship.

The holding member 730B1 disposed at the +X-side end of the X-axis stationary member 718B includes: (i) a fixing member 736B1 similar to the above fixing member 736A1, and (ii) an upper face member 740B1 and a lower face member 738B1 for clamping the fixing member 736B1 from both sides in the Z-axis direction (from above and below). An armature unit 742B1 similar to the above armature unit 742A1 is embedded in the upper surface of the upper face member 740B1, and an armature unit 742B2 similar to the above armature unit 742A2 (see FIG. 24) is embedded in the lower surface of the lower face member 738B1.

The holding member 730B2 opposing the holding member 730B1 in the X-axis direction has a structure similar to that of the above holding member 730A2. That is, the holding member 730B2 includes a fixing member 736B2, and an upper face member 740B2 and a lower face member 738B2 for clamping the fixing member 736B2 from above and below.

Since the X-axis stationary member 718B has the above-described structure, the position in the Z-axis direction of its center of gravity $B_1$ coincides with the position in the Z-axis direction of the center of gravity $A_1$ of the X-axis stationary member 718A.

Figure 24B:
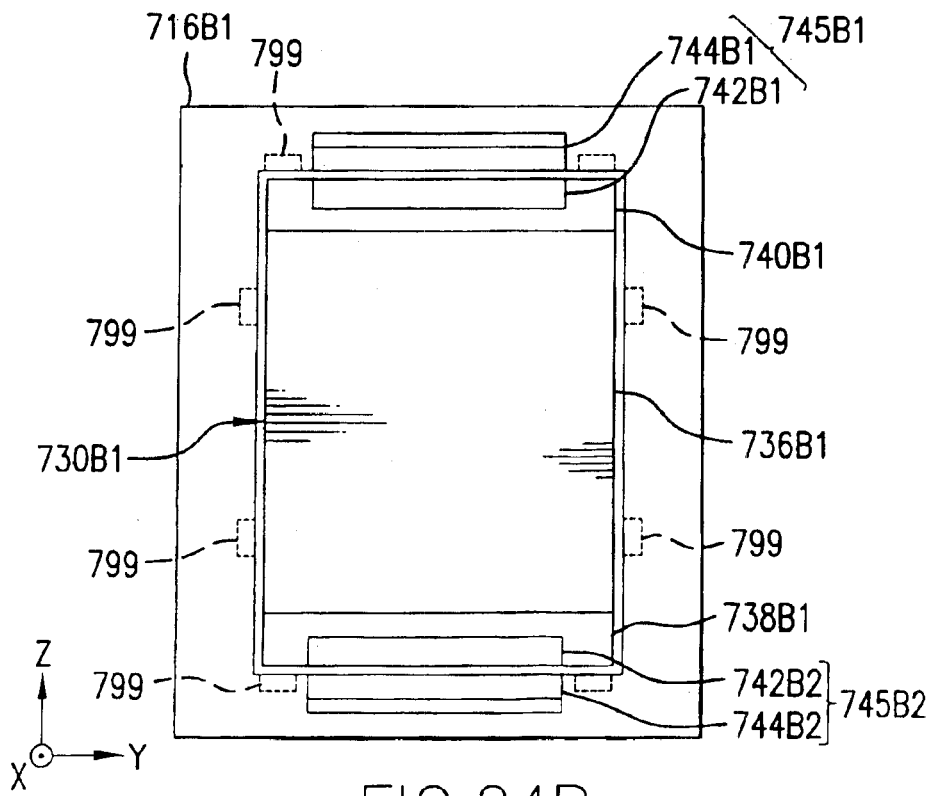
FIG. 24B is an explanatory view of an X-axis stationary member and a frame shown in FIG. 22, as viewed from the +X-axis direction.

The frames 716B1 and 716B2 are provided, on their inner sides, with bearing devices 799 in a manner similar to that of the frames 716A1 and 716A2 (see FIG. 24B).

As shown in FIG. 23, the X-axis moving member 720B includes: (a) a slide member 746B having a structure similar to that of the slide member 746A, (b) a frame member 748B disposed at about the center of the −Y-side face of the slide member 746B and having a structure similar to that of the frame member 748A, and (c) armature units 750B1 and 750B2 disposed at a nearly equal distance from the frame member 748B in the ±Z direction and having a structure similar to that of the armature units 750A1 and 750A2.

The +Y-side face of the slide member 746B is provided with a bearing device 754B, and the upper and lower faces of the frame member 748B are provided with bearing devices 752B1 and 752B2 (not shown in FIG. 23, but shown in FIG. 27) similar to the above bearing devices 752A1 and 752A2.

An opening 756B is formed in the center of the slide member 746B, as shown in FIG. 23. The opening 756B communicates with a cavity 780B of the frame member 748B (see FIG. 27).

The position in the Y-axis direction and the Z-axis direction of the center of gravity $B_2$ of the X-axis moving member 720B with the above-described structure coincides with the position in the Y-axis direction and the Z-axis direction of the center of gravity $B_1$ of the X-axis stationary member 718B, as shown in FIG. 27.

In the second X-axis motor device XMB, in a manner similar to that of the first X-axis motor device XMA, the X-axis moving member 720B is moved along the X-axis guide members 728B1 and 728B2 in the X-axis direction by Lorentz force produced by an electromagnetic interaction between current passing through the armature coils of the armature units 750B1 and 750B2 and a magnetic field generated by the field magnets of the magnetic pole units 726B1 and 726B2 of the X-axis stationary member 718B. In this case, the position of the driving force (point of action of the driving force) acting on the X-axis moving member 720B in the X-axis direction coincides with the position of the center of gravity $B_2$ of the X-axis moving member 720B. The position in the Y-axis direction and the Z-axis direction of the reaction force (point of action of the reaction force) acting on the X-axis stationary member 718B in the X-axis direction in connection with the driving of the X-axis moving member 720B coincides with the position in the Y-axis direction and the Z-axis direction of the center of gravity B of the X-axis stationary member 718B.

In a manner similar to that of the first X-axis motor device XMA, the amount and direction of driving force in the X-axis direction acting on the X-axis moving member 720B are controlled by the waveform (amplitude and phase) of current supplied from the main control system 721 to the armature coils of the armature units 750B1 and 750B2 via the stage control system 719.

Refrigerant is supplied to the armature units 750B1 and 750B2 constituting the second X-axis motor device XMB so as to cool the armature coils, in a manner similar to that of the above armature units 750A1 and 750A2. The flow rate of the refrigerant is also controlled by the main control system 721.

In the frame 716A1 corresponding to the holding member 730A1, as shown in FIG. 24A, magnetic pole units 744A1 and 744A2, each composed of a magnetic material and a plurality of field magnets arranged at predetermined intervals in the X-axis direction, are disposed at the positions corresponding to the armature units 742A1 and 742A2 of the upper face member 740A1 and the lower face member 738A1 (that is, in the upper and lower opposing faces of the frame 716A1). In the magnetic pole units 744A1 and 744A2, pole faces of the field magnets adjacent to each other in the X-axis direction are opposite in polarity.

In the frame 716B1 corresponding to the holding member 730B1, as shown in FIG. 24B, which is a view of the holding member 730B1 and the frame 716B1, as viewed from the +X-axis direction, magnetic pole units 744B1 and 744B2, each composed of a magnetic material and a plurality of field magnets arranged at predetermined intervals in the X-axis direction, are disposed at the positions corresponding to the armature units 742B1 and 742B2 of the upper face member 740B1 and the lower face member 738B1 (that is, in the upper and lower opposing faces of the frame 716B1). In the magnetic pole units 744B1 and 744B2, pole faces of the field magnets adjacent to each other in the X-axis direction are opposite in polarity.

For this reason, an alternating magnetic field is formed in the X-axis direction in a space where the armature units 742A1 and 742A2 are placed opposed to the magnetic pole units 744A1 and 744A2. A periodic magnetic field also is formed in the X-axis direction in a space where the armature units 742B1 and 742B2 are placed opposed to the magnetic pole units 744B1 and 744B2.

As a result, the armature unit 742A1 serving as a moving member and the magnetic pole unit 744A1 serving as a stationary member constitute a linear motor 745A1, and the armature unit 742A2 serving as a moving member and the magnetic pole unit 744A2 serving as a stationary member constitute a linear motor 745A2, as shown in FIG. 24A. The armature unit 742B1 serving as a moving member and the magnetic pole unit 744B1 serving as a stationary member constitute a linear motor 745B1, and the armature unit 742B2 serving as a moving member and the magnetic pole unit 744B2 serving as a stationary member constitute a linear motor 745B2, as shown in FIG. 24B. The linear motors 745A1, 745A2, 745B1, and 745B2 generate driving force by an electromagnetic interaction.

The linear motors 745A1 and 745A2 constitute a first X-position correction device, which will be described later, and the linear motors 745B1 and 745B2 constitute a second X-position correction device. The position in the Y-axis direction and the Z-axis direction of the driving force in the X-axis direction applied from the first X-position correction device to the X-axis stationary member 718A coincides with the position in the Y-axis direction and the Z-axis direction of the center of gravity $A_1$ of the X-axis stationary member 718A shown in FIG. 27. The position in the Y-axis direction and the Z-axis direction of the driving force in the X-axis direction applied from the second X-position correction device to the X-axis stationary member 718B coincides with the position in the Y-axis direction and the Z-axis direction of the center of gravity $B_1$ of the X-axis stationary member 718B.

The amount and direction of driving force in the X-axis direction applied from the first and second X-position correction devices acting on the X-axis stationary members 718A and 718B are controlled by controlling the waveform (amplitude and phase) of current supplied from the main control system 721 to the armature coils of the armature units 742A1, 742A2, 742B1, and 742B2 via the stage control system 719.

Referring again to FIG. 22, the Y-axis motor device YM includes a Y-axis stationary member 722 and a Y-axis moving member 770.

Figure 25:
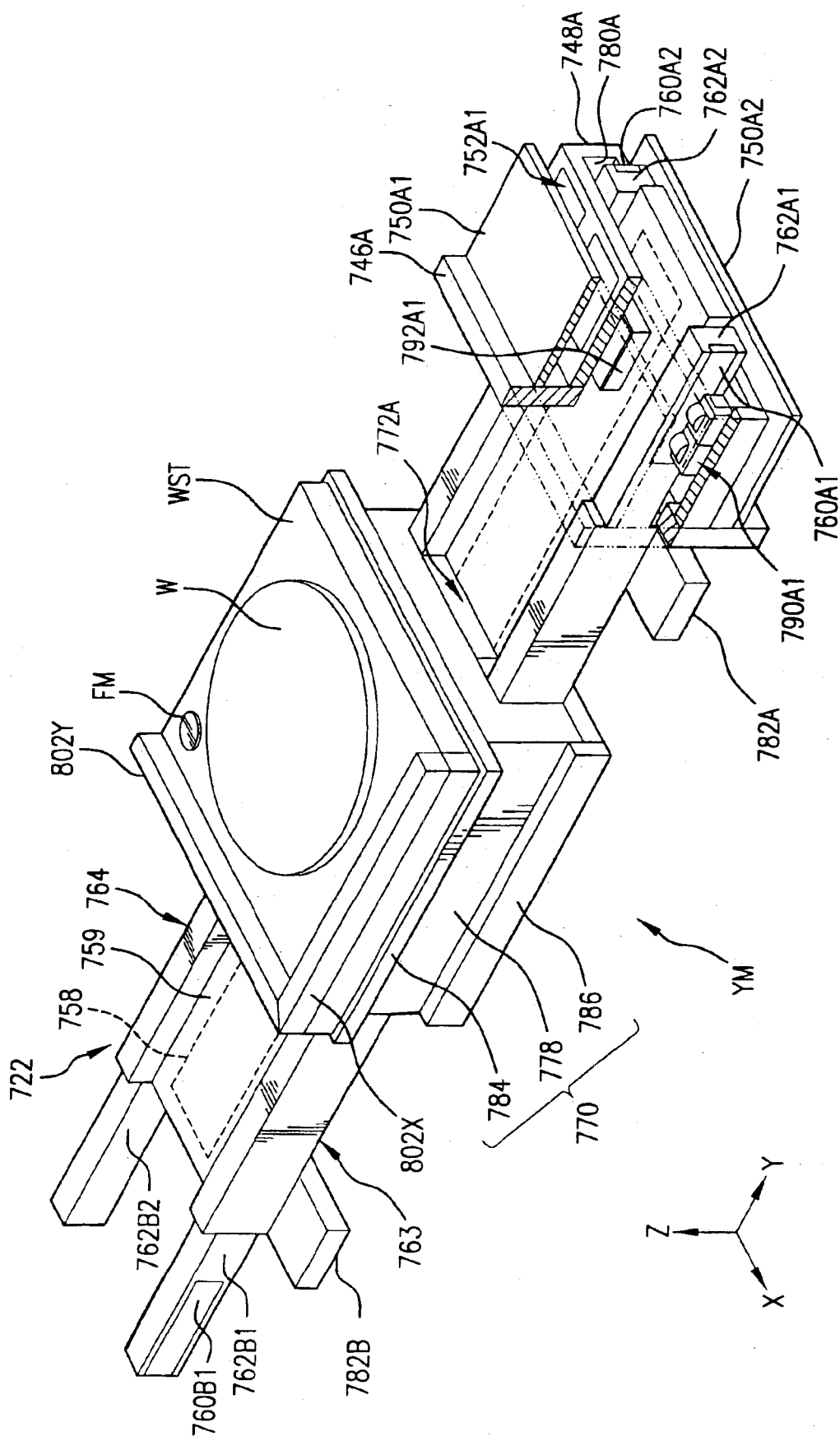
FIG. 25 is a partly broken view of an X-axis moving member shown in FIG. 23, in which the X-axis stationary member is omitted.

The Y-axis stationary member 722 includes, as shown in FIG. 25: (a) an armature unit 758 having therein a plurality of armature coils arranged at predetermined intervals in the Y-axis direction and extending in the Y-axis direction, (b) a housing member 759 for supporting and housing the armature unit 758, and (c) a pair of Y-axis guide members 763 and 764 disposed on both sides in the X-axis direction of the housing member 759. On the +Y-direction side, the armature coils are arranged adjacent to the +Y-side ends of the Y-axis guide members 763 and 764. In contrast, on the −Y-direction side, the ends of the Y-axis guide members 763 and 764 protrude in the −Y direction.

As shown in FIG. 25, the Y-axis guide member 763 has iron plate holding portions 762A1 and 762B1 on the −X-side faces at both ends in the longitudinal direction, and the Y-axis guide member 764 has iron plate holding portions 762A2 and 762B2 on the +X-side faces at both ends in the longitudinal direction. Iron plates 760A1, 760B1, 760A2, and 760B2 (the iron plate 760B2 in the iron plate holding portion 762B2 is not shown in FIG. 25, but is shown in FIG. 26) are embedded in the iron plate holding portions 762A1, 762B1, 762A2, and 762B2.

Both ends in the longitudinal direction of the Y-axis stationary member 722 are, as shown in FIG. 23, inserted in the frame members 748A and 748B via the openings 756A and 756B formed in the slide members 746A and 746B of the above-described X-axis moving members 720A and 720B.

Figure 26:
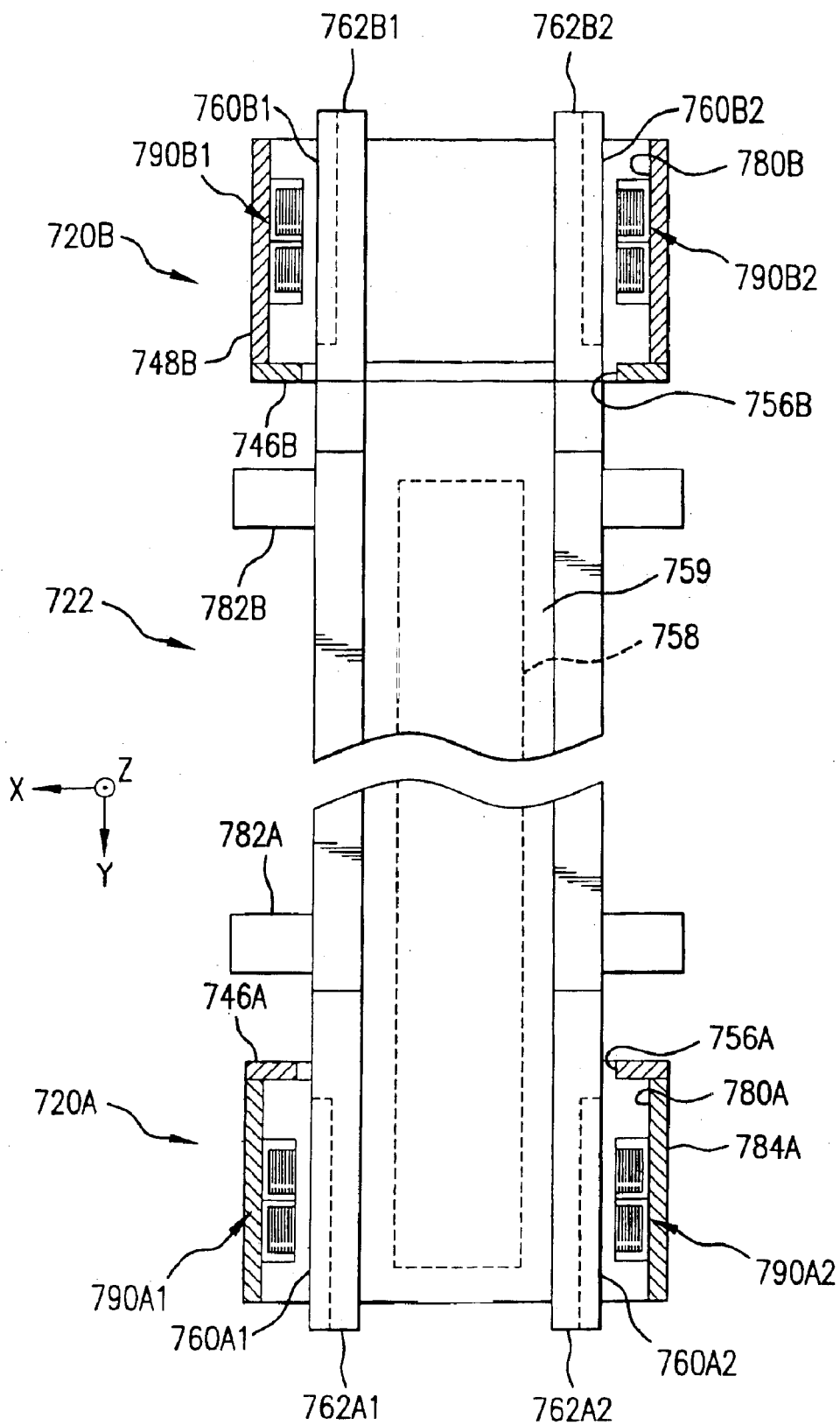
FIG. 26 is an explanatory view of an X restraint mechanism.

FIG. 26 is a partly omitted cross-sectional view of the Y-axis motor device YM and the X-axis moving members 720A and 720B, taken along an X-Y plane slightly above the center in the height direction. As shown in FIG. 26, electromagnets 790A1, 790A2, 790B1, and 790B2 are fixed on the inner side walls of the frame members 748A and 748B in the X-axis moving members 720A and 720B. The electromagnets 790A1, 790A2, 790B1, and 790B2 are respectively opposed to the iron plates 760A1, 760A2, 760B1, and 760B2 embedded in the Y-axis ends of the Y-axis stationary member 722. The Y-axis stationary member 722 is restrained in the X-axis direction in a non-contact manner by magnetic force produced between the iron plates 760A1, 760A2, 760B1, and 760B2 and the electromagnets 790A1, 790A2, 790B1, and 790B2. On the other hand, since the Y-axis stationary member 722 is not restrained at all in the Y-axis direction, it can be moved in the Y-axis direction in response to force applied in the Y-axis direction. The iron plates 760A1, 760A2, 760B1, and 760B2 and the electromagnets 790A1, 790A2, 790B1, and 790B2 constitute an X-axis restraint mechanism for the Y-axis stationary member 722.

In the X-axis restraint mechanism, magnetic force between each of the electromagnets 790A1, 790A2, 790B1, and 790B2 and a corresponding iron plate is controlled by controlling current supplied to the electromagnet via the stage control system 719 by the main control system 721.

Such control of magnetic force between the iron plates 760A1, 760A2, 760B1, and 760B2 and the corresponding electromagnets 790A1, 790A2, 790B1, and 790B2 in the X-axis restraint mechanism allows the Y-axis stationary member 722 and the wafer W (the wafer stage WST) to be slightly driven in a direction $\theta_Z$.

As shown in FIG. 25, placed inside the frame member 748A are: (i) a magnet 792A1 composed of a plurality of field magnets arranged at predetermined intervals in the Y-axis direction so as to be opposed to the upper surface of the armature unit 758, and (ii) a magnet 792A2 (not shown in FIG. 25, but shown in FIG. 27) composed of a plurality of field magnets arranged at predetermined intervals in the Y-axis direction so as to be opposed to the lower surface of the armature unit 758. The pole faces of the opposing field magnets in the magnets 792A1 and 792A2 are opposite in polarity. As a result, the armature unit 758 and a magnetic pole unit composed of the magnets 792A1 and 792A2 constitute a linear motor for driving the Y-axis stationary member 722 in the Y-axis direction.

The linear motor constitutes a Y-axis position correction device which will be described later. The position in the X-axis direction and the Z-axis direction of the driving force in the Y-axis direction to be given from the Y-axis position correction device to the Y-axis stationary member 722 coincides with the position in the X-axis direction and the Z-axis direction of a center of gravity $C_1$ of the Y-axis stationary member 722 shown in FIG. 27. The amount and direction of driving force in the Y-axis direction applied from the Y-axis position correction device and acting on the Y-axis stationary member 722 are controlled by controlling the waveform (amplitude and phase) of current supplied from the main control system 721 to the armature coils, which constitute a part of the armature unit 758 held between the magnets 792A1 and 792A2, via the stage control system 719.

Below and adjacent to both ends in the Y-axis direction of the Y-axis guide members 763 and 764, as shown in FIG. 27, floating members 782A and 782B are placed. The floating members 782A and 782B have, at their bottoms, bearing devices 755A and 755B for maintaining a clearance from the wafer surface plate 714. The floating members 782A and 782B and the Y-axis stationary member 722 are supportingly floated at a distance of approximately several micrometers from the wafer surface plate 714 by static pressure of compressed gas jetted from the bearing devices 755A and 755B onto the upper surface of the wafer surface plate 714.

In the Y-axis stationary member 722, the armature unit 758 is fixed to the portions of the Y-axis guide members 763 and 764 slightly offset downward from the center in the Z-axis direction, as is evident from the positional relationship between the armature unit 758 and the Y-axis guide member 764 which is representatively shown in FIG. 27. The position in the Z-axis direction of the center of gravity $C_1$ of the Y-axis stationary member 722 coincides with the position in the Z-axis direction of the center of gravity $A_1$ of the X-axis stationary member 718A described above.

Referring again to FIG. 25, the Y-axis moving member 770 includes: (a) a magnet holding member 778 having a rectangular XZ cross section shape, (b) a magnetic pole unit 772A placed on the upper inner surface of the magnet holding member 778 and having field magnets arranged at predetermined intervals in the Y-axis direction and a magnetic pole unit 772B (not shown in FIG. 25, but shown in FIG. 27) placed on the lower inner surface of the magnet holding member 778 and having field magnets arranged at predetermined intervals in the Y-axis direction, (c) a top plate 784 placed on the magnet holding member 778 so as to be nearly square in plan view, and (d) a center of gravity adjusting member 786 placed under the magnet holding member 778. The above-described Y-axis stationary member 722 is passed through the inner space of the magnet holding member 778.

The magnetic pole unit 772A is, as shown in FIG. 27, composed of: (i) a magnetic member 781A fixed on the upper inner surface of the magnet holding member 778, and (ii) a plurality of field magnets 783A arranged on the lower surface of the magnetic member 781A at predetermined intervals in the Y-axis direction. In this case, pole faces of the field magnets 783A face the upper surface of the armature unit 758. The pole faces of the field magnets 783A adjacent to each other in the Y-axis direction are opposite in polarity.

The magnetic pole unit 772B is composed of: (i) a magnetic member 781B fixed on the lower inner surface of the magnet holding member 778, and (ii) a plurality of field magnets 783B arranged on the upper surface of the magnetic member 781B at predetermined intervals in the Y-axis direction. In this case, pole faces of the field magnets 783B face the lower surface of the armature unit 758. The pole faces of the field magnets 783B adjacent to each other in the Y-axis direction are opposite in polarity.

The pole faces of the above-described field magnets 783A and 783B opposing in the Z-axis direction are opposite in polarity. For this reason, magnetic flux in the Z-axis direction is mainly produced between the opposing field magnets 783A and 783B. Since the pole faces of the field magnets 783A and 783B that are adjacent to each other in the Y-axis direction are opposite in polarity, as described above, an alternating magnetic field is formed in the Y-axis direction in a space between the field magnets 783A and 783B.

A plurality of bearing devices 794 are arranged on the bottom surface of the center of gravity position adjusting member 786. The Y-axis moving member 770 is supportingly floated at a distance of approximately several micrometers from the wafer surface plate 714 by static pressure of compressed gas jetted from the bearing devices 794 onto the upper surface of the wafer surface plate 714. Similarly, bearing devices (not shown) are provided on the inner faces of the magnet holding member 778 opposing in the X-axis direction, and the Y-axis moving member 770 is held in no contact with (i.e., spaced from) the outer surfaces of the Y-axis guide members 763 and 764 constituting the Y-axis stationary member 722 at a distance of approximately several micrometers therefrom. By keeping the distance fixed, the Y-axis moving member 770 and the wafer stage WST, which will be described later, are prevented from rotating (yawing) in $\theta_Z$ when the Y-axis moving member 770 is driven in the Y-axis direction by the Y-axis linear motor.

The pressure and flow rate of compressed gas to be jetted from the bearing devices 794 of the Y-axis moving member 770 are controlled by the stage control system 719 shown in FIG. 21 according to instructions from the main control system 721. The other bearing devices described above are also controlled in a similar manner.

As shown in FIG. 27, a Z-tilt driving mechanism 776 is placed on the upper surface of the Y-axis moving member 770 so as to control the Z-axis position and attitude (tilt) of the wafer stage WST.

The Z-tilt driving mechanism 776 is composed of three voice coil motors (not shown) that are placed at the positions on the upper surface of the top plate 784 of the Y-axis moving member 770 corresponding to the vertexes of a nearly equilateral triangle so as to support and independently and slightly drive the wafer stage WST in the Z-axis direction. Therefore, the wafer stage WST is slightly driven by the Z-tilt driving mechanism 776 in three degree-of-freedom directions, the Z-axis direction, the $\theta_X$ direction (direction of rotation about the X-axis), and the $\theta_Y$ direction (direction of rotation about the Y-axis). Driving of the Z-tilt driving mechanism 776 is controlled by the stage control system 719 according to instructions from the main control system 721.

Since the Y-axis moving member 770 has the structure described above, the position in the X-axis direction and the Z-axis direction of a center of gravity $C_2$ of a composite of the Y-axis moving member 770 and the wafer stage WST coincides with the position in the X-axis direction and the Z-axis direction of the center of gravity $C_1$ of the Y-axis stationary member 722, as shown in FIG. 27.

In the Y-axis motor device YM with the above-described structure, the Y-axis moving member 770 is moved along the Y-axis guide members 763 and 764 in the Y-axis direction by Lorentz force produced by an electromagnetic interaction between current passing through the armature coils of the armature unit 758 and a magnetic field generated by the field magnets 783A and 783B of the magnetic pole units 772A and 772B of the Y-axis stationary member 722. In this case, the position of the driving force (point of action of the driving force) in the Y-axis direction acting on the Y-axis moving member 770 coincides with the position of the center of gravity $C_2$ of the Y-axis moving member 770. The position in the Y-axis direction and the Z-axis direction of the reaction force (point of action of the reaction force) in the Y-axis direction acting on the Y-axis stationary member 722 in connection with driving of the Y-axis moving member 770 coincides with the position in the X-axis direction and the Z-axis direction of the center of gravity $C_1$ of the Y-axis stationary member 722.

The amount and direction of driving force in the Y-axis direction acting on the Y-axis moving member 770 are controlled by controlling the waveform (amplitude and phase) of current supplied from the main control system 721 to the armature coils of the armature unit 758 via the stage control system 719.

Refrigerant for cooling the armature coils is supplied to the armature unit 758. The flow rate of the refrigerant is also controlled by the main control system 721.

An exposure operation by the exposure apparatus 700 of this embodiment with the above structure will now be described. Exposure for second and subsequent layers of a wafer W will be described as an example.

First, a reticle R is loaded onto the reticle stage RST by a reticle loader (not shown). Subsequently, reticle alignment and base line measurement are performed. During the reticle alignment and the base line measurement, the main control system 721 controls the wafer driving unit 711 via the stage control system 719 so as to move the wafer stage WST two-dimensionally. For the purpose of such two-dimensional movement of the wafer stage WST, the main control system 721 controls the waveform of current supplied to the armature units 750A1, 750A2, 750B1, and 750B2 for X-axis driving in the first and second X-axis motor devices XMA and XMB of the wafer driving unit 711 and the waveform of current supplied to the armature coils of the armature unit 758 of the Y-axis motor device YM, based on positional information (or speed information) about the wafer stage WST from the wafer interferometer 733. When driving the wafer stage WST in the X-axis direction, current is controlled so that driving forces given from the first and second X-axis motor devices XMA and XMB to the X-axis moving members 720A and 720B are equal in amount and direction.

In this case, since the X-axis moving members 720A and 720B are restrained in a non-contact manner in the Y-axis direction and the Z-axis direction, as described above, they are stably driven by the first and second X-axis motor devices XMA and XMB. Furthermore, since the centers of gravity $A_2$ and $B_2$ of the X-axis moving members 720A and 720B coincide with the driving forces acting on the X-axis moving members 720A and 720B, no torque is produced in the X-axis moving members 720A and 720B, and all the driving forces are translational in the X-axis direction. This allows the X-axis moving members 720A and 720B to be driven in the X-axis direction with high efficiency.

Since the Y-axis moving member 770 is restrained in a non-contact manner in the X-axis direction and the Z-axis direction, as described above, it is stably driven by the Y-axis motor device YM. Furthermore, since the center of gravity $C_2$ of the Y-axis moving member 770 and the driving force acting thereon coincide with each other, no torque is produced in the Y-axis moving member 770, and all the driving force is translational in the Y-axis direction. This allows the Y-axis moving member 770 to be driven in the Y-axis direction with high efficiency.

When the X-axis moving members 720A and 720B are driven by the first and second X-axis motor devices XMA and XMB, reaction force in a direction opposite from the driving direction of the X-axis moving members 720A and 720B is produced in the X-axis stationary members 718A and 718B. In this case, since the X-axis stationary members 718A and 718B are restrained in a non-contact manner in the Y-axis direction and the Z-axis direction, they are moved in the X-axis direction opposite from the driving direction of the X-axis moving members 720A and 720B in response to the reaction force according to the law of conservation of momentum. As a result, most of the reaction force acting on the X-axis stationary members 718A and 718B is absorbed (by their movement), rather than being transmitted to wafer surface plate 714. Consequently, it is possible to substantially completely prevent vibration from being generated due to the reaction force produced when the X-axis moving members 720A and 720B are driven.

The main control system 721 controls the waveform of current supplied to the armature coils of the armature units 742A1, 742A2, 742B1, and 742B2 for X-axis driving in the first and second X-axis position correction devices via the stage control system 719. By such control, the first and second X-axis position correction devices drive the X-axis stationary members 718A and 718B in the X-axis direction at an appropriate time so that the X-axis stationary members 718A and 718B are maintained within their stroke ranges even after being subsequently moved in the X-axis direction due to the reaction force produced by driving of the X-axis moving members 720A and 720B.

When the Y-axis moving member 770 is driven by the Y-axis motor device YM, reaction force in a direction opposite from the driving direction of the Y-axis moving member 770 is produced in the Y-axis stationary member 722. In this case, since the Y-axis stationary member 722 is restrained in a non-contact manner in the X-axis direction and the Z-axis direction, it is moved in the Y-axis direction opposite from the driving direction of the Y-axis moving member 770 in response to the reaction force according to the law of conservation of momentum. As a result, most of the reaction force acting on the Y-axis stationary member 722 is absorbed. Consequently, it is possible to substantially completely prevent vibration from being generated due to the reaction force produced when the Y-axis moving member 770 is driven.

The main control system 721 controls the waveform of current supplied to the armature coils of the armature unit 758 for Y-axis driving in the Y-axis position correction device via the stage control system 719. By such control, the Y-axis position correction device drives the Y-axis stationary member 722 in the Y-axis direction at an appropriate time so that the Y-axis stationary member 722 is maintained within its stroke range even after being subsequently moved in the Y-axis direction due to the reaction force produced by driving of the Y-axis moving member 770.

Under such control of the wafer driving unit 711 by the main control system 721, reticle alignment and base line measurement are performed while moving the wafer stage WST. When the reticle alignment and base line measurement are completed, a wafer W is loaded onto the wafer stage WST by a wafer loader (not shown). The wafer stage WST is moved to a loading position in order for the wafer W to be loaded thereon. The movement of the wafer stage WST is controlled in a manner similar to that of the above reticle alignment.

Figure 28:
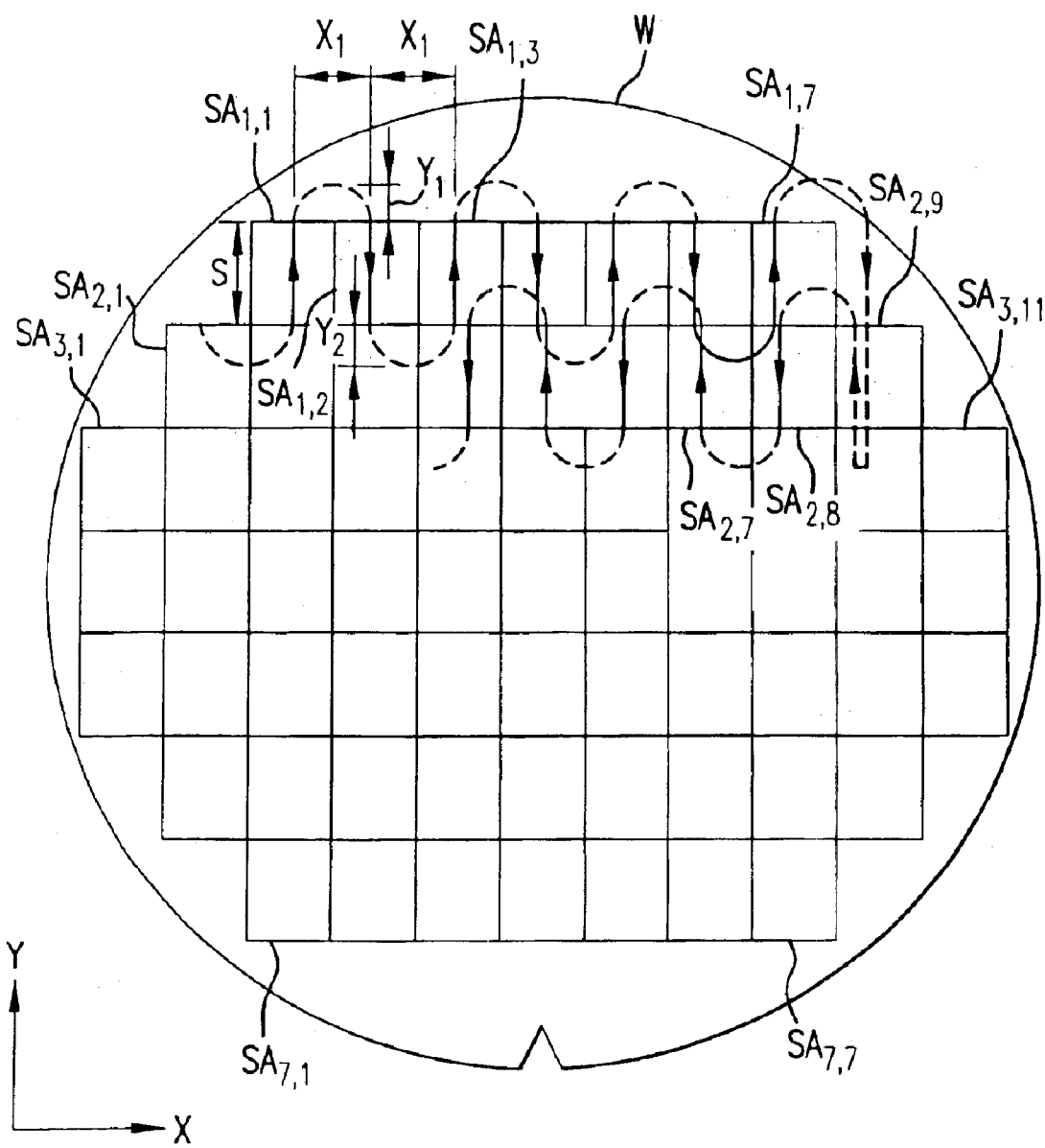
FIG. 28 is an explanatory view illustrating an exposure process for a wafer.

As shown in FIG. 28, a plurality of shot areas $SA_{ij}$ serving as areas to be exposed are arranged in a matrix on the loaded wafer W. Each of the shot areas $SA_{ij}$ has a chip pattern formed by exposure and development processes performed for the preceding layer, and a fine alignment mark for fine alignment.

Subsequently, fine alignment is performed by, e.g., Enhanced Global Alignment (EGA) in which the array coordinates of the shot areas $SA_{ij}$ on the wafer W are found by statistical calculation such as a least squares method. In the fine alignment process, the wafer stage WST is moved so that a predetermined fine alignment mark is placed in an observation area of an alignment microscope ALG when observing the fine alignment mark. The movement of the wafer stage WST is controlled in a manner similar to that of the above-described reticle alignment. Fine alignment by EGA is disclosed in, for example, Japanese Laid-Open Patent Application No. 61-44429 and U.S. Pat. No. 4,780, 617 corresponding thereto.

Subsequently, exposure is effected on each shot area on the wafer W by a step-and-scan method. The shot areas $SA_{ij}$ are exposed in the order illustrated in FIG. 28, that is, sequentially from a shot area $SA_{1,1}$ in the row direction (+X direction). When exposure of the last shot area $SA_{1,7}$ of the first row is completed, exposure is then effected from the first $SA_{2,9}$ of the second row in a row direction (−X direction) opposite from the direction of the first row. Subsequently, exposure is sequentially effected to the last shot area while reversing the direction of exposure at every linefeed.

Solid arrows in FIG. 28 show the direction of scanning for exposure areas IA in the shot areas of the wafer W. That is, this embodiment adopts a so-called alternate scanning method in which the scanning direction is sequentially reversed as exposure progresses. As the exposure of the shot areas progresses, in fact, the wafer W is moved in a direction opposite from the direction shown by the solid arrows (including dotted lines) in FIG. 28.

In such an exposure process, the main control system 721 first controls the wafer driving unit 711 via the stage control system 719 based on the result of the above fine alignment and positional information (or speed information) from the wafer interferometer 733, thereby moving the wafer stage WST so as to place the wafer W into a start position of scan-exposure for the first shot area $SA_{1,1}$ on the wafer W. While the movement of the wafer stage WST in this case is also controlled in a manner substantially similar to that of the above reticle alignment, there are three differences as follows:

(1) At the scanning start position for the first shot area $SA_{1,1}$, the wafer W has a velocity component only in the −Y direction, and the velocity component is set at a predetermined value $V_W$.

(2) At the scanning start position for the first shot area $SA_{1,1}$, the X-axis stationary members 718A and 718B are placed in predetermined X-axis positions by the first and second X-axis position correction devices. The predetermined X-axis positions are set so as to ensure that there is sufficient space for the stroke of (i.e., the movement of) the X-axis stationary member 718A when it is moved in the +X-axis direction by reaction force produced when the wafer stage WST is moved in the −X-axis direction by a distance corresponding to one shot area of the wafer W (a distance $X_1$ shown in FIG. 28).

(3) At the scanning start position for the first shot area $SA_{1,1}$, the Y-axis stationary member 722 is placed in a predetermined Y-axis position by the Y-axis position correction device. The predetermined Y-axis position is set so as to ensure that there is sufficient space for the stroke (i.e., the movement) of the Y-axis stationary member 722 when it is moved in the +Y-axis direction by reaction force produced by the movement of the wafer stage WST during scan-exposure of the first shot area $SA_{1,1}$ (by a distance S shown in FIG. 28) and the stepping movement thereof in the −Y-axis direction from the first shot area $SA_{1,1}$ to the second shot area $SA_{1,2}$ (by a distance $Y_1$ shown in FIG. 28) and to ensure that there is sufficient space for the stroke of the Y-axis stationary member 722 when it is moved in the −Y-axis direction by reaction force produced by the stepping movement of the wafer stage WST in the +Y-axis direction from the second shot area $SA_{1,2}$ to the third shot area $SA_{1,3}$ (by a distance $Y_2$ shown in FIG. 28).

Subsequently, the stage control system 719 starts relative movement in the Y-axis direction between the reticle R and the wafer W, that is, between the reticle stage RST and the wafer stage WST, according to directions from the main control system 721. When both the stages RST and WST reach their respective target scanning speeds and are brought into a constant-speed synchronous state, a pattern area of the reticle R starts to be illuminated with illumination light from the illumination optical system IOP, and scan-exposure is started. The above-described relative scanning is performed by controlling the reticle driving unit (not shown) and the wafer driving unit 711 by the stage control system 719 while monitoring the values measured by the wafer interferometer 733 and the reticle interferometer 715 described above.

The stage control system 719 synchronously controls the reticle stage RST and the wafer stage WST via the reticle driving unit and the wafer driving unit 711. In this case, in particular, during the above-described scan-exposure, synchronous control is executed so that the ratio of the moving velocity $V_R$ of the reticle stage RST in the Y-axis direction and the moving velocity $V_W$ of the wafer stage WST in the Y-axis direction is maintained in accordance with the projection magnification (¼× or ⅕×) of the projection optical system PL.

Different pattern areas on the reticle R are sequentially illuminated with light. When illumination of all the pattern areas is completed, scan-exposure of the first shot area $SA_{1,1}$ on the wafer W is terminated. The pattern areas (i.e., the pattern) on the reticle R are thereby reduced and transferred onto the first shot area $SA_{1,1}$ via the projection optical system PL. After the completion of scan-exposure, illumination of the pattern areas of the reticle R with the illumination light is terminated.

In the above-described synchronous movement for scan-exposure, the wafer stage WST (and the wafer W) is moved by driving the Y-axis moving member 770 by the Y-axis motor device YM in the wafer driving unit 711. During the synchronous movement, the Y-axis position of the Y-axis stationary member 722 is not corrected by the Y-axis position correction device. For this reason, reaction force produced by the driving of the Y-axis moving member 770 functions as a driving force for the Y-axis stationary member 722, which is completely freely movable according to the law of conservation of momentum, and thereby the reaction force is absorbed. As a result, it is possible to substantially completely prevent vibration due to driving of the Y-axis moving member 770 by the Y-axis motor device YM.

During the synchronous movement, of course, the driving of the wafer stage WST in the $\theta_Z$ direction by the X-axis restraint device, and the driving of the wafer stage WST in the Z-axis direction, the $\theta_X$ direction, and the $\theta_Y$ direction by the Z-tilt driving mechanism 776 are appropriately performed. Since the X-axis restraint device and the Z-tilt driving mechanism 776 have the structures described above, no significant variation occurs due to the driving.

When the above-described scan-exposure of the first shot area $SA_{1,1}$ is completed, the stage control system 719 controls the wafer driving unit 711 so that the wafer stage WST is moved in a stepping manner to place the wafer W into the scanning start position of the next shot area (herein, the second shot area $SA_{1,2}$). Such stepping movement of the wafer W is made so as to satisfy the initial conditions of the position and speed at the completion of scan-exposure of the first shot area $SA_{1,1}$ and the following two at-end conditions:

(1') At the scan-exposure starting position of the second shot area $SA_{1,2}$, the wafer W has a velocity component only in the +Y direction, and the velocity component is set at the predetermined value $V_W$.

(2') At the scan-exposure starting position of the second shot area $SA_{1,2}$, the X-axis stationary members 718A and 718B are placed into predetermined X-axis positions by the first and second X-axis position correction devices. The predetermined X-axis positions are set so as to ensure that there is sufficient room for the stroke of the X-axis stationary members 718A and 718B when they move in the +X-axis direction by reaction force produced when the wafer stage WST is moved in the −X-axis direction by a distance corresponding to one shot area of the wafer W (a distance $X_1$ shown in FIG. 28).

The Y-axis position of the Y-axis stationary member 722 is not corrected by the Y-axis position correction device.

Scan-exposure is effected on the second shot area $SA_{1,2}$ in a manner similar to that of the first shot area $SA_{1,1}$ except that the wafer W is moved in the +Y-direction.

Subsequent shot areas of the first row are sequentially scan-exposed while repeating the stepping operation and the scan-exposure operation described above.

When scan-exposure of the last shot area $SA_{1,7}$ of the first row is completed, the stage control system 719 controls the wafer driving unit 711, according to instructions from the main control system 721, so that the wafer stage WST is moved across the rows to move the wafer W to the scan-exposure starting position for the first shot area $SA_{2,9}$ of the second row. Such stepping movement across the rows is made so as to satisfy the initial conditions of the position and speed at the completion of scan-exposure of the shot area $SA_{1,7}$ and the following three at-end conditions:

(1″) At the scan-exposure starting position of the shot area $SA_{2,9}$, the wafer W has a velocity component only in the −Y direction, and the velocity component is set at the predetermined value $V_W$.

(2″) At the scan-exposure starting position of the shot area $SA_{2,9}$, the X-axis stationary members 718A and 718B are placed into predetermined X-axis positions by the first and second X-axis position correction devices. The predetermined X-axis positions are set so as to ensure that there is sufficient room for the stroke of the X-axis stationary members 718A and 718B when they are moved in the −X-axis direction by reaction force produced when the wafer stage WST is moved in the +X-axis direction by a distance corresponding to one shot area of the wafer W (distance $X_1$).

(3″) At the scan-exposure starting position for the shot area $SA_{2,9}$, the Y-axis stationary member 722 is placed into a predetermined Y-axis position by the Y-axis position correction device. The predetermined Y-axis position is set so as to ensure that there is sufficient room for the stroke of the Y-axis stationary member 722 when it is moved in the +Y-axis direction by reaction force produced by the movement of the wafer stage WST during scan-exposure of the shot area $SA_{2,9}$ and the stepping movement in the −Y-axis direction from the shot area $SA_{2,9}$ to the next shot area $SA_{2,8}$ and to ensure that there is sufficient room for the stroke of the Y-axis stationary member 722 when it is moved in the −Y-axis direction by reaction force produced by the stepping movement of the wafer stage WST in the +Y-axis direction from the shot area $SA_{2,8}$ to the next shot area $SA_{2,7}$.

Subsequent shot areas of the second row are subjected to scan-exposure in a manner similar to that of the first row, except that scan-exposure progresses in the −X-axis direction. After that, scan-exposure is effected on the shot areas of the remaining rows (3–7) in a manner similar to that of the first and second rows.

When all the shot areas on the wafer W have been scan-exposed, the wafer W is unloaded from the wafer stage WST by an unloader (not shown). When unloading the wafer W, the wafer stage WST is moved to an unloading position. The movement of the wafer stage WST is controlled in a manner similar to that of the above-described reticle alignment. The processes for the wafer W are thereby completed.

As described above, in the exposure apparatus of the present invention, while the illumination light is being applied to the reticle R, that is, during scan-exposure, when the wafer stage WST is moved along the wafer surface plate 714, the Y-axis stationary member 722 or the X-axis stationary members 718A and 718B serving as a counter stage (countermass) are moved in a direction opposite from the moving direction of the wafer stage WST. Since most of the reaction force due to the driving of the wafer stage WST is absorbed, vibration will not be caused and exact exposure is possible. That is, exposure accuracy is not affected by vibration resulting from reaction force produced due to the driving of the wafer stage WST.

While illumination light is not applied onto the reticle R, the Y-axis position correction device and/or the first and second X-axis position correction devices appropriately correct the positions of the Y-axis stationary member 722 or the X-axis stationary members 718A and 718B so as to ensure that there is sufficient room for the stroke of the Y-axis stationary member 722 or the X-axis stationary members 718A and 718B when they are moved in subsequent operations. This shortens the total space required for the stroke of the Y-axis stationary member 722 or the X-axis stationary members 718A and 718B, and thereby prevents the exposure apparatus 100 from being of increased size.

In this embodiment, since the X-axis stationary members and the Y-axis stationary member serve as counter stages (countermasses) for absorbing the reaction force of the wafer stage, it is possible to absorb vibration resulting from the reaction force produced due to the driving of the wafer stage, without providing another counter stage (countermass) separate from the wafer stage. This allows a smaller footprint of the entire exposure apparatus. Furthermore, since the X-axis stationary members and the Y-axis stationary member serve as counter stages (countermasses), they are automatically moved in a direction opposite from the moving direction of the wafer stage by reaction force produced when the wafer stage is moved. Consequently, another driving device for the counter stages is unnecessary, and the reaction force can be easily absorbed.

The positions of the center of gravity in the Y-axis direction and the Z-axis direction of the X-axis stationary member 718A and of the X-axis moving member 720A in the first X-axis motor device coincide with positions of the points of action of the forces in the X-axis direction acting on the X-axis stationary member 718A and moving member 720A. Furthermore, the positions of the center of gravity in the Y-axis direction and the Z-axis direction of the X-axis stationary member 718B and of the X-axis moving member 720B in the second X-axis motor device coincide with positions of the points of action of the forces in the X-axis direction acting on the X-axis stationary member 718B and moving member 720B. Furthermore, the positions of the center of gravity in the X-axis direction and the Z-axis direction of the Y-axis stationary member 722 and of the Y-axis moving member 770 in the Y-axis motor device coincide with positions of the points of action of the forces in the Y-axis direction acting on the Y-axis stationary member 722 and moving member 770.

Accordingly, since during scan-exposure the moving members and the stationary members are moved only in the X-axis direction or the Y-axis direction by a combination movement therebetween according to the law of conservation of momentum, the center of gravity of a dynamic system composed of the moving members (stages) and the stationary members in combination is not displaced. Therefore, unbalanced load is not produced and high-precision position control is possible.

The shot areas are arranged in a matrix on the wafer W, and the Y-axis position of the Y-axis stationary member 722 in the Y-axis motor device is corrected by the Y-axis position correction device between the completion of exposure of a predetermined row and the start of exposure of a row next to the predetermined row. Since the position of the Y-axis stationary member 722 in the Y-axis motor device is corrected during a linefeed operation in which exposure is suspended for a relatively long period, it is possible to prevent vibration and unbalanced load from being produced due to the driving of the wafer stage WST as would occur during scan-exposure. It is also possible to reduce driving force to be applied to the Y-axis stationary member 722 at the time of correction and to thereby decrease vibration due to the driving of the Y-axis stationary member 722 to be transmitted to other sections of the exposure apparatus.

While the exposure process of the second layer and subsequent layers of the wafer has been described in this embodiment, advantages similar to those of the above embodiment can also be obtained in exposure of the first layer of the wafer that is effected in a manner similar to that of the second layer and subsequent layers, except that wafer alignment (search alignment and fine alignment) is not performed.

While the stationary members of the motor devices for moving the wafer stage WST are used to absorb reaction force of the wafer stage WST in the above embodiment, another countermass mechanism may be added.

While absorption of reaction force produced due to the driving of the wafer stage WST has been described in the above embodiment, the present invention is also applicable to the driving of the reticle stage RST for holding the reticle R. That is, the position of a counter stage (countermass), which moves in a direction opposite from the driving direction of the reticle stage RST, may be corrected to a predetermined position when exposure light is not applied. Additionally, the reticle stage may hold a plurality of reticles.

Figure 29:
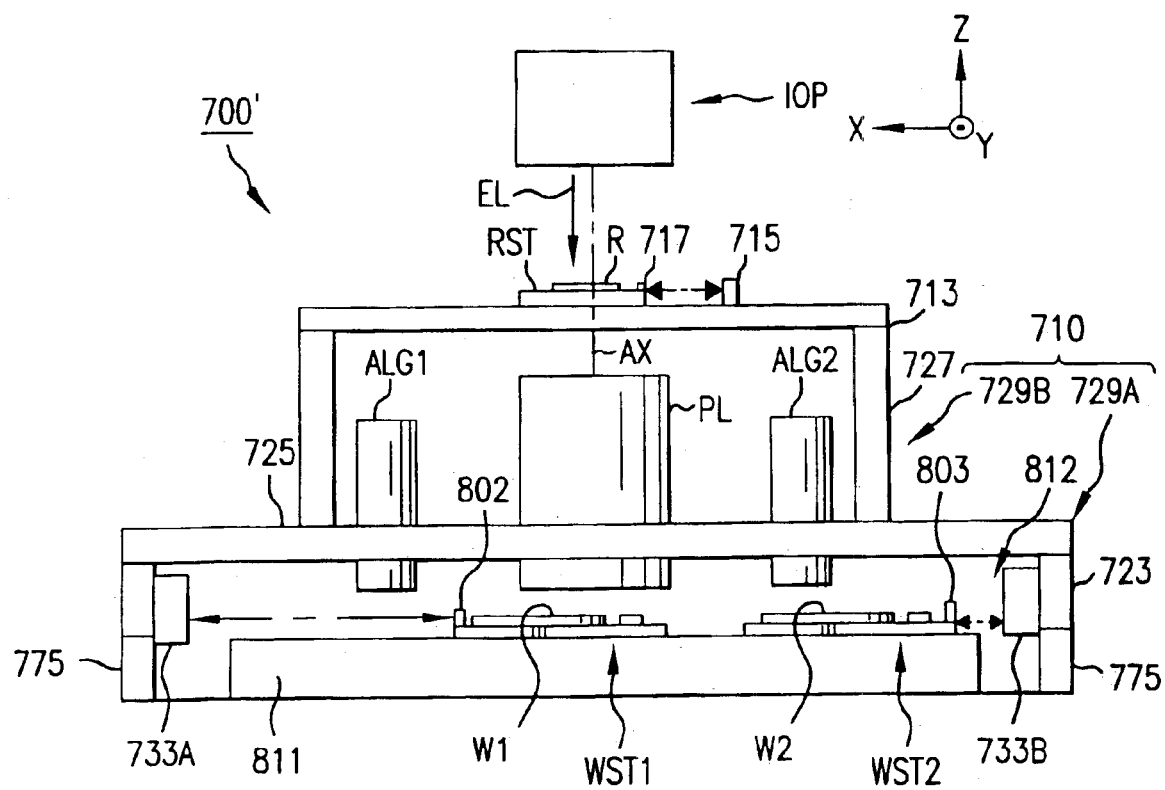
FIG. 29 is a schematic structural view of an exposure apparatus according to a modification of the first embodiment.

While the exposure apparatus 700 of the above embodiment has only one wafer stage WST, it may have two wafer stages. An exposure apparatus 700' according to a modification of the above embodiment has two wafer stages WST1 and WST2, which can independently move in two dimensions, as shown in FIG. 29. In the following description of the exposure apparatus 700', components identical or equivalent to the components of the exposure apparatus 700 are denoted by like numerals, and their repetitive explanations will also be omitted.

Referring to FIG. 29, the exposure apparatus 700' of this modification is different from the exposure apparatus 700 shown in FIG. 21 in that it includes: (a) alignment microscopes ALG1 and ALG2 placed at equal distances from a projection optical system PL, and (b) a wafer driving unit 811 for moving the wafer stages WST1 and WST2 two-dimensionally. The wafer stages WST1 and WST2 and the wafer driving unit 811 constitute a wafer stage assembly 812 of this modification.

Figure 30:
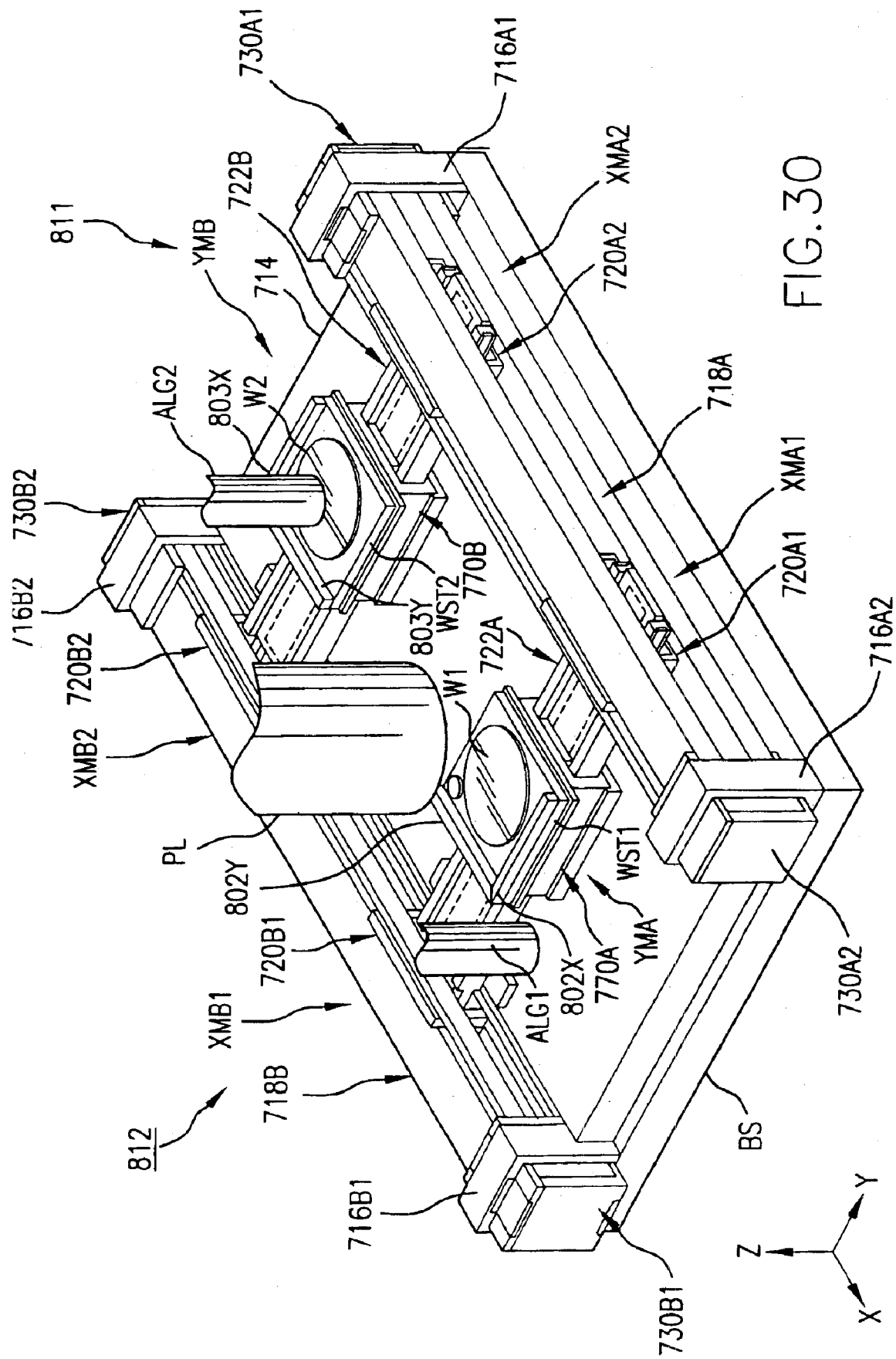
FIG. 30 is an explanatory view of a wafer stage assembly shown in FIG. 29.

In order to detect the XY positions and the rotations about the Z-axis of the wafer stages WST1 and WST2, the exposure apparatus 700' also includes: (c) X-axis interferometers 733A and 733B for applying an interferometric beam to X movable mirrors of the wafer stages WST1 and WST 2, and (d) three Y-axis interferometers (not shown) for applying interferometric beams, passing through the center of projection of a projection optical system PL and the centers of detection of the alignment microscopes ALG1 and ALG2, onto Y-axis movable mirrors of the wafer stages WST1 and WST2. As shown in FIG. 30, an X movable mirror 802X and a Y movable mirror 802Y are placed on the upper surface of the wafer stage WST1, and an X movable mirror 803X and a Y movable mirror 803Y are similarly placed on the upper surface of the wafer stage WST2. The movable mirrors are represented by a movable mirror 802 and a movable mirror 803 in FIG. 29.

Other sections are similar to those of the above-described exposure apparatus 700.

In the wafer driving unit 811, as shown in FIG. 30, X-axis moving members 720A1 and 720A2 similar to the above-described X-axis moving member 720A are provided for an X-axis stationary member 718A, and X-axis moving members 720B1 and 720B2 similar to the above-described X-axis moving member 720B are provided for an X-axis stationary member 718B. Furthermore, a Y-axis motor device YMA similar to the above-described Y-axis motor device YM extends between the X-axis moving members 720A1 and 720B1, and a Y-axis motor device YMB similar to the above-described Y-axis motor device YM extends between the X-axis moving members 720A2 and 720B2.

The wafer stage WST1 is placed on the upper surface of a moving member 770A of the Y-axis motor device YMA, and the wafer stage WST2 is placed on the upper surface of a moving member 770B of the Y-axis motor device YMB.

Accordingly, the wafer stage WST1 is moved in the X-axis direction by the X-axis motor device XMA1 composed of the X-axis stationary member 718A and the X-axis moving member 720A1 and the X-axis motor device XMB1 composed of the X-axis stationary member 718B and the X-axis moving member 720B1, and is moved in the Y-axis direction by the Y-axis motor device YMA composed of the Y-axis stationary member 722A and the Y-axis moving member 770A. In contrast, the wafer stage WST2 is moved in the X-axis direction by the X-axis motor device XMA2 composed of the X-axis stationary member 718A and the X-axis moving member 720A2 and the X-axis motor device XMB2 composed of the X-axis stationary member 718B and the X-axis moving member 720B2, and is moved in the Y-axis direction by the Y-axis motor device YMB composed of the Y-axis stationary member 722B and the Y-axis moving member 770B. That is, the wafer stages WST1 and WST2 are two-dimensionally moved in a manner similar to that of the above-described wafer stage WST.

In the exposure apparatus 700' of this modification, a concurrent operation is possible, that is, while shot areas on one of the wafers W1 and W2 placed on the wafer stages WST1 and WST2, which can independently move in two dimensions, as described above, are sequentially subjected to scan-exposure similar to that in the above embodiment, the other wafer is subjected to alignment similar to that in the above embodiment.

During such a concurrent operation, for example, in a case in which the wafer stage WST2 is moved in the X-axis direction by the X-axis motor devices XMA2 and XMB2 while the wafer W1 is scan-exposed by moving the wafer stage WST1 in the Y-axis direction by the Y-axis motor device YMA, the X-axis stationary members 718A and 718B receive a reaction force in a direction opposite from the driving direction of the wafer stage WST2. As a result, if the X-axis position correction device is not operated, the X-axis stationary members 718A and 718B will move in a direction opposite to the driving direction of the stage WST2, which will cause the wafer stage WST1 to move in the X-axis direction identical to the moving direction of the X-axis stationary members 718A and 718B. This would cause the exposure accuracy for the wafer W1 to significantly deteriorate. In contrast, if the X-axis stationary members 718A and 718B are prevented from moving by operating the X-axis position correction device, absorption of reaction force (caused by X-direction movement of the stage WST2) based on the law of conservation of momentum is impossible. This causes vibration that affects the wafer stage WST1, and also deteriorates exposure accuracy for the wafer W1.

Since the Y-axis motor devices YMA and YMB have the above-described structure (i.e., they are independent from each other), the Y-axis motor device for moving one of the wafers in the Y-axis direction does not have any adverse effect, such as vibration or undesired displacement, on the other wafer. In other words, when one wafer stage (WST1 or WST2) is driven in the Y-direction, its stationary member (722A or 722B) can be permitted to move in order to absorb reaction force, and such movement will not cause the Y-direction (or X-direction) position of the other stage (WST2 or WST1) to change.

Accordingly, in the exposure apparatus 700' of this modification, wafer movement control is executed so that one of the wafers is not moved in the X-axis direction while the other wafer is being scan-exposed. Therefore, when exposure light EL is applied to the wafer W1, vibration resulting from the driving of the motor for moving the other wafer is not transmitted to the wafer stage WST1. This allows high-precision exposure.

Since exposure and alignment are concurrently performed in the exposure apparatus 700' of this modification, as described above, throughput can be improved.

In this modification, movement control may be executed so that, when one of the wafers moves in the X-axis direction, the other wafer also moves in the same direction by nearly the same distance. This makes it possible to reduce the distance between the center of projection of the projection optical system PL and the center of detection of the alignment microscope ALG1 or the alignment microscope ALG2 (so as to be longer than the diameter of the wafer) and to thereby reduce the size of the exposure apparatus. Since the size of the stage surface plate 714 can also be reduced, production thereof is facilitated.

While the stage device according to the above embodiment of the invention is applied to the scanning stepper, the invention also is applicable to a stationary exposure apparatus, such as a stepper that effects exposure while a mask and a substrate are stationary. In such a case, since reaction force produced when a substrate stage for holding the substrate is driven can be absorbed, high-precision exposure is similarly possible without causing displacement of a transferred image.

The stage device of the invention is also applicable to a proximity exposure apparatus in which a pattern on a mask is transferred onto a substrate with the mask and the substrate placed in close proximity without using a projection optical system therebetween.

The invention is, of course, also applicable not only to an exposure apparatus for use in fabrication of semiconductor devices, but also to an exposure apparatus that transfers a device pattern onto a glass plate so as to produce displays, such as liquid crystal display and plasma displays, an exposure apparatus that transfers a device pattern onto a ceramic wafer so as to produce thin-film magnetic heads, and an exposure apparatus for use in producing image pickup devices, such as CCDs.

The invention is also applicable not only to microdevices such as semiconductor devices, but also to an exposure apparatus that transfers a circuit pattern onto a glass substrate, a silicon wafer, and the like in order to manufacture a reticle or a mask for use in an optical exposure apparatus, an EUV (Extreme Ultraviolet) exposure apparatus, an X-ray exposure apparatus, an electron beam exposure apparatus, and the like. In an exposure apparatus using DUV (Deep Ultraviolet) light, VUV (Vacuum Ultraviolet) light, and the like, a transmissive reticle is generally used, and a reticle substrate is made of quartz glass, quartz glass doped with fluorine, fluorite, magnesium fluoride, or quartz crystal. In the proximity exposure apparatus or the electron beam exposure apparatus, a transmissive mask (a stencil mask or a membrane mask) is used. In the EUV exposure apparatus, a reflective mask is used, and a silicon wafer or the like is used as a mask substrate.

The stage device used in the exposure apparatus of the invention is also widely applicable to other substrate processing apparatus (for example, a laser apparatus or a substrate inspection apparatus), a sample positioning device in other precision machines, and a wire bonding device.

The exposure apparatus of the invention may employ not only the projection optical system, but also a charged particle beam optical system, such as an X-ray optical system or an electron optical system. For example, the electron optical system includes an electron lens and a polarizer, and thermoelectron-emitting lanthanum hexaborite ($LaB_6$) or tantalum (Ta) is used as an electron gun. Of course, the optical path through which an electron beam passes is placed in a vacuum. The exposure apparatus of the invention may use, as exposure light, not only the above-described far ultraviolet light or vacuum ultraviolet light, but also soft X-ray EUV light with a wavelength of 5 nm to 30 nm.

For example, the vacuum ultraviolet light includes ArF excimer laser light and $F_2$ laser light. Alternatively, a harmonic wave may be used which is obtained by amplifying single-waveform laser light in an infrared region or a visible region emitted from a DFB semiconductor laser or a fiber laser by, for example, a fiber amplifier doped with erbium (or both erbium and ytterbium) and wavelength-converting the laser light into ultraviolet light by using nonlinear optical crystal.

While the projection optical system is of a reduction type in the above embodiments, it may be of a 1× (unity) magnification type or of a magnification type.

An illumination unit, a projection optical system, and the like composed of a plurality of lenses is incorporated in the main body of the exposure apparatus so as to provide for optical adjustment. Various components, such as the X-axis stationary member, the X-axis moving member, the Y-axis stationary member, the wafer stage, and the reticle stage described above, and other components, are mechanically and electrically combined and adjusted, and are subjected to total adjustment (e.g., electric adjustment and operation check), thereby producing an exposure apparatus of the invention such as the exposure apparatus 100 in the above embodiment. Preferably, the exposure apparatus is produced in a clean room in which the temperature, the level of air cleanliness, and the like are controlled.

While the invention has been described with reference to preferred embodiments thereof, it is to be understood that the invention is not limited to the preferred embodiments or constructions. To the contrary, the invention is intended to cover various modifications and equivalent arrangements. In addition, while the various elements of the preferred embodiments are shown in various combinations and configurations, which are exemplary, other combinations and configurations, including more, less or only a single element, are also within the spirit and scope of the invention.

What is claimed is:

1. An exposure apparatus comprising:
   an illumination source that has an on position and an off position; and
   a stage assembly that moves a device relative to a stage base so that the device is properly positioned for one or more operations performed by the exposure apparatus, the stage assembly comprising:
   a stage that retains the device;
   a stage mover assembly connected to the stage, the stage mover assembly generating reaction forces;
   a reaction mass assembly coupled to the stage mover assembly, the reaction mass assembly reducing the reaction forces that are transferred to the stage base;
   a reaction mover assembly connected to the reaction mass assembly, the reaction mover assembly moving the reaction mass assembly relative to the stage base; and
   a control system connected to the reaction mover assembly, the control system controlling excitation of the reaction mover assembly during the one or more operations for an individual device based upon the on position and the off position of the illumination source; wherein
   in the on position, the illumination source directs a beam of light energy towards the stage assembly, and in the off position, the illumination source does not direct a beam of light energy towards the stage assembly.

2. The exposure apparatus of claim 1 wherein the control system controls current to the reaction mover assembly based upon the position of the illumination source.

3. The exposure apparatus of claim 1 wherein the control system does not direct current to the reaction mover assembly when the illumination source is in the on position.

4. The exposure apparatus of claim 3 wherein the control system directs current to the reaction mover assembly when the illumination source is in the off position.

5. The exposure apparatus of claim 1 wherein the control system directs more current to the reaction mover assembly when the illumination source is in the off position than when the illumination source is in the on position.

6. A device manufactured by the exposure apparatus of claim 1.

7. A wafer on which an image has been formed by the exposure apparatus of claim 1.

8. An exposure apparatus that forms images on a device, the exposure apparatus comprising:
   a stage assembly that moves a device relative to a stage base so that the device is properly positioned for one or more operations performed by the exposure apparatus, the stage assembly comprising:
   a stage that retains the device;
   a stage mover assembly connected to the stage, the stage mover assembly generating reaction forces;
   a reaction mass assembly coupled to the stage mover assembly, the reaction mass assembly reducing the reaction forces that are transferred to the stage base;
   a reaction mover assembly connected to the reaction mass assembly, the reaction mover assembly moving the reaction mass assembly relative to the stage base; and
   a control system connected to the reaction mover assembly, the control system controlling excitation of the reaction mover assembly during the one or more operations for an individual device based upon a status of the operation for forming images on the individual device.

9. The exposure apparatus of claim 8 wherein the stage mover assembly moves the stage with two degrees of freedom and the reaction mass assembly is adapted to reduce the reaction forces in the two degrees of freedom that are transferred to the stage base.

10. The exposure apparatus of claim 8 wherein the stage mover assembly moves the stage with three degrees of freedom and the reaction mass assembly is adapted to reduce the reaction forces in the three degrees of freedom that are transferred to the stage base.

11. The exposure apparatus of claim 8 wherein the reaction mover assembly adjusts the position of the reaction mass assembly relative to the stage base with one degree of freedom.

12. The exposure apparatus of claim 8 wherein the reaction mover assembly adjusts the position of the reaction mass assembly relative to the stage base with two degrees of freedom.

13. The exposure apparatus of claim 8 wherein the reaction mover assembly adjusts the position of the reaction mass assembly relative to the stage base with three degrees of freedom.

14. The exposure apparatus of claim 8 wherein the reaction mass assembly includes an X reaction component and a Y reaction component that are coupled to the stage mover assembly, the X reaction component moves relative to the Y reaction component along an X axis and the X reaction component and the Y reaction component move concurrently along a Y axis relative to the stage base.

15. The exposure apparatus of claim 14 wherein the reaction mover assembly adjusts the position of the X reaction component relative to the Y reaction component along the X axis.

16. The exposure apparatus of claim 15 wherein the reaction mover assembly adjusts the position of the Y reaction component and the X reaction component relative to the stage base along the Y axis.

17. The exposure apparatus of claim 16 wherein the reaction mover assembly adjusts the position of the Y reaction component and the X reaction component relative to the stage base about a Z axis.

18. The exposure apparatus of claim 14 wherein the X reaction component includes a first X reaction mass and a second X reaction mass that move independently along the X axis relative to the Y reaction component and the reaction mover assembly adjusts the position of the X reaction masses relative to the Y reaction component.

19. The exposure apparatus of claim 8 wherein the control system directs current to the reaction mover assembly between the forming of each image on the device and does not direct current to the reaction mover assembly during the forming of each image on the device.

20. The exposure apparatus of claim 8 wherein the control system directs current to the reaction mover assembly between the forming of each row of images on the device and does not direct current to the reaction mover assembly during the forming of each row of images on the device.

21. The exposure apparatus of claim 8 wherein the control system directs current to the reaction mover assembly between each scan of the device and does not direct current to the reaction mover assembly during each scan of the device.

22. The exposure apparatus of claim 8 wherein the control system directs current to the reaction mover assembly between each device manufactured by the exposure apparatus and does not direct current to the reaction mover assembly during the manufacture of each device.

23. The exposure apparatus of claim 8 wherein the control system directs more current to the reaction mover assembly between the forming of each image on the device than during the forming of each image on the device.

24. The exposure apparatus of claim 8 wherein the control system directs more current to the reaction mover assembly between the transfer of each row of images onto the device than during the transfer of each row of images to the device.

25. The exposure apparatus of claim 8 wherein the control system directs more current to the reaction mover assembly between each scan of the device than during each scan of the device.

26. The exposure apparatus of claim 8 wherein the control system directs more current to the reaction mover assembly between each device manufactured by the exposure apparatus than during the manufacture of each device.

27. An exposure apparatus for forming images on a device, the exposure apparatus comprising:
an illumination source having an on position and an off position, in the on position, the illumination source directs a beam of light energy, in the off position, the illumination source does not direct a beam of light energy;
a stage base;
a stage assembly that moves the device relative to the stage base, the stage assembly including (i) a stage that retains the device, (ii) a stage mover assembly that moves the stage relative to the stage base, the stage mover assembly generating reaction forces, (iii) a reaction mass assembly coupled to the stage mover assembly, the reaction mass assembly reducing the reaction forces that are transferred to the stage base, (iv) a reaction mover assembly that moves the reaction mass assembly relative to the stage base, and (v) a control system connected to the reaction mover assembly, the control system controlling excitation of the reaction mover assembly based upon the position of the illumination source.

28. The exposure apparatus of claim 27 wherein the control system does not direct current to the reaction mover assembly when the illumination source is in the on position.

29. The exposure apparatus of claim 28 wherein the control system directs current to the reaction mover assembly when the illumination source is in the off position.

30. The exposure apparatus of claim 27 wherein the control system directs more current to the reaction mover assembly when the illumination source is in the off position than when the illumination source is in the on position.

31. The exposure apparatus of claim 27 wherein the control system directs current to the reaction mover assembly between the forming of each image on the device and does not direct current to the reaction mover assembly during the forming of each image on the device.

32. The exposure apparatus of claim 27 wherein the control system directs current to the reaction mover assembly between the forming of each row of images on the device and does not direct current to the reaction mover assembly during the forming of each row of images on the device.

33. The exposure apparatus of claim 27 wherein the control system directs current to the reaction mover assembly between each scan of the device and does not direct current to the reaction mover assembly during each scan of the device.

34. The exposure apparatus of claim 27 wherein the control system directs current to the reaction mover assembly between each device manufactured by the exposure apparatus and does not direct current to the reaction mover assembly during the manufacture of each device.

35. The exposure apparatus of claim 27 wherein the control system directs more current to the reaction mover assembly between the forming of each image on the device than during the forming of each image on the device.

36. The exposure apparatus of claim 27 wherein the control system directs more current to the reaction mover assembly between the forming of each row of images on the device than during the forming of each row of images on the device.

37. The exposure apparatus of claim 27 wherein the control system directs more current to the reaction mover assembly between each scan of the device than during each scan of the device.

38. The exposure apparatus of claim 27 wherein the control system directs more current to the reaction mover assembly between each device manufactured by the exposure apparatus than during the manufacture of each device.

39. The exposure apparatus of claim 27 wherein the reaction mover assembly adjusts the position of the reaction mass assembly relative to the stage base with at least one degree of freedom.

40. The exposure apparatus of claim 27 wherein the reaction mover assembly adjusts the position of the reaction mass assembly relative to the stage base with two degrees of freedom.

41. The exposure apparatus of claim 27 wherein the reaction mover assembly adjusts the position of the reaction mass assembly relative to the stage base with three degrees of freedom.

42. A device manufactured by the exposure apparatus of claim 27.

43. A wafer on which an image has been formed by the exposure apparatus of claim 27.

44. A method for manufacturing an exposure apparatus that forms images on a device, the exposure apparatus comprising an illumination source that has an on position and an off position, and a stage assembly that moves the device relative to a stage base so that the device is properly positioned for one or more operations performed by the exposure apparatus, the method comprising the steps of:

provide an illumination source; and providing a stage assembly, the step of providing the stage assembly comprising the steps of:
  providing a stage that retains the device;
  connecting a stage mover assembly to the stage that moves the stage relative to the stage base, the stage mover assembly generating reaction forces;
  coupling a reaction mass assembly to the stage mover assembly, the reaction mass assembly reducing the reaction forces that are transferred to the stage base;
  connecting a reaction mover assembly to the reaction mass assembly, the reaction mover assembly moving the reaction mass assembly relative to the stage base; and
  providing a control system that is connected to the reaction mover assembly and controls excitation of the reaction mover assembly during the one or more operations for an individual device based upon the on position and the off position of the illumination source; wherein
  in the on position, the illumination source directs a beam of light energy towards the stage assembly, and in the off position, the illumination source does not direct a beam of light energy towards the stage assembly.

45. The method of claim 44 wherein the step of providing a control system includes the step of providing a control system that controls current to the reaction mover assembly based upon the position of the illumination source.

46. The method of claim 44 wherein the step of providing a control system includes the step of providing a control system that does not direct current to the reaction mover assembly when the illumination source is in the on position.

47. The method of claim 46 wherein the step of providing a control system includes the step of providing a control system that directs current to the reaction mover assembly when the illumination source is in the off position.

48. The method of claim 44 wherein the step of providing a control system includes the step of providing a control system that directs more current to the reaction mover assembly when the illumination source is in the off position than when the illumination source is in the on position.

49. The method of claim 44 wherein the step of providing a control system includes the step of providing a control system that directs current to the reaction mover assembly between the forming of each image on the device and does not direct current to the reaction mover assembly during the forming of each image on the device.

50. The method of claim 44 wherein the step of providing a control system includes the step of providing a control system that directs current to the reaction mover assembly between the forming of each row of images on the device and does not direct current to the reaction mover assembly during the forming of each row of images on the device.

51. The method of claim 44 wherein the step of providing a control system includes the step of providing a control system that directs current to the reaction mover assembly between each scan of the device and does not direct current to the reaction mover assembly during each scan of the device.

52. The method of claim 44 wherein the step of providing a control system includes the step of providing a control system that directs current to the reaction mover assembly between each device manufactured by the exposure apparatus and does not direct current to the reaction mover assembly during the manufacture of each device.

53. The method of claim 44 wherein the step of providing a control system includes the step of providing a control system that directs more current to the reaction mover assembly between the forming of each image on the device than during the forming of each image on the device.

54. The method of claim 44 wherein the step of providing a control system includes the step of providing a control system that directs more current to the reaction mover assembly between the transfer of each row of images onto the device than during the transfer of each row of images to the device.

55. The method of claim 44 wherein the step of providing a control system includes the step of providing a control system that directs more current to the reaction mover assembly between each scan of the device than during each scan of the device.

56. The method of claim 44 wherein the step of providing a control system includes the step of providing a control system that directs more current to the reaction mover assembly between each device manufactured by the exposure apparatus than during the manufacture of each device.

57. A method of making a wafer utilizing the exposure apparatus made by the method of claim 44.

58. A method of making a device utilizing the exposure apparatus made by the method of claim 44.

* * * * *